US010230006B2

(12) United States Patent
Vig et al.

(10) Patent No.: US 10,230,006 B2
(45) Date of Patent: Mar. 12, 2019

(54) MAGNETIC FIELD SENSOR INTEGRATED CIRCUIT WITH AN ELECTROMAGNETIC SUPPRESSOR

(71) Applicant: Allegro MicroSystems, LLC, Manchester, NH (US)

(72) Inventors: Ravi Vig, Bedford, NH (US); William P. Taylor, Amherst, NH (US); Paul A. David, Bow, NH (US); P. Karl Scheller, Manchester, NH (US); Andreas P. Friedrich, Metz-Tessy (FR)

(73) Assignee: Allegro MicroSystems, LLC, Manchester, MA (US)

( * ) Notice: Subject to any disclaimer, the term of this patent is extended or adjusted under 35 U.S.C. 154(b) by 0 days.

(21) Appl. No.: 15/618,251

(22) Filed: Jun. 9, 2017

(65) Prior Publication Data
US 2017/0278981 A1    Sep. 28, 2017

Related U.S. Application Data

(60) Division of application No. 13/748,999, filed on Jan. 24, 2013, now Pat. No. 9,812,588, which is a (Continued)

(51) Int. Cl.
*G01R 33/06* (2006.01)
*H01L 29/82* (2006.01)
(Continued)

(52) U.S. Cl.
CPC ............. *H01L 29/82* (2013.01); *G01D 5/147* (2013.01); *G01R 33/0047* (2013.01);
(Continued)

(58) Field of Classification Search
CPC combination set(s) only.
See application file for complete search history.

(56) References Cited

U.S. PATENT DOCUMENTS 3,195,043 A    7/1965   Burig et al.
3,281,628 A    10/1966  Bauer et al.
(Continued)

FOREIGN PATENT DOCUMENTS

CH    683 469 A5    3/1994
DE    3243039       5/1984
(Continued)

OTHER PUBLICATIONS

Final Office Action dated Oct. 20, 2017 for U.S. Appl. No. 13/838,131; 17 pages.
(Continued)

*Primary Examiner* — Jay Patidar
(74) *Attorney, Agent, or Firm* — Daly, Crowley, Mofford & Durkee, LLP

(57) ABSTRACT

A magnetic field sensor includes a lead frame, a semiconductor die having a first surface in which a magnetic field sensing element is disposed and a second surface attached to the lead frame, and a non-conductive mold material enclosing the die and at least a portion of the lead frame. The sensor may include a ferromagnetic mold material secured to a portion of the non-conductive mold material. An electromagnetic suppressor comprising a ferromagnetic material encloses a passive device spaced from the non-conductive mold material and coupled to a plurality of leads.

25 Claims, 27 Drawing Sheets

Related U.S. Application Data continuation-in-part of application No. 13/424,618, filed on Mar. 20, 2012.

(51) Int. Cl.
   *G01R 33/00* (2006.01)
   *G01D 5/14* (2006.01)

(52) U.S. Cl.
   CPC ......... *G01R 33/0052* (2013.01); *G01R 33/06* (2013.01); *H01L 2224/45147* (2013.01); *H01L 2224/48247* (2013.01); *H01L 2924/00011* (2013.01)

(56) References Cited

U.S. PATENT DOCUMENTS

| | | |
|---|---|---|
| 3,607,528 A | 9/1971 | Gessaway |
| 3,627,901 A | 12/1971 | Happ |
| 3,661,061 A | 5/1972 | Tokarz |
| 3,728,786 A | 4/1973 | Lucas et al. |
| 4,048,670 A | 9/1977 | Eysermans |
| 4,188,605 A | 2/1980 | Stout |
| 4,204,317 A | 5/1980 | Winn |
| 4,210,926 A | 7/1980 | Hacke |
| 4,262,275 A | 4/1981 | DeMarco et al. |
| 4,283,643 A | 8/1981 | Levin |
| 4,315,523 A | 2/1982 | Mahawili et al. |
| 4,409,608 A | 10/1983 | Yoder |
| 4,425,596 A | 1/1984 | Satou |
| 4,542,259 A | 9/1985 | Butt |
| 4,573,258 A | 3/1986 | Io et al. |
| 4,614,111 A | 9/1986 | Wolff |
| 4,642,716 A | 2/1987 | Wakabayashi et al. |
| 4,670,715 A | 6/1987 | Fuzzell |
| 4,719,419 A | 1/1988 | Dawley |
| 4,733,455 A | 3/1988 | Nakamura et al. |
| 4,745,363 A | 5/1988 | Carr et al. |
| 4,746,859 A | 5/1988 | Malik |
| 4,769,344 A | 9/1988 | Sakai et al. |
| 4,772,929 A | 9/1988 | Manchester |
| 4,789,826 A | 12/1988 | Willett |
| 4,796,354 A | 1/1989 | Yokoyama et al. |
| 4,893,073 A | 1/1990 | McDonald et al. |
| 4,905,318 A | 2/1990 | Fukuda et al. |
| 4,908,685 A | 3/1990 | Shibasaki et al. |
| 4,910,861 A | 3/1990 | Dohogne |
| 4,935,698 A | 6/1990 | Kawaji et al. |
| 4,983,916 A | 1/1991 | Iijima et al. |
| 4,994,731 A | 2/1991 | Sanner |
| 5,010,263 A | 4/1991 | Murata |
| 5,012,322 A | 4/1991 | Guillotte |
| 5,021,493 A | 6/1991 | Sandstrom |
| 5,028,868 A | 7/1991 | Murata et al. |
| 5,041,780 A | 8/1991 | Rippel |
| 5,045,920 A | 9/1991 | Vig et al. |
| 5,068,712 A | 11/1991 | Murakami et al. |
| 5,077,633 A | 12/1991 | Freyman |
| 5,078,944 A | 1/1992 | Yoshino |
| 5,084,289 A | 1/1992 | Shin et al. |
| 5,121,289 A | 6/1992 | Gagliardi |
| 5,124,642 A | 6/1992 | Marx |
| 5,137,677 A | 8/1992 | Murata |
| 5,139,973 A | 8/1992 | Nagy et al. |
| 5,167,896 A | 12/1992 | Hirota et al. |
| 5,180,903 A | 1/1993 | Shigeno et al. |
| 5,185,919 A | 2/1993 | Hickey |
| 5,196,794 A | 3/1993 | Murata |
| 5,196,821 A | 3/1993 | Partin et al. |
| 5,210,493 A | 5/1993 | Schroeder et al. |
| 5,216,405 A | 6/1993 | Schroeder et al. |
| 5,244,834 A | 9/1993 | Suzuki et al. |
| 5,247,202 A | 9/1993 | Popovic et al. |
| 5,250,925 A | 10/1993 | Shinkle |
| 5,286,426 A | 2/1994 | Rano, Jr. et al. |
| 5,289,344 A | 2/1994 | Gagnon et al. |
| 5,315,245 A | 5/1994 | Schroeder et al. |
| 5,332,965 A | 7/1994 | Wolf et al. |
| 5,363,279 A | 11/1994 | Cha |
| 5,399,905 A | 3/1995 | Honda et al. |
| 5,414,355 A | 5/1995 | Davidson et al. |
| 5,434,105 A | 7/1995 | Liou |
| 5,442,228 A | 8/1995 | Pham et al. |
| 5,453,727 A | 9/1995 | Shibasaki et al. |
| 5,479,695 A | 1/1996 | Grader et al. |
| 5,488,294 A | 1/1996 | Liddell et al. |
| 5,491,633 A | 2/1996 | Henry et al. |
| 5,497,081 A | 3/1996 | Wolf et al. |
| 5,500,589 A | 3/1996 | Sumcad |
| 5,500,994 A | 3/1996 | Itaya |
| 5,508,611 A | 4/1996 | Schroeder et al. |
| 5,539,241 A | 7/1996 | Abidi et al. |
| 5,551,146 A | 9/1996 | Kawabata et al. |
| 5,561,366 A | 10/1996 | Takahashi et al. |
| 5,563,199 A | 10/1996 | Harada et al. |
| 5,579,194 A | 11/1996 | Mackenzie et al. |
| 5,581,170 A | 12/1996 | Mammano et al. |
| 5,581,179 A | 12/1996 | Engel et al. |
| 5,612,259 A | 3/1997 | Okutomo et al. |
| 5,614,754 A | 3/1997 | Inoue |
| 5,615,075 A | 3/1997 | Kim |
| 5,627,315 A | 5/1997 | Figi et al. |
| 5,631,557 A | 5/1997 | Davidson |
| 5,648,682 A | 7/1997 | Nakazawa et al. |
| 5,666,004 A | 9/1997 | Bhattacharyya et al. |
| 5,691,637 A | 11/1997 | Oswald et al. |
| 5,691,869 A | 11/1997 | Engel et al. |
| 5,712,562 A | 1/1998 | Berg |
| 5,714,102 A | 2/1998 | Highum et al. |
| 5,714,405 A | 2/1998 | Tsubosaki et al. |
| 5,719,496 A | 2/1998 | Wolf |
| 5,726,577 A | 3/1998 | Engel et al. |
| 5,729,128 A | 3/1998 | Bunyer et al. |
| 5,729,130 A | 3/1998 | Moody et al. |
| 5,757,181 A | 5/1998 | Wolf et al. |
| 5,781,005 A | 7/1998 | Vig et al. |
| 5,789,658 A | 8/1998 | Henn et al. |
| 5,789,915 A | 8/1998 | Ingraham |
| 5,804,880 A | 9/1998 | Mathew |
| 5,817,540 A | 10/1998 | Wark |
| 5,818,222 A | 10/1998 | Ramsden |
| 5,818,223 A | 10/1998 | Wolf |
| 5,822,849 A | 10/1998 | Casali et al. |
| 5,834,832 A | 11/1998 | Kweon et al. |
| 5,839,185 A | 11/1998 | Smith et al. |
| 5,841,276 A | 11/1998 | Makino et al. |
| 5,859,387 A | 1/1999 | Gagnon |
| 5,883,567 A | 3/1999 | Mullins, Jr. |
| 5,886,070 A | 3/1999 | Honkura et al. |
| 5,891,377 A | 4/1999 | Libres et al. |
| 5,912,556 A | 6/1999 | Frazee et al. |
| 5,940,256 A | 8/1999 | MacKenzie et al. |
| 5,943,557 A | 8/1999 | Moden |
| 5,963,028 A | 10/1999 | Engel et al. |
| 5,973,388 A | 10/1999 | Chew et al. |
| 5,990,756 A * | 11/1999 | France, Jr. ............ H01F 17/06 174/121 A |
| 6,005,383 A | 12/1999 | Savary et al. |
| 6,016,055 A | 1/2000 | Jager et al. |
| 6,043,646 A | 3/2000 | Jansseune |
| 6,057,997 A | 5/2000 | MacKenzie et al. |
| 6,066,890 A | 5/2000 | Tsui et al. |
| 6,097,109 A | 8/2000 | Fendt et al. |
| 6,107,793 A | 8/2000 | Yokotani et al. |
| 6,136,250 A | 10/2000 | Brown |
| 6,150,714 A | 11/2000 | Andreycak et al. |
| 6,175,233 B1 | 1/2001 | McCurley et al. |
| 6,178,514 B1 | 1/2001 | Wood |
| 6,180,041 B1 | 1/2001 | Takizawa |
| 6,184,679 B1 | 2/2001 | Popovic et al. |
| 6,198,373 B1 | 3/2001 | Ogawa et al. |
| 6,225,701 B1 | 5/2001 | Hori et al. |
| 6,252,389 B1 | 6/2001 | Baba et al. |
| 6,265,865 B1 | 7/2001 | Engel et al. |
| 6,278,269 B1 | 8/2001 | Vig et al. |

(56) References Cited

U.S. PATENT DOCUMENTS

| | | |
|---|---|---|
| 6,294,824 B1 | 9/2001 | Brooks et al. |
| 6,316,736 B1 | 11/2001 | Jairazbhoy et al. |
| 6,316,931 B1 | 11/2001 | Nakagawa et al. |
| 6,323,634 B1 | 11/2001 | Nakagawa et al. |
| 6,331,451 B1 | 12/2001 | Fusaro et al. |
| 6,356,068 B1 | 3/2002 | Sterner et al. |
| 6,359,331 B1 | 3/2002 | Rinehart et al. |
| 6,365,948 B1 | 4/2002 | Kumagai et al. |
| 6,377,464 B1 | 4/2002 | Hashemi et al. |
| 6,388,336 B1 | 5/2002 | Venkateshwaran et al. |
| 6,396,712 B1 | 5/2002 | Kuijk |
| 6,411,078 B1 | 6/2002 | Nakagawa et al. |
| 6,420,779 B1 | 7/2002 | Sharma et al. |
| 6,424,018 B1 | 7/2002 | Ohtsuka |
| 6,429,652 B1 | 8/2002 | Allen et al. |
| 6,445,171 B2 | 9/2002 | Sandquist et al. |
| 6,452,381 B1 | 9/2002 | Nakatani et al. |
| 6,462,531 B1 | 10/2002 | Ohtsuka |
| 6,480,699 B1 | 11/2002 | Lovoi |
| 6,482,680 B1 | 11/2002 | Knor et al. |
| 6,486,535 B2 | 11/2002 | Liu |
| 6,501,268 B1 | 12/2002 | Edelstein et al. |
| 6,501,270 B1 | 12/2002 | Opie |
| 6,504,366 B2 | 1/2003 | Bodin et al. |
| 6,545,332 B2 | 4/2003 | Huang |
| 6,545,456 B1 | 4/2003 | Radosevich et al. |
| 6,545,457 B2 | 4/2003 | Goto et al. |
| 6,545,462 B2 | 4/2003 | Schott et al. |
| 6,553,199 B2 | 5/2003 | Yasunaga et al. |
| 6,566,856 B2 | 5/2003 | Sandquist et al. |
| 6,580,159 B1 | 6/2003 | Fusaro et al. |
| 6,583,572 B2 | 6/2003 | Veltrop et al. |
| 6,593,545 B1 | 7/2003 | Greenwood et al. |
| 6,605,491 B1 | 8/2003 | Hsieh et al. |
| 6,608,375 B2 | 8/2003 | Terui et al. |
| 6,610,923 B1 | 8/2003 | Nagashima et al. |
| 6,617,846 B2 | 9/2003 | Hayat-dawoodi et al. |
| 6,642,609 B1 | 11/2003 | Minamio et al. |
| 6,642,705 B2 | 11/2003 | Kawase |
| 6,661,087 B2 | 12/2003 | Wu |
| 6,667,682 B2 | 12/2003 | Wan et al. |
| 6,683,448 B1 | 1/2004 | Ohtsuka |
| 6,683,452 B2 | 1/2004 | Lee et al. |
| 6,692,676 B1 | 2/2004 | Vig et al. |
| 6,696,952 B2 | 2/2004 | Zirbes |
| 6,713,836 B2 | 3/2004 | Liu et al. |
| 6,714,003 B2 | 3/2004 | Babin |
| 6,727,683 B2 | 4/2004 | Goto et al. |
| 6,737,298 B2 | 5/2004 | Shim et al. |
| 6,747,300 B2 | 6/2004 | Nadd et al. |
| 6,759,841 B2 | 7/2004 | Goto et al. |
| 6,770,163 B1 | 8/2004 | Kuah et al. |
| 6,775,140 B2 | 8/2004 | Shim et al. |
| 6,781,233 B2 | 8/2004 | Zverev et al. |
| 6,781,359 B2 | 8/2004 | Stauth et al. |
| 6,791,313 B2 | 9/2004 | Ohtsuka |
| 6,796,465 B1 | 9/2004 | Seidler |
| 6,798,044 B2 | 9/2004 | Joshi |
| 6,798,057 B2 | 9/2004 | Boikin et al. |
| 6,798,193 B2 | 9/2004 | Zimmerman et al. |
| 6,809,416 B1 | 10/2004 | Sharma |
| 6,812,687 B1 | 11/2004 | Ohtsuka |
| 6,825,067 B2 | 11/2004 | Ararao et al. |
| 6,828,220 B2 | 12/2004 | Pendse et al. |
| 6,832,420 B2 | 12/2004 | Liu |
| 6,841,989 B2 | 1/2005 | Goto et al. |
| 6,853,178 B2 | 2/2005 | Hayat-Dawoodi |
| 6,861,283 B2 | 3/2005 | Sharma |
| 6,867,573 B1 | 3/2005 | Carper |
| 6,875,634 B2 | 4/2005 | Shim et al. |
| 6,902,951 B2 | 6/2005 | Goller et al. |
| 6,921,955 B2 | 7/2005 | Goto et al. |
| 6,943,061 B1 | 9/2005 | Sirinorakul et al. |
| 6,956,282 B1 | 10/2005 | Alvarez et al. |
| 6,960,493 B2 | 11/2005 | Ararao et al. |
| 6,974,909 B2 | 12/2005 | Tanaka et al. |
| 6,989,665 B2 | 1/2006 | Goto |
| 6,995,315 B2 | 2/2006 | Sharma et al. |
| 7,005,325 B2 | 2/2006 | Chow et al. |
| 7,006,749 B2 | 2/2006 | Illich et al. |
| 7,026,808 B2 | 4/2006 | Vig et al. |
| 7,031,170 B2 | 4/2006 | Daeche et al. |
| 7,046,002 B1 | 5/2006 | Edelstein |
| 7,075,287 B1 | 7/2006 | Mangtani et al. |
| 7,105,929 B2 | 9/2006 | Shishido et al. |
| 7,112,955 B2 | 9/2006 | Buchhold |
| 7,112,957 B2 | 9/2006 | Bicking |
| 7,129,569 B2 | 10/2006 | Punzalan et al. |
| 7,129,691 B2 | 10/2006 | Shibahara et al. |
| 7,148,086 B2 | 12/2006 | Shim et al. |
| 7,166,807 B2 | 1/2007 | Gagnon et al. |
| 7,193,412 B2 | 3/2007 | Freeman |
| 7,221,045 B2 | 5/2007 | Park et al. |
| 7,242,076 B2 | 7/2007 | Dolan |
| 7,248,045 B2 | 7/2007 | Shoji |
| 7,250,760 B2 | 7/2007 | Ao |
| 7,259,545 B2 | 8/2007 | Stauth et al. |
| 7,259,624 B2 | 8/2007 | Barnett |
| 7,265,531 B2 | 9/2007 | Stauth et al. |
| 7,269,992 B2 | 9/2007 | Lamb et al. |
| 7,279,424 B2 | 10/2007 | Guthrie et al. |
| 7,279,784 B2 | 10/2007 | Liu |
| 7,285,952 B1 | 10/2007 | Hatanaka et al. |
| 7,304,370 B2 | 12/2007 | Imaizumi et al. |
| 7,323,780 B2 | 1/2008 | Daubenspeck et al. |
| 7,323,870 B2 | 1/2008 | Tatschl et al. |
| 7,355,388 B2 | 4/2008 | Ishio |
| 7,358,724 B2 | 4/2008 | Taylor et al. |
| 7,361,531 B2 | 4/2008 | Sharma et al. |
| 7,378,721 B2 | 5/2008 | Frazee et al. |
| 7,378,733 B1 | 5/2008 | Hoang et al. |
| 7,385,394 B2 | 6/2008 | Auburger et al. |
| 7,476,816 B2 | 1/2009 | Doogue et al. |
| 7,476,953 B2 | 1/2009 | Taylor et al. |
| 7,518,493 B2 | 4/2009 | Bryzek et al. |
| 7,557,563 B2 | 7/2009 | Gunn et al. |
| 7,573,112 B2 | 8/2009 | Taylor |
| 7,598,601 B2 | 10/2009 | Taylor et al. |
| 7,676,914 B2 | 3/2010 | Taylor |
| 7,687,882 B2 | 3/2010 | Taylor et al. |
| 7,696,006 B1 | 4/2010 | Hoang et al. |
| 7,700,404 B2 | 4/2010 | Punzalan et al. |
| 7,709,754 B2 | 5/2010 | Doogue et al. |
| 7,750,447 B2 | 7/2010 | Chang et al. |
| 7,768,083 B2 | 8/2010 | Doogue et al. |
| 7,777,607 B2 | 8/2010 | Taylor et al. |
| 7,808,074 B2 | 10/2010 | Knittl |
| 7,816,772 B2 | 10/2010 | Engel et al. |
| 7,816,905 B2 | 10/2010 | Doogue et al. |
| 7,838,973 B2 | 11/2010 | Dimasacat et al. |
| 7,839,141 B2 | 11/2010 | Werth et al. |
| 7,939,372 B1 | 5/2011 | Chang |
| 7,956,604 B2 | 6/2011 | Ausserlechner |
| 8,030,918 B2 | 10/2011 | Doogue et al. |
| 8,035,204 B2 | 10/2011 | Punzalan et al. |
| 8,058,870 B2 | 11/2011 | Sterling |
| 8,063,634 B2 | 11/2011 | Sauber et al. |
| 8,080,993 B2 | 12/2011 | Theuss et al. |
| 8,080,994 B2 | 12/2011 | Taylor et al. |
| 8,093,670 B2 | 1/2012 | Taylor |
| 8,106,654 B2 | 1/2012 | Theuss et al. |
| 8,138,593 B2 | 3/2012 | Pagkaliwangan et al. |
| 8,143,169 B2 | 3/2012 | Engel et al. |
| 8,207,602 B2 | 6/2012 | Chang et al. |
| 8,236,612 B2 | 8/2012 | San Antonio et al. |
| 8,253,210 B2 | 8/2012 | Theuss et al. |
| 8,283,772 B1 | 10/2012 | Gamboa |
| 8,362,579 B2 | 1/2013 | Theuss et al. |
| 8,461,677 B2 | 6/2013 | Ararao et al. |
| 8,486,755 B2 | 7/2013 | Ararao et al. |
| 8,610,430 B2 | 12/2013 | Werth et al. |
| 8,629,539 B2 | 1/2014 | Milano et al. |
| 8,773,124 B2 | 7/2014 | Ausserlechner |
| 9,116,018 B2 | 8/2015 | Frachon |

(56) References Cited

U.S. PATENT DOCUMENTS

| | | |
|---|---|---|
| 9,164,156 B2 | 10/2015 | Elian et al. |
| 9,201,123 B2 | 12/2015 | Elian et al. |
| 9,266,267 B2 | 2/2016 | De Volder et al. |
| 9,299,915 B2 | 3/2016 | Milano et al. |
| 2001/0028114 A1 | 10/2001 | Hosomi |
| 2001/0028115 A1 | 10/2001 | Yanagawa et al. |
| 2001/0030537 A1 | 10/2001 | Honkura et al. |
| 2001/0052780 A1 | 12/2001 | Hayat-Dawoodi |
| 2002/0005780 A1 | 1/2002 | Ehrlich et al. |
| 2002/0020907 A1 | 2/2002 | Seo et al. |
| 2002/0027488 A1 | 3/2002 | Hayat-Dawoodi et al. |
| 2002/0041179 A1 | 4/2002 | Gohara et al. |
| 2002/0068379 A1 | 6/2002 | Cobbley et al. |
| 2002/0153599 A1 | 10/2002 | Chang et al. |
| 2002/0179987 A1 | 12/2002 | Meyer et al. |
| 2002/0195693 A1 | 12/2002 | Liu et al. |
| 2003/0038464 A1 | 2/2003 | Furui |
| 2003/0039062 A1 | 2/2003 | Takahasahi |
| 2003/0067057 A1 | 4/2003 | Wu |
| 2003/0164548 A1 | 9/2003 | Lee |
| 2003/0209784 A1 | 11/2003 | Schmitz et al. |
| 2003/0230792 A1 | 12/2003 | Wu et al. |
| 2004/0032251 A1 | 2/2004 | Zimmerman et al. |
| 2004/0038452 A1 | 2/2004 | Pu |
| 2004/0042146 A1* | 3/2004 | Berberich .......... H01R 13/7197 361/118 |
| 2004/0046248 A1 | 3/2004 | Waelti et al. |
| 2004/0056647 A1 | 3/2004 | Stauth et al. |
| 2004/0080308 A1 | 4/2004 | Goto |
| 2004/0080314 A1 | 4/2004 | Tsujii et al. |
| 2004/0094826 A1 | 5/2004 | Yang et al. |
| 2004/0135220 A1 | 7/2004 | Goto |
| 2004/0135574 A1 | 7/2004 | Hagio et al. |
| 2004/0145043 A1 | 7/2004 | Hayashi et al. |
| 2004/0155644 A1 | 8/2004 | Stauth et al. |
| 2004/0174655 A1 | 9/2004 | Tsai et al. |
| 2004/0184106 A1 | 9/2004 | Jayasekara |
| 2004/0207035 A1 | 10/2004 | Witcraft et al. |
| 2004/0207077 A1 | 10/2004 | Leal et al. |
| 2004/0207398 A1 | 10/2004 | Kudo et al. |
| 2004/0207400 A1 | 10/2004 | Witcraft et al. |
| 2004/0212053 A1 | 10/2004 | Koh et al. |
| 2004/0222503 A1 | 11/2004 | Lee et al. |
| 2004/0262718 A1 | 12/2004 | Ramakrishna |
| 2004/0263148 A1 | 12/2004 | Takabatake |
| 2005/0035448 A1 | 2/2005 | Hsu et al. |
| 2005/0040814 A1 | 2/2005 | Vig et al. |
| 2005/0045359 A1 | 3/2005 | Doogue et al. |
| 2005/0139972 A1 | 6/2005 | Chiu et al. |
| 2005/0151448 A1 | 7/2005 | Hikida et al. |
| 2005/0167790 A1 | 8/2005 | Khor et al. |
| 2005/0173783 A1 | 8/2005 | Chow et al. |
| 2005/0194676 A1 | 9/2005 | Fukuda et al. |
| 2005/0224248 A1 | 10/2005 | Gagnon et al. |
| 2005/0230843 A1 | 10/2005 | Williams |
| 2005/0236698 A1 | 10/2005 | Ozawa et al. |
| 2005/0248005 A1 | 11/2005 | Hayat-Dawoodi |
| 2005/0248336 A1 | 11/2005 | Sharma et al. |
| 2005/0253230 A1 | 11/2005 | Punzalan et al. |
| 2005/0253507 A1 | 11/2005 | Fujimura et al. |
| 2005/0266611 A1 | 12/2005 | Tu et al. |
| 2005/0270748 A1 | 12/2005 | Hsu |
| 2005/0274982 A1 | 12/2005 | Ueda et al. |
| 2005/0280411 A1 | 12/2005 | Bicking |
| 2006/0002147 A1 | 1/2006 | Hong et al. |
| 2006/0033487 A1 | 2/2006 | Nagano et al. |
| 2006/0038289 A1 | 2/2006 | Hsu et al. |
| 2006/0038560 A1 | 2/2006 | Kurumado |
| 2006/0068237 A1 | 3/2006 | Murphy |
| 2006/0071655 A1 | 4/2006 | Shoji |
| 2006/0077598 A1 | 4/2006 | Taylor et al. |
| 2006/0091993 A1 | 5/2006 | Shoji |
| 2006/0113988 A1 | 6/2006 | Hall et al. |
| 2006/0114098 A1 | 6/2006 | Shoji |
| 2006/0125473 A1 | 6/2006 | Frachon et al. |
| 2006/0145690 A1 | 7/2006 | Shoji |
| 2006/0152210 A1 | 7/2006 | Mangtani et al. |
| 2006/0170529 A1 | 8/2006 | Shoji |
| 2006/0175674 A1 | 8/2006 | Taylor |
| 2006/0181263 A1 | 8/2006 | Doogue et al. |
| 2006/0219436 A1 | 10/2006 | Taylor et al. |
| 2006/0232268 A1 | 10/2006 | Arns, Jr. et al. |
| 2006/0238190 A1 | 10/2006 | Ishio |
| 2006/0255797 A1 | 11/2006 | Taylor et al. |
| 2006/0261801 A1 | 11/2006 | Busch |
| 2006/0267135 A1 | 11/2006 | Wolfgang et al. |
| 2006/0283232 A1 | 12/2006 | Lamb et al. |
| 2006/0291106 A1 | 12/2006 | Shoji |
| 2007/0007631 A1 | 1/2007 | Knittl |
| 2007/0018290 A1 | 1/2007 | Punzalan et al. |
| 2007/0018642 A1 | 1/2007 | Ao |
| 2007/0044370 A1 | 3/2007 | Shoji |
| 2007/0076332 A1 | 4/2007 | Shoji |
| 2007/0085174 A1 | 4/2007 | Wheless |
| 2007/0090825 A1 | 4/2007 | Shoji |
| 2007/0099348 A1 | 5/2007 | Sharma et al. |
| 2007/0138651 A1 | 6/2007 | Hauenstein |
| 2007/0170533 A1 | 7/2007 | Doogue et al. |
| 2007/0188946 A1 | 8/2007 | Shoji |
| 2007/0241423 A1 | 10/2007 | Taylor et al. |
| 2007/0243705 A1 | 10/2007 | Taylor |
| 2007/0279053 A1 | 12/2007 | Taylor et al. |
| 2008/0013298 A1 | 1/2008 | Sharma et al. |
| 2008/0018261 A1 | 1/2008 | Kastner |
| 2008/0034582 A1 | 2/2008 | Taylor |
| 2008/0036453 A1 | 2/2008 | Taylor |
| 2008/0116884 A1 | 5/2008 | Rettig et al. |
| 2008/0230879 A1 | 9/2008 | Sharma et al. |
| 2008/0237818 A1 | 10/2008 | Engel et al. |
| 2008/0297138 A1 | 12/2008 | Taylor et al. |
| 2008/0308886 A1 | 12/2008 | Ausserlechner et al. |
| 2009/0058412 A1 | 3/2009 | Taylor et al. |
| 2009/0083963 A1 | 4/2009 | Otremba |
| 2009/0102034 A1 | 4/2009 | Pagkaliwangan et al. |
| 2009/0121704 A1 | 5/2009 | Shibahara |
| 2009/0122437 A1 | 5/2009 | Gong et al. |
| 2009/0140725 A1 | 6/2009 | Ausserlechner |
| 2009/0152696 A1 | 6/2009 | Dimasacat et al. |
| 2009/0294882 A1 | 12/2009 | Sterling |
| 2010/0019332 A1 | 1/2010 | Taylor |
| 2010/0140766 A1 | 6/2010 | Punzalan et al. |
| 2010/0141249 A1 | 6/2010 | Ararao et al. |
| 2010/0188078 A1 | 7/2010 | Foletto |
| 2010/0201356 A1 | 7/2010 | Foletto et al. |
| 2010/0211347 A1 | 8/2010 | Friedrich et al. |
| 2010/0237450 A1 | 9/2010 | Doogue et al. |
| 2010/0276769 A1 | 11/2010 | Theuss et al. |
| 2010/0295140 A1 | 11/2010 | Theuss et al. |
| 2010/0330708 A1 | 12/2010 | Engel et al. |
| 2011/0031947 A1 | 2/2011 | You |
| 2011/0050222 A1 | 3/2011 | Ueno et al. |
| 2011/0068447 A1 | 3/2011 | Camacho et al. |
| 2011/0068779 A1 | 3/2011 | Werth et al. |
| 2011/0111562 A1 | 5/2011 | San Antonio et al. |
| 2011/0127998 A1 | 6/2011 | Elian et al. |
| 2011/0133732 A1 | 6/2011 | Sauber |
| 2011/0175598 A1 | 7/2011 | Doering et al. |
| 2011/0204887 A1 | 8/2011 | Ausserlechner et al. |
| 2011/0267039 A1 | 11/2011 | Musselman et al. |
| 2011/0267040 A1 | 11/2011 | Frachon |
| 2011/0304327 A1 | 12/2011 | Ausserlechner |
| 2012/0013333 A1 | 1/2012 | Ararao et al. |
| 2012/0077353 A1 | 3/2012 | Shedletsky |
| 2012/0086090 A1 | 4/2012 | Sharma et al. |
| 2012/0153446 A1 | 6/2012 | Jiang |
| 2012/0153447 A1 | 6/2012 | Jlang |
| 2012/0293165 A1 | 11/2012 | Zwijze et al. |
| 2013/0026615 A1 | 1/2013 | Gong et al. |
| 2013/0113474 A1 | 5/2013 | Elian |
| 2013/0113475 A1 | 5/2013 | Elian et al. |
| 2013/0249027 A1 | 9/2013 | Taylor et al. |
| 2013/0249546 A1 | 9/2013 | Vig et al. |

(56) References Cited

U.S. PATENT DOCUMENTS

| | | |
|---|---|---|
| 2013/0278246 A1 | 10/2013 | Stegerer et al. |
| 2014/0320124 A1 | 10/2014 | David et al. |
| 2017/0148692 A1 | 5/2017 | Pavier |

FOREIGN PATENT DOCUMENTS

| | | |
|---|---|---|
| DE | 3243039 A1 | 5/1984 |
| DE | 4 141 386 | 6/1993 |
| DE | 102 31 194 | 2/2004 |
| DE | 103 14 602 | 10/2004 |
| DE | 10 2004 054317 | 5/2006 |
| DE | 10 2004 060 298 | 6/2006 |
| DE | 10 2004 060298 A1 | 6/2006 |
| DE | 10 2007 018 238 | 10/2008 |
| DE | 10 2008 064047 | 4/2010 |
| DE | 10 2009 000460 | 7/2010 |
| EP | 0 244 737 A2 | 4/1987 |
| EP | 0 361 456 A2 | 4/1990 |
| EP | 0409173 A2 | 1/1991 |
| EP | 0 537 419 | 4/1993 |
| EP | 0 680 103 A1 | 11/1995 |
| EP | 0 867 725 | 9/1998 |
| EP | 0 896 180 | 2/1999 |
| EP | 0 898 180 A2 | 2/1999 |
| EP | 0944839 | 9/1999 |
| EP | 0 680 103 B1 | 2/2000 |
| EP | 1 107 327 | 6/2001 |
| EP | 1 107 328 | 6/2001 |
| EP | 1 111 693 | 6/2001 |
| EP | 1160887 | 12/2001 |
| EP | 1 180 804 | 2/2002 |
| EP | 1281974 | 2/2003 |
| EP | 1 443 332 | 8/2004 |
| EP | 0898180 B1 | 11/2004 |
| EP | 2366976 A1 | 9/2011 |
| FR | 2 748 105 | 10/1997 |
| GB | 2 191 632 | 12/1987 |
| GB | 2273782 | 6/1994 |
| JP | S47-12071 | 4/1972 |
| JP | 58-501372 | 8/1983 |
| JP | 61-71649 | 4/1986 |
| JP | 62-260374 | 11/1987 |
| JP | S63-051647 | 3/1988 |
| JP | 363 084176 A | 4/1988 |
| JP | 63-191069 | 8/1988 |
| JP | 63-263782 | 10/1988 |
| JP | 1 184885 | 7/1989 |
| JP | H 01-184885 | 7/1989 |
| JP | H01-184885 | 7/1989 |
| JP | 01207909 | 8/1989 |
| JP | 2-124575 | 10/1990 |
| JP | H03-71073 | 3/1991 |
| JP | 04-152688 | 5/1992 |
| JP | 4-97370 | 8/1992 |
| JP | 4-329682 | 11/1992 |
| JP | 4-357858 A | 12/1992 |
| JP | 4-364472 | 12/1992 |
| JP | H04-357858 | 12/1992 |
| JP | H05-113472 | 5/1993 |
| JP | 5-206185 | 8/1993 |
| JP | H05-5226566 A | 9/1993 |
| JP | H 05-90918 | 12/1993 |
| JP | H 06-055971 | 3/1994 |
| JP | H06-055971 | 3/1994 |
| JP | H07-66356 | 3/1995 |
| JP | 8-97486 | 4/1996 |
| JP | 08-097486 | 4/1996 |
| JP | 8-264569 A | 10/1996 |
| JP | H08-264569 | 10/1996 |
| JP | 9-79865 | 3/1997 |
| JP | 09-166612 | 6/1997 |
| JP | 9-166612 | 6/1997 |
| JP | H10-022422 | 1/1998 |
| JP | H 10-093001 | 4/1998 |
| JP | 11-074142 | 3/1999 |
| JP | 2000-39472 | 2/2000 |
| JP | 2000-058740 | 2/2000 |
| JP | 2000-174357 | 6/2000 |
| JP | 2000-183241 A | 6/2000 |
| JP | 2000-294692 | 10/2000 |
| JP | 2001-141738 A | 5/2001 |
| JP | 2001-165702 | 6/2001 |
| JP | 2001-165963 | 6/2001 |
| JP | 2001-174486 | 6/2001 |
| JP | 2001-230467 | 8/2001 |
| JP | 2001-289865 A | 10/2001 |
| JP | 2002-026419 | 1/2002 |
| JP | 2002-040058 | 2/2002 |
| JP | 2002-189069 | 7/2002 |
| JP | 2002-202306 | 7/2002 |
| JP | 2002-202327 | 7/2002 |
| JP | 2003-177168 | 6/2003 |
| JP | 2003-177171 | 6/2003 |
| JP | 2004-55932 | 2/2004 |
| JP | 2004 055932 A | 2/2004 |
| JP | 2004294070 | 10/2004 |
| JP | 2004-356338 | 12/2004 |
| JP | 2005-327859 | 11/2005 |
| JP | 2005-337866 | 12/2005 |
| JP | 2005-345302 | 12/2005 |
| JP | 2006-003096 | 1/2006 |
| JP | 2006-47113 | 2/2006 |
| JP | 2006-164528 A | 6/2006 |
| JP | 2006-170999 A | 6/2006 |
| JP | 2007-218799 | 8/2007 |
| JP | 2009-544149 A | 12/2009 |
| JP | 2010-093001 | 4/2010 |
| JP | 2011/029403 | 2/2011 |
| JP | 2001 116815 | 4/2014 |
| WO | WO 83/00949 | 3/1983 |
| WO | WO 9007176 | 6/1990 |
| WO | WO 99/14605 | 3/1999 |
| WO | WO 0054068 | 9/2000 |
| WO | WO 0069045 | 11/2000 |
| WO | WO 01/23899 | 4/2001 |
| WO | WO 01/74139 | 10/2001 |
| WO | WO 2003/107018 | 12/2003 |
| WO | WO 2004/027436 | 4/2004 |
| WO | WO 2005/013363 | 2/2005 |
| WO | WO 2005/026749 | 3/2005 |
| WO | WO 2006/037695 | 4/2006 |
| WO | WO 2006 060330 | 6/2006 |
| WO | WO 2006/083479 | 8/2006 |
| WO | WO 2008/008140 | 1/2008 |
| WO | WO 2008/121443 | 10/2008 |
| WO | WO 2010/065315 | 6/2010 |
| WO | WO 2010/065315 A1 | 6/2010 |
| WO | WO 2013/142112 | 7/2013 |
| WO | WO 2013/109355 | 9/2013 |
| WO | WO 2013/141981 | 9/2013 |

OTHER PUBLICATIONS

Chinese Office Action with English translation dated Jul. 5, 2017 for Chinese Application No. 201380014780.9, 11 pages.
Chinese Office Action with English translation dated Jan. 4, 2018 for Chinese Application No. 201380014780.9; 4 pages.
Notice of Allowance dated Feb. 7, 2018 for U.S. Appl. No. 15/447,320, 7 pages.
Response to U.S. Non-Final Office Action dated Dec. 15, 2017 for U.S. Appl. No. 13/424,618; Response Filed Feb. 22, 2018; 16 pages.
Response (with English Translation of Amended Claims) to Chinese Office Action dated Jan. 4, 2018 for Chinese Application No. 201380014780.9; Response Filed Mar. 7, 2018; 20 pages.
Japanese Office Action with English translation dated Jun. 4, 2018 for Japanese Application No. 2017-135582; 9 pages.
U.S. Final Office Action dated Mar. 30, 2018 for U.S. Appl. No. 13/424,618; 17 pages.
U.S. Appl. No. 13/468,478, filed May 10, 2012, Pepka et al.
U.S. Appl. No. 13/838,131, filed Mar. 15, 2013, Ararao et al.
U.S. Appl. No. 13/838,864, filed Mar. 15, 2013, Ararao et al.
U.S. Appl. No. 15/049,732, filed Feb. 22, 2016, Milano et al.

(56) References Cited

OTHER PUBLICATIONS

U.S. Appl. No. 15/447,320, filed Mar. 2, 2017, Milano et al.
PCT Search Report & Written Opinion for PCT/US2006/000363 dated May 11, 2006.
Japanese Office Action (full translation) dated july 26, 2012; for JP Pat. App. No. 2010-501028; 5 pages.
Letter from Yuasa & Hera; dated Oct. 16, 2012; for JP Pat. App. No. 2010-501028; 6 pages.
Japanese Response to Office Action; dated Oct. 16, 2012: for JP Pat. App. No. 2010-501028; 6 pages.
CN Office Action (w/English translation); dated Sep. 10, 2010; for CN Pat. Appl. No. CN 2008 800088956; 14 pages.
PCT Search Report and Written Opinion of the ISA for PCT/US2008/053551; dated Jul. 15, 2008; 11 pages.
PCT International Preliminary Report on Patentability for PCT/US2008/053551; dated Oct. 8, 2009; 7 pages.
U.S. Appl. No. 12/878,134.
Office Action; dated Jun. 7, 2012; for U.S. Appl. No. 12/360,889; 9 pages.
Response to Office Action; dated Sep. 27, 2012; for U.S. Appl. No. 12/360,889; 12 pages.
Office Action; dated Jan. 18, 2013 for U.S. Appl. No. 12/360,889; 7 pages.
Response to Office Acton; dated Apr. 15, 2013: for U.S. Appl. No. 12/360,889; 7 pages.
U.S. Appl. No. 12/360,889, filed Jan. 28, 2009.
PCT Search Report and Written Opinion for PCT/US2009/065044 dated Jan. 7, 2010.
PCT International Preliminary Report on Patentability and Written Opinion of the ISA; dated Jun. 7, 2011; for PCT Pat. App. No. PCT/US2009/065044; 7 pages.
U.S. Appl. No. 12/328,798.
U.S. Appl. No. 13/241,380.
U.S. Appl. No. 13/350,970; filed Jan. 16, 2012; 47 pages.
"Gear-Tooth Sensor for Automotive Applications," Allegro Microsystems, Inc., Aug. 3, 2001.
Allegro "Two-Wire True Zero Speed Miniature Differential Peak-Detecting Gear Tooth Sensor;" ATS645LSH; 2004; Allegro MicroSystems, Inc., Worcester, MA 01615; pp. 1-14.
Allegro MicroSystems, Inc., Hall-Effect IC Applications Guide, http://www.allegromicro.com/en/Products/Design/an/an27701.pdf, Copyright 1987, 1997, pp. 1-36.
Allegro "True Zero-Speed Low-Jitter High Accuracy Gear Tooth Sensor;" ATS625LSG; 2005; Allegro MicroSystems, inc. Worcester, MA 01615; pp. 1-21.
Bowers et al., "Microfabrcation and Process integration of Powder-Based Permanent Magnets", Interdisciplinary Microsystems Group, Dept. Electrical and Computer Engineering, University of Florida, USA; Technologies for Future Micro-Nano Manufacturing Workshop, Napa, California, Aug. 8-10, 2011, pp. 152-165.
Dwyer, "Back-Biased Packaging Advances (SE, SG & SH versus SA & SB)," http://www.allegromicro.com/en/Products/Design/packaging_advances/index.asp, Copyright 2008, pp. 1-5.
Honeywell International, Inc., "Hall Effect Sensing and Application," Micro Switch Sensing and Control, Chapter 3, http://content.honeywell.com/sensing/prodinfo/solidstate/technical/hallbook.pdf, date unavailable but believed to be before Jan. 2008, pp. 9-18.
Infineon Product Brief, TLE 4941piusC; Differential Hall IC for Wheel Speed Sensing, Oct. 2010, www.infineon.com/sensors, 2 pages.
Johnson et al., "Hybrid Hall Effect Device," Appl. Phys. Lett., vol. 71, No. 7, Aug. 1997, pp. 974-976.
Lagorce et al.; "Magnetic and Mechanical Properties of Micromachined Strontium Ferrite/Polyimide Composites;" Journal of Microelectromechanical Systems; vol. 6. No. 4; Dec. 1997; pp. 307-312.
Lequesne et al.; "High-Accuracy Magnetic Position Encoder Concept;" IEEE Transactions on Industry Appications; vol. 35, No. 3, May/Jun. 1999; pp. 568-576.

Melexis Microelectronic Systems, Hall Applications Guide, Section 3—Applications, 1997 (48 pages).
Oniku et al., "High-Energy-Density Permanent Micromagnets Formed From Heterogeneous Magnetic Powder Mixtures", Interdisciplinary Microsystems Group, Dept. of Electrical and Computer Engineering, University of Florida, Gainesville, FL 32611, USA; Preprint of MEMS 2012 Conf. Paper, 4 pages.
Park et al.; "Ferrite-Based integrated Planar inductors and Transformers Fabricated at Low Temperature;" IEEE Transactions on Magnetics; vol. 33, No. 5; Sep. 1997; pp. 3322-3324.
Response to Office Action; dated Jan. 18, 2013; for U.S. Appl. No. 12/360,889; 6 pages.
Office Action dated Jun. 28, 2013; for U.S. Appl. No. 12/360,889; 7 pages.
Notice of Allowance; dated Mar. 1, 2013; for U.S. Appl. No. 12/328,798; 10 pages.
Supplemental Notice of Allowability; dated May 10, 2013; for U.S. Appl. No.12/328,798; 5 pages.
Notice of Allowance; dated Feb. 21, 2013; for U.S. Appl. No. 13/241,380; 9 pages.
Supplemental Notice of Allowability; dated May 1, 2013; for US. Appl. No. 13/241,380; 5 pages.
PCT Invitation to Pay Additionai Fees and Partial Search Report of the ISA; dated Jul. 8, 2013; for PCT Pat. App. No. PCT/US2013/025858; 6 pages.
PCT Invitation to Pay Additionai Fees and Partial Search Report of the ISA; dated Jul. 1, 2013; for PCT Pat. App. No. PCT/US2013/030112; 7 pages.
Japanese Notice of Reasons for Rejection (Engiish translation); dated Jul. 16, 2013; for Japanese Pat. App. No. 2011-539582; 3 pages.
Notification, Search Report and Written Opinion dated Sep. 3, 2013 for PCT Application No. PCT/US2013/030112, filed Mar. 11, 2013, 29 pages.
Notification, Search Report and Written Opinion dated Sep. 25, 2013 for PCT Application No. PCT/US2013/025858, filed Feb. 13, 2013, 37 pages.
Response to Office Action; fiied Sep. 30, 2013: to Office Action dated Jun. 28, 2013; for U.S. Appl. No. 12/360,889, 15 pages.
Letter from Yuasa and Hara dated Oct. 29, 2013; for Japanese Pat. App. No. 2011-539582; 2 pages.
Response to Office Action (with Claims in English) filed Oct. 15, 2013; for Japanese Pat. App. No. 2011-539582, 13 pages.
Office Action dated Jan. 9, 2014; for U.S. Appl. No. 13/838,131; 35 pages.
Chinese Office Action from Chinese Patent Application No. 201110285150.8, inciuding Engiish transiation, 15 pages.
Response to Chinese Office Action dated Dec. 16, 2013 from Chinese Patent Application No. 201110285150.8, including Applicant's Instruction letter to foreign associate, foreign associate emailed response and foeign associate cover letter arttached to filed response, 11 pages.
Office Action dated Jan. 28, 2014, for U.S. Appl. No. 13/838,864; 35 pages.
Finai Office Action dated Mar. 11, 2014; for U.S. Appl. No. 12/360,889 23 pages.
Korean Patent Application No. 10-2009-7021132 Office Action dated Mar. 28, 2014, inciuding partiai translation on foreign associate email dated Apr. 1, 2014, 11 pages.
Chinese Patent Appiication No. 201110285150.8 Notice of Granting Patent Right for Invention dated Apr. 17, 2014, including English translation, 4 pages.
Japanese Patent Application No. 2010-501028 Allowance Report dated May 7, 2014, with foreign associate cover letter, 4 pages.
Response to Office Action dated Jan. 28, 2014 as filed on May 28, 2014 for U.S. Appl. No. 13/838,864.
Response to Office Action dated Jan. 9, 2014 as filed on May 28, 2014 for U.S. Appl. No. 13/838,131.
Korean Patent Application No. 10-2009-7021132 Response and Amendment filed May 27, 2014, including translation of Amended Claims, Email from Foreign Associate dated Apr. 29, 2014 providing comments, Email to Foreign Associate dated May 23, 2014

(56) References Cited

OTHER PUBLICATIONS providing instruction to amend claims, letter from Foreign Associate instructing Response and Amendment filed May 27, 2014.
Korean Patent Application No. 10-2009-7021132 Email from foreign associate dated Apr. 1, 2014 regarding office action received and listing of references from office action (translation of each reference listed above), 2 pages.
Response filed Jun. 23, 2014, of Office Action dated Mar. 11, 2014 for U.S. Appl. No. 12/360,889 11 pages.
Office Action dated Jul. 17, 2014 for U.S. Appl. No. 13/838,131, filed Mar. 15, 2013.
Office Action dated Jul. 17, 2014 for U.S. Appl. No. 13/838,864, filed Mar. 15, 2013.
Office Action dated Aug. 4, 2014 for U.S. Appl. No. 12/360,889, filed Jan. 28, 2009 15 pages.
Japanese Office Action dated Jun. 19, 2014; with English Translation, for Japanese Pat. App. No. 2011-539582; 8 pages.
Response filed Sep. 23, 2014 to Office Action dated Jul. 17, 2014; for U.S. Appl. No. 13/838,864; 18 pages.
Request for Continued Examination filed Sep. 23, 2014; for U.S. Appl. No. 13/838,884; 2 pages.
Response filed Sep. 23, 2014 to Office Action dated Jul. 17, 2014; for U.S. Appl. No. 13/838,131; 20 pages.
Request for Continued Examination filed Sep. 23, 2014; for U.S. Appl. No. 13/838,131; 2 pages.
International Search Report and Written Opinion dated Jul. 28, 2014 for PCT Application No. PCT/US2014/032125; 18 pages.
Office Action dated Aug. 1, 2014 for U.S. Appl. No. 13/871,131; 41 pages.
Response as filed on Sep. 26, 2014 for U.S. Appl. No. 13/871,181; 14 pages.
International Preliminary Report on Patentability dated Oct. 2, 2014 for PCT Application PCT/US2013/025858; 30 pages.
Korean Patent Application No. 10-2009-7021132 Notice of Allowance dated Sep. 26, 2014, including translation, 6 pages.
Office Action dated Oct. 6, 2014; for U.S. Appl. No. 13/838,864; 26 pages.
Office Action dated Oct. 2, 2014; for U.S. Appl. No. 13/838,131; 29 pages.
International Preliminary Report on Patentability dated Oct. 2, 2014 for PCT Application No. PCT/US2013/030112; 20 pages.
Office Action dated Nov. 14, 2014 for U.S. Appl. No. 13/871,131; 17 pages.
Claims as sent to Yuasa and Hara on Oct. 21, 2014; for Japanese Pat. App. No. 2011-539582; 9 pages.
Claims as filed on Oct. 28, 2014 by Yuasa and Hara, for Japanese Pat. App. No. 2011-539582; 5 pages.
Response filed Feb. 20, 2015; to Office Action dated Oct. 6, 2014; for U.S. Appl. No. 13/838,864; 15 pages.
Response filed Feb. 20, 2015; to Office Action dated Oct. 2, 2014; for U.S. Appl. No. 13/838,131; 18 pages.
Office action dated May 31, 2013 for U.S. Appl. No. 13/350,970; 5 pages.
Response to Office Action filed Jun. 19, 2013 for U.S. Appl. No. 13/350,970;7 pages.
Notice of Allowance dated Sep. 3, 2013 for U.S. Appl. No. 13/350,970;10 pages.
Restriction Requirement dated Jul. 15, 2014 for U.S. Appl. No. 13/350/970; 7 pages.
Response to Restriction Requirement filed Jul. 29, 2014 for U.S. Appl. No. 14/090,037;1 pages.
Office action dated Aug. 14, 2014 for U.S. Appl. No. 14/090,037; 7 pages.
Amendment filed Dec. 18, 2014 for U.S. Appl. No. 14/090,037; 9 pages.
Final Office Action dated Feb. 24, 2015; for U.S. Appl. No. 14/090,037; 13 pages.
Response filed Jan. 13, 2015 for EP Application EP12809921.5; 18 pages.
Response filed Jan. 28, 2015 for U.S. Appl. No. 13/871,131; 20 pages.
Request for Continued Examination filed Jan. 28, 2015 for U.S. Appl. No. 13/871,131; 2 pages.
Notice of Allowance dated Feb. 18, 2015 for U.S. Appl. No. 13/871,131;9 pages.
Hashemi, "The Close Attached Capacitor; A Solution to Switching Noise Problems" IEEE Transactions on Components, Hybrids, and Manufacturing Technologies, IEEE New York, US vol. 15, No. 6, Dec. 1, 1992 8 pages.
Infineon Technologies, "Differential Two-Wire Hall Effect Sensor-IC for Wheel Speed Applications with Direction Detection" Feb. 2005, Data Sheet. vol. 3.1, 32 pages.
Infineon Technologies, "Smart Hall Effect Sensor for Camshaft Applications", 2003 Infineon Technologies AG, Germany 2 pages.
Motz et al., "A chopped Hall Sensor with Small Jitter and Programmable "True Power-On" Function", IEEE Journal of Solid State Circuits, vol. 40, No. 7, Jul. 2005 8 pages.
Wibben J. et al., "A High-Efficiency DC-DC Converter Using 2nH Integrated Inductors", IEEE Journal of Solid State Circuits, IEEE Service Center, Piscataway, NJ, col. 43, No. 4, Apr. 1, 2008 11 pages.
Arnold et al., "Hall Effect Detector and Miniswitch;" IBM Technical Disclosure Bulletin; vol. 17 No. 11; Apr. 1975; 1 page.
Baltes; "Future of IC Microtransducers;" Sensors & Actuators A, Elsevier Sequoia S.A Lausanne; No. 1; Aug. 1996; 14 pages.
Blanchard et al.; "Highly Sensitive Hall Sensor in CMOS Technology." Sensors & Actuators A, Elsevier Sequoia S.A Lausanne, CH; vol. 85, No. 1-3; May 2000; 5 pages.
Cheng et al.; "Effects of Spacer Layeron Growth Stress& Magnetic Properties of Sputtered Permalloy Film;" Journal of Magnetism and Magnetic Materials, Elsevier Science Publishers; Amsterdam; NL; vol. 282; Nov. 2004; 6 pages.
Daughton; "GMR & SDT Sensor Applications;" IEEE Transactions on Magnetics, vol. 36, No. 5; Sep. 2000; 6 pages.
Edelstein et al.; "Minimizing 1/fNoise in Magnetic Sensors Using a Microelectromechanical Systems Flux Concentrator," Journal of Applied Physics; American Institute of Pflysics; New York, US vol. 91. No. 10, May 15, 2002; 3 pages.
Frick et al.; "40.2: CMOS Microsystems for AC Current Measurement with Galvanic Isolation;"Proceedings IEEE Sensors 2002; IEEE int'l Conference on Sensors: New York, NY vol. 1 of 2, Conf. 1; Jun. 12, 2002; 9 pages.
Katyl; "Edge-Mounted Hall Cell Sensor;" IBM Technical Disclosure Bulletin; vol. 22, No. 8A; Jan. 1, 1980; 1 page.
Katyl "Flux Concentrator for Magnetic Field Sensor Transistor," Ip.com Journal, ip.com Inc., West Henrietta, NY; Jun. 1, 1980; 3 Pages.
Leichie et al.; "A Micromachined Resonant Magnetic Field Sensor," Proceedings of the IEEE 14th Annual Int'l Conference on Microelectio Mechanical Systems, MEMS 2001; Interlaken, SH; Jan. 21, 2001; 4 pages.
Popovic et al.; "Intergrated Hall Sensor/ Fiux Concentrator Microsystems;" Informacije Midem; Ljubljana , SI: Oct. 10, 2001; 5 pages.
Popovic,; "Not-Plate-Like Hall Magnetic Sensors and their Applications," Sensors & Actuators A, Elsevier Sequoia S.A Lausanne: CH; vol. 85, No. 1-3; Aug. 25, 2000; 9 pages.
Schneider et al.; "Intergrated Flux Concentrator improves CMOS Magnetotransistors," Proceedings of the Workshop on Micro Electrical Mechanical Systems; NL; Jan. 29, 1995;6 pages.
Lee et al.; "Fine Pitch Au—SnAgCu Joint-in-via Flip-Chip Packaging," IEEE 9th Electronics Packaging Technology Conference, Dec. 10-12, 2007; 7 pages.
Mosberger et al.; "The Effects of Maters and Post-Mold Profiles on Plastic Encapsulated Integrated Circuits;" IEEE/IRPS; Apr. 1994, 8 pages.
Steiner et al.; "Fully Package CMOS Current Monitor Using Leadon-Chip Technology," Physical Electronics Laboratory, ETHZurion, CH8093 Zurich, Switzerland; No. 0-7803-4412-X/98; IEEE 1998; 6 pages.

(56) References Cited

OTHER PUBLICATIONS

Park et al.; "Ferrite-Based integrated Planar Inductors and Transformers Fabricated at Low Temperature;" IEEE Transactions on Magnetics, vol. 33, No, 5; Sep. 1997; 3 pages.
Office Action dated Mar. 24, 2015; for U.S. Appl. No. 13/838,864; 25 pages.
Final Office Action dated Apr. 2, 2015: for U.S. Appl. No. 13/838,131; 25 pages.
Japanese Notice of Reasons for Rejection (English translation) dated Mar. 31. 2015; for Japanese Pat. App. No. 2011-539582; 2 pages.
Office Action dated Mar. 10, 2015 for U.S. Appl. No. 13/788,210; 12 pages.
Office Action dated Apr. 21, 2015 for U.S. Appl. No. 13/749,776; 22 pages.
Response to Office Action filed May 1, 2015 for European Application No. 13710112.7; 18 pages.
Office Action dated May 7, 2015 for U.S. Appl. No, 13/424,618; 29 pages.
Response to Office Action filed May 11, 2015 for European Application No. 13712040.8; 21 pages.
QPIDS with RCE and IDS filed Apr. 21, 2015 for U.S. Appl. No. 13/871,131;8 page.
Notice of Allowability dated May 21, 2015 for U.S. Appl. No. 13/871,131; 7 pages.
RCE and IDS filed May 22, 2015 for U.S. Appl. No. 13/871,131;7 pages.
Request for Continued Examination filed May 26, 2015; for U.S. Appl. No. 14/090,037; 1 page.
Response to Final Office Action dated May 26, 2015; to Final Office Action dated Feb. 24, 2015; for U.S. Appl. No. 14/090,037; 12 pages.
U.S. Appl. No. 14/090,037 Office Action dated Jun. 4, 2015, 5 pages.
Letter to Yuasa and Hara dated Jun. 11, 2015; for Japanese Pat. App. No. 2011-539582; 7 pages.
Letter from Yuasa and Hara dated Jun. 19, 2015, for Japanese Pat. App. No, 2011-539582: 1 page.
Japanese Argument and Amendment (inciudng Claims in English) fiied Jun. 16, 2015; for Japenese Pat. App. No. 2011-539582; 10 pages.
Office Action dated Jun. 19, 2015 for U.S. Appl. No. 13/871,131 of David, et al; 18 pages.
Response to Office Action dated Jul. 15, 2015 U.S. Appl. No. 13/424,618 of Vig, et al.; 14 pages.
Response to Office Action dated Jul. 15, 2015 U.S. Appl. No. 13/749,776 of David, et al; 21 pages.
Response to Office Action dated Jul. 15, 2015 U.S. Appl. No. 13/780,210 of Taylor, et al; 9 pages.
Response to Office Action dated Jul. 15, 2015 U.S. Appl. No. 13/871,131 of David, et al; 19 pages.
Office Action dated Aug. 12, 2015 for U.S. Appl. No. 13/788,210; 17 pages.
Japanese Notice for Reasons of Rejection dated Jul. 30, 2010; for Japanese Pat. App. No. 2014-219004; 4 Pages.
Office Acton dated Aug. 21, 2015; For U.S. Appl. No. 13/749,776; 48 pages.
Office Action dated Aug. 28, 2015; for U.S. Appl. No. 13/871,131; 23 pages.
Response dated Sep. 3, 2015 to Office Action dated Jun. 4, 2015; For U.S. Appl. No. 14/090,037; 13 Pages.
Japanese Office Action (with English translation) dated Sep. 1, 2015; for Japanese Pat. App. No. 2011-539582; 4 Pages.
Japanese Notice for Reasons of Rejection (with English translation) dated Jul. 30, 2015: for Japanese Pat. App. No. 2014-219004; 7 Pages.
Japanese Office Action (with English trensietion) dated Jul. 30, 2015; For Japanese Pat. App. No. 2014-219011; 10 Pages.
Request for Continued Examination filed Sep. 17, 2015; for U.S. Appl. No. 13/838,131; 12 pages.
Response filed Sep. 17, 2015; to Final Office Action dated Apr. 2, 2015; for U.S. Appl. No. 13/838,131; 12 pages.
Letter from Yuasa and Hara dated Nov. 9, 2015 For Japanese Pat. App. No. 2011-539582; 1 page.
Response with English Claims dated Oct. 7, 2015 to Office Action: For Japanese Pat. App. No. 2011-539582; 10 pages.
Letter from Yuasa and Hara dated Nov. 10, 2015; For Japanese Pat. App. No. 2011-539582; 1 page.
Japanese Notice of Allowance with English Allowed Claims dated Nov. 4, 2015; For Japanese Pat. App. No. 2011-539582; 8 pages.
Letter from Yuasa and Hara dated Nov. 9, 2015: For Japanese Pat. App. No. 2014-219004; 1 page.
Response with English Claims dated Oct. 29, 2015 to Office Action; For Japanese Pat. App. No. 2014-219004 10 pages.
Letter from Yuasa and Hara dated Nov. 9, 2015; For Japanese Pat. App. No. 2014-219011; 1 page.
Response with English Claims dated Oct. 29, 2015 to Office Action; For Japanese Pat. App. No. 2014-219011; 9 pages.
Final Office Action dated Nov. 5, 2015 for U.S. Appl. No. 13/424,618; 24 pages.
Request for Continued Examination, Response to Office Action dated Oct. 8, 2015 for U.S. Appl. No. 13/871,131; 18 pages.
Office Action dated Nov. 19, 2015 for U.S. Appl. No. 13/871,131; 19 pages.
International Preliminary Report on Patenability dated Nov. 5, 2015 for PCT Application No. PCT/US2014/032125; 15 pages.
Decision of Refusal with English translation dated Nov. 18, 2015 for Japanese Application No. 2014-219011; 4 pages.
Japanese Final Office Action with English translation dated Nov. 17, 2015; For Japanese Pat. App. No. 2014-219004; 4 pages.
Office Action dated Dec. 2, 2015; For U.S. Appl. No. 13/838,131; 24 pages.
Notice of Allowance dated Nov. 20, 2015; For U.S. Appl. No. 14/090,037; 7 pages.
Request for Continued Examination, Response to Office Action, IDS filed Dec. 1, 2015 for U.S. Appl. No. 13/788,210; 19 pages.
Request for Continued Examination, Response to Office Action, IDS dated Dec. 1, 2015 for U.S. Appl. No. 13/788,210; 18 pages.
Request for Continued Examination, Response to Office Action, IDS dated Dec. 7, 2015 for U.S. Appl. No. 13/749,776; 24 pages.
Office Action dated Dec. 24, 2015 for U.S. Appl. No. 13/749,776; 30 pages.
Office Action dated Jan. 6, 2016 for U.S. Appl. No. 13/788,210; 15 pages.
Office Action dated Dec. 6, 2000 for U.S. Appl. No. 09/264,254; 12 pages.
Response to Office Action dated Feb. 27, 2001 for U.S. Appl. No. 09/264,254; 11 pages.
Supplemental Amendment filed Mar. 15, 2001 for U.S. Appl. No. 09/264,254; 4 pages.
Preiiminary Amendment filed Apr. 19, 2001 for U.S. Appl. No. 09/837,991, 8 pages.
Office Action dated Dec. 19, 2002 for U.S. Appl. No. 09/837,991; 10 pages.
Response to Office Action dated Mar. 4, 2002 for U.S. Appl. No. 09/837,991; 14 pages.
Office Action dated May 14, 2003 for U.S. Appi. No. 09/837,991; 10 pages.
Amendment Under 37 C.F.R §1.116 dated Sep. 4, 2003 for U.S. Appl. No. 09/837,991; 13 pages.
Request for Continued Examination, Response to Office Action dated Feb. 2, 2016 for U.S. Appl. No. 13/424,618, 16 pages.
Response to Office Action dated Feb. 5, 2016 for U.S. Appl. No, 13/871,131, 19 pages.
Letter from Yuasa and Hara dated Feb. 8, 2016; For Japanese Pat. No. 2011-539582; 2 pages.
Japanese Office Action with English translation dated Jan. 27, 2016 for Japanese Patent Application No. 2015-501676; 8 pages.
Response to Office Action dated Mar. 2, 2016 for U.S. Appl. No. 13/838,131; 12 pages.
Response to Office Action dated Mar. 2, 2010 for U.S. Appl. No. 13/788,210; 10 pages.

(56) References Cited

OTHER PUBLICATIONS

Response to Office Action dated Mar. 3, 2018 for U.S. Appl. No. 13/749,776; 17 pages.
Chinese Office Action dated Jan. 29, 2016 with English translation for Chinese Application No. 201380014780.9; 17 pages.
Office Action dated Apr. 1, 2016 for U.S. Appl. No. 13/749,776; 34 pages.
German Office Action (with English Translation) dated Mar. 3, 2016 corresponding to German Patent Application No. 112008000759.4; 10 Pages.
Final Office Action dated Apr. 7, 2016; for U.S. Appl. No. 13/871,131; 9 pages.
Terminal Disclaimer filed Apr. 11, 2016 for U.S. Appl. No. 13/871,131; 2 pages.
Response to Final Office Action dated Apr. 12, 2016 for U.S. Appl. No. 13/871,131; 13 pages.
Letter to Yuasa and Hera dated Mar. 15, 2016 for japanese Application No. 2015-501676; 2 pages.
Final Office Action dated Apr. 22, 2016; For U.S. Appl. No. 13/838,131; 27 pages.
Chinese Office and English translation dated Mar. 2, 2016 for Chinese Application No. 201380026117.0; 50 pages.
Final Office Action dated Apr. 27, 2016 for U.S. Appl. No. 13/788,210, 18 pages.
Office Action dated May 6, 2010 for U.S. Appl No 13/424,618, 15 pages.
Restriction Requirement dated Apr. 10, 2006 for U.S. Appl. No, 11/051,124; 4 pages.
Response to Restriction Requirement dated Apr. 25, 2006 for U.S. Appl. No. 11/051,124; 4 pages.
Office Action dated Jun. 30, 2006 for U.S. Appl. No. 11/051,124; 14 pages.
Final Office Action dated Dec. 15, 2006 for U.S. Appl. No. 11/051,124; 18 pages.
Request for Continued Examination and Response to Office Action dated Mar. 5, 2007 for U.S. Appl. No. 11/051,124; 21 pages.
Office Action dated May 18, 2007 for U.S. Appl. No. 11/051,124, 8 pages.
Response to Office Acton dated Aug. 18, 2007 for U.S. Appl. No. 11/051,124; 28 pages.
Final Office Action dated Nov. 2, 2007 for U.S. Appl. No. 11/051,124; 11 pages.
Response to Final Office Action dated Jan. 11, 2008 for U.S. Appl. No. 11/051,124; 12 pages.
Notice of Allowance dated Feb. 4, 2008 for U.S. Appl. No. 11/051,124, 4 pages.
Request for Continued Examination, Information Disclosure Statement, Petition to Withdraw from Issue Letter and Transmittal Form dated May 22, 2008 for U.S. Appl. No. 11/051,124; 7 pages.
Notice of Allowance dated Sep. 9, 2008 for U.S. Appl. No. 11/051,124, 4 pages.
Preliminary Amendment dated Apr. 16, 2007 for U.S. Appl. No. 11/693,183; 10 pages.
Restriction Requirement dated Dec. 29, 2009 for U.S. Appl. No. 11/693,183; 6 pages.
Response to Restriction Requirement dated Jan. 11, 2010 for U.S. Appl. No. 11/893,183; 1 page.
Office Action dated Feb. 26, 2010 for U.S. Appl. No. 11/693,183; 8 pages.
Response to Office Action dated Jun. 9, 2010 for U.S. Appl. No. 11/693,183; 6 pages.
Notice of Aiiowance dated Aug. 26, 2010 for U.S. Appl. No. 11/693,183; 7 pages.
Office Action dated Jan. 4, 2012 for U.S. Appl. No. 12/878,134; 9 pages.
Response to Office Action dated Jan. 16, 2012 for U.S. Appl. No. 12/678,134; 6 pages.
Notice of Ailowance dated Feb. 3, 2012 for U.S. Appl. No. 12/878,134: 7 pages.
Office Action dated Jul. 21, 2011 for U.S. Appl. No. 12/360,889; 8 pages.
Response to Office Action dated Oct. 21, 2011 for U.S. Appl. No. 12/360,889; 10 pages.
Final Office Action dated Jan. 17, 2012 for U.S. Appl. No. 12/360,889; 9 pages.
Request for Continued Examination and Response to Office Action dated May 17, 2012 for U.S. Appl. No. 12/360,889; 14 pages.
Office Action dated Jun. 7, 2012 for U.S. Appl. No. 12/380,889 8 pages.
Office Action dated Jan. 18, 2013 for U.S. Appl. No. 12/300,889; 6 pages.
Response to Office Action dated Apr. 15, 2013 for U.S. Appl. No. 12/360,889; 6 pages.
Response to Office Action dated Sep. 27, 2013 for U.S. Appl. No. 12/380,889, 15 pages.
Final Office Action dated Mar. 11, 2014 for U.S. Appl. No. 12/360,889; 10 pages.
Response to Final Office Action dated Jun. 23, 2014 for U.S. Appl. No. 12/360,889; 11 pages.
Request for Continueed Examination dated Jul. 21, 2014 for U.S. Appl. No. 12/360,889; 3 pages.
Office Action dated Aug. 4, 2014 for U.S. Appl. No. 12/360,889; 8 pages.
Restriction Requirement dated Oct. 23, 2009 for U.S. Appl. No. 12/328,798; 7 pages.
Response to Restriction Requirement dated Nov. 3, 2009 for U.S. Appl. No. 12/328,798; 1 page.
Office Action dated Dec. 14, 2009 for U.S. Appl. No. 12/328,798; 15 pages.
Response to Office Action dated Jan. 27, 2010 for U.S. Appl. No. 12/328,798; 22 pages.
Final Office Action dated May 24, 2010 for U.S. Appl. No. 12/328,798; 20 pages.
Response to Final Office Action dated Jul. 28, 2010 for U.S. Appl. No. 12/328,798; 23 pages.
Request for Continued Examination and Information Disclosure Statement dated Aug. 9, 2010 for U.S. Appl. No. 12/328,798; 3 page.
Office Action dated Oct. 31, 2011 for U.S. Appl. No. 12/328,798; 13 pages.
Response to Office Action dated Feb. 28, 2012 for U.S. Appl. No. 12/328,798; 15 pages.
Final Office Action dated May 10, 2012 for U.S. Appl. No. 12/328,798; 13 pages.
Response to Final Office Action dated Oct. 9, 2012 for U.S. Appl. No. 12/328,798; 6 pages.
Notice of Allowance dated Oct. 26, 2012 for U.S. Appl. No. 12/328,798; 10 pages.
Request for Continued Examination and Information Disclosure Statement dated Jan. 24, 2013 for U.S. Appl. No. 12/328,798; 6 pages.
Notice of Allowance dated Mar. 1, 2013 for U.S. Appl. No. 12/328,798; 7 pages.
Preliminary Amendment dated Sep. 22, 2011 for U.S. Appl. No. 13/241,380; 8 pages.
Office Action dated Feb. 22, 2012 for U.S. Appl. No. 13/241,380; 13 pages.
Response to Office Action dated May 2, 2012 for U.S. Appl. No. 13/241,380; 16 pages.
Final Office Action dated Jul. 19, 2012 for U.S. Appl. No. 13/241,380; 13 pages.
Response to Final Office Action dated Oct. 9, 2012 for U.S. Appl. No. 13/241,360; 6 pages.
Notice of Allowance dated Oct. 29, 2012 for U.S. Appl. No. 13/241,380, 9 pages.
Request for Continued Examination and Information Disclosure Statement dated Jan. 24, 2013 for U.S. Appl. No. 13/241,380; 5 pages.
Notice of Allowance dated Feb. 21, 2013 for U.S. Appl. No. 13/241,380; 7 pages.
English translation of Japanese Office Action dated Jul. 26, 2012; for Japanese Patent Application No. 2010-501028; 5 pages.

(56) References Cited

OTHER PUBLICATIONS

Japanese Response to Office Action; dated Oct. 16, 2012 for Japanese Patent Application No. 2010-501028; 12 pages.
Request for Continued Examination, Response to Office Action and IDS dated Sep. 17, 2015 for U.S. Appl. No. 13/838,131; 18 pages.
Restriction Requirement dated Jul. 15, 2014 for U.S. Appl. No. 14/090,037; 7 pages.
Amendment dated Dec. 16, 2014 for U.S. Appl. No. 14/090,037; 9 pages.
Office Action dated May 6, 2016 for U.S. Appl. No. 13/424,618, 15 pages.
Notice of Allowance dated May 9, 2016 for U.S. Appl. No, 13/871,131, 9 pages.
Response to Written Opinion dated Jun. 10, 2016 for European Application No. 14717654.9, 20 pages.
Response dated Jun. 20, 2016 to Final Office Action dated Apr. 22, 2016; For U.S. Appl. No. 13/838,131; 13 pages.
Applicant-Initiated interview Summary dated Jul. 27, 2016 for U.S. Appl. No. 13/424,618; 5 pages.
Request for Continued Examination (RCE), Letter Requesting Non-Entry of Previously Filed Amendment, and Response to Final Office Action dated Apr. 22, 2016 corresponding to U.S. Appl. No. 13/838,131; Response filed on Aug. 16, 2016; 17 Pages.
Request for Continued Examination and Amendment filed on Aug. 24, 2016 for U.S. Appl. No. 13/788,210; 15 pages.
Chinese Response to Office Action with English claims dated Aug. 9, 2016 for Chinese Application No. 201330014780.9; 15 pages.
Japanese Office Action with English Translation and claims dated Jul. 25, 2016 for Japanese Application No. 2015-501720; 13 pages.
European Office Action dated Aug. 10, 2016 for European Application No. 14717654.9; 20 pages.
Koninklijke Philips Electronics Product data sheet KMA200 "Programmable angle sensor" Aug. 16, 2005, 31 pages.
Request for Continued Examination and Amendment filed on Aug. 31, 2016 for U.S. Appl. No. 13/749,776; 21 pages.
European Office Action dated Aug. 10, 2016 for European Application No. 13710112.7; 29 pages.
Amendment filed on Sep. 1, 2016 for U.S. Appl. No. 13/424,618; 15 pages.
English translation of Japanese Office Action dated Aug. 7, 2013 for Japanese Application No. 2010-501028; 3 pages.
Response to Japanese Office Action with English translation of claims filed on Sep. 10, 2013 for Japanese Application No. 2010-501028; 10 pages.
Search Report and Written Opinion dated Apr. 24, 2013 for PCT Application No. PCT/US2012/068912; 15 pages.
Demand for International Preliminary Examination filed Nov. 6, 2013 for PCT Application No. PCT/US2012/068912: 15 pages.
EPO Notification concerning informal communications with the applicant dated Jan. 3, 2014 for PCT Application No. PCT/US2012/068912; 23 pages.
Response to EPO Communication filed Mar. 3, 2014 for PCT Application No. PCT/US2012/068912; 9 pages.
International Preliminary Report on Patentability dated Apr. 8, 2014 for PCT Application No. PCT/US2012/068912; 22 pages.
Japanese Office Action with English translation dated Aug. 15, 2016 for Japanese Application No. 2015-501676; 6 pages.
Office Action dated Sep. 19, 2016 for U.S. Appl. No. 13/788,210; 16 pages.
Office Action dated Sep. 20, 2016 for U.S. Appl. No. 13/838,131; 14 pages.
Response to Chinese Office Action with English Translation of claims filed Sep. 18, 2016 for Chinese Application No. 201380026117.0; 9 pages.
Terminal Disclaimer filed Sep. 9, 2016 for U.S. Appl. No. 13/749,776; 2 pages.
Notice of Alloweance dated Sep. 15, 2016 for U.S. Appl. No. 13/749,776; 10 pages.
Non-Final Office Action dated Oct. 19, 2016; for U.S. Appl. No. 15/049,732; 30 pages.

Response to Japanese Office Action dated Oct. 8, 2016: Letter to Yuasa and Hera dated Sep. 26, 2016 and pending claims for Japanese Application No. 2015-501720; 22 pages.
Response to Office Action dated Oct. 19, 2016 from U.S. Appl. No. 15/049,732 as filed on Nov. 8, 2016; 8 Pages.
Final Office Action dated Nov. 30, 2016 for U.S. Appl. No. 13/424,618, 20 pages.
Response to Japanese Office Action filed on Nov. 15, 2016 with pending claims and letter to Yuasa and Hara dated Oct. 7, 2016 for Japanese Application No. 2015-501676; 14 pages.
Notice of Allowance dated Dec. 2, 2016 for U.S. Appl. No. 15/049,732; 5 pages.
Response to official communication filed Dec. 7, 2016 for European Application No. 14717654.9; 15 pages.
Response to official communication filed Dec. 8, 2016 for European Application No. 13710112,7; 13 pages.
Amendment dated Dec. 14, 2016 for U.S. Appl. No. 13/788,210; 11 pages.
Response to Office Action dated Dec. 19, 2016 for U.S. Appl. No. 13/838,131; 11 pages.
Chinese Office Action with English translation and pending Claims dated Dec. 12, 2016 for Chinese Application No. 201380026117.0; 24 pages.
Response to Office Action dated Jan. 19, 2017 for U.S. Appl. No. 13/424,618, 17 pages.
Chinese Office Action with Engiish translation and pending claims dated Dec. 13, 2016 for Chinese Application No. 201380014780.9; 21 pages.
Letter to NTD Patent & Trade Mark Agency Ltd. dated Feb. 10, 2017 and Claim amendments for Chinese Application No. 201380014780.9; 9 pages.
Letter to NTD Patent & Trade Mark Agency Ltd. dated Feb. 13, 2017 and Claim amendments for Chinese Application No. 201380026117.0; 5 pages.
Final Office Action dated Feb. 22, 2017 for U.S. Appl. No. 13/838,131; 15 pages.
German Response (with English Translation) dated Feb. 28, 2017 for German Application No. 112008000759.4; 21 Pages.
Pretrial Report with English translation dated Jan. 20, 2017 for Japanese Application No. 2015-501676; 5 pages.
Letter to Yuasa and Hara in response to Pretrial Report dated Mar. 6, 2017 and Claim amendments for Japanese Application No. 2015-501676; 7 pages.
Notice of Allowance dated Mar. 21, 2017 for U.S. Appl. No. 13/788,210; 8 pages.
Japanese Office Action dated Mar. 9, 2017 and English translation for Japanese Application No. 2016-084148; 13 pages.
Letter to Yuasa and Hara dated Mar. 6; 2017 and amended claims for Japanese Application No, 2015-501676; 7 pages.
Petition dated Apr. 11, 2017 for Japanese Application No. 2015-501676; 7 pages.
Japanese Office Action dated Mar. 15, 2017 English translation for Japanese Application No. 2015-501720; 8 pages.
Office Action dated Apr. 18, 2017 for U.S. Appl. No. 13/424,618; 19 pages.
Amendment in response to Final Office Action dated Feb. 22, 2017 and filed May 2, 2017 for U.S. Appl. No. 13/838,131; 12 pages.
Request for Continued Examination filed on May 16, 2017 for U.S. Appl. No. 13/830,131; 3 pages.
Response to Final Office Action filed on May 2, 2017 for U.S. Appl. No. 13/838,131; 12 pages.
Office Action dated Jun. 8, 2017 for U.S. Appl. No. 13/838,131; 16 pages.
Japanese Notice of Allowance with English Allowed claims dated Jun. 26, 2017 for Japanese Application No. 2015-501676; 20 pages.
Chinese Office Action with English translation dated Jun. 2, 2017 for Chinese Application No. 201380026117.0, 20 pages.
Notice of Allowance dated May 31, 2017 for U.S. Appl. No. 13/748,999; 11 pages.
Response to Office Action filed on Jun. 21, 2017 for U.S. Appl. No. 13/424,618; 13 pages.
Response to Japanese Office Action with English claims dated Jul. 11, 2017 for Japanese Application No. 2015-501720, 18 pages.

(56) References Cited

OTHER PUBLICATIONS

Response to Chinese Office Action with English claims dated Jul. 17, 2017 for Chinese Application No. 201380026117.0; 11 pages.
Response to Chinese Office Action with English translation filed on Sep. 19, 2017 for Chinese Application No. 201380014780.9; 14 pages.
Office Action dated Oct. 10, 2017 for U.S. Appl. No. 13/424,618; 15 pages.
Japanese Pre-Trial report with English translation dated Sep. 19, 2017 for Japanese Application No. 2015-501720; 8 pages.
Office Action dated Oct. 10, 2017 for U.S. Appl. No. 15/447,320; 7 pages.
Japanese Office Action with English translation dated Oct. 6, 2017 for Japanese Application No. 2016-510681; 18 pages.
Response to Office Action dated Nov. 21, 2017 for U.S. Appl. No. 13/424,618; 14 pages.
Japanese Notice of Allowance with English allowed claims dated Nov. 27, 2017 for Japanese Application No. 2016-084148; 10 pages.
Japanese Petition in Response to Pretrial Report with Letter to Yuasa and Hara and English claims dated Nov. 17, 2017 for Japanese Application No. 2015-501720; 15 pages.
Examination Report dated Dec. 11, 2017 for European Application No. 12809921.5; 7 pages.
Japanese Response to Office Action with English translation dated Dec. 27, 2017 for Japanese Application No. 2016-510681; 15 pages.
Office Action dated Dec. 15, 2017 for U.S. Appl. No. 13/424,618; 18 pages.
Response to Office Action dated Jan. 8, 2018 for U.S. Appl. No. 15/447,320; 6 Pages.
Chinese Notice of Allowance (with English Translation and Allowed Claims in English) dated Apr. 4, 2018 for Chinese Application No. CN 201380014780.9; 10 Pages.
Japanese Notice of Allowance (with Allowed Claims in English) dated Apr. 6, 2018 for Japanese Application No. JP 2015-501720; 18 Pages.
Japanese Notice of Allowance (with Allowed Claims in English) dated Apr. 3, 2018 for Japanese Application No. JP 2016-510681; 7 Pages.
Response to Office Action with Request for Continued Examination dated May 31, 2018 for U.S. Appl. No. 13/424,618; 17 pages.
Office Action dated Jun. 12, 2018 for U.S. Appl. No. 15/447,320; 11 pages.
Response to Office Action dated Aug. 9, 2017 for U.S. Appl. No. 13/838,131; 13 pages.
Response (with Amended Claims) to European Examination Report dated Dec. 11, 2017 for European Application No. 12809921.5; Response filed Jun. 21, 2018; 9 Pages.
Chinese Notice of Allowance with English translation dated Sep. 6, 2017 for Chinese Application No. 201380026117.0; 8 pages.
Notice of Allowance dated Oct. 3, 2018, for U.S. Appl. No. 13/424,618; 10 Pages.
Office Action dated Jul. 31, 2018 for Korean Application No. 10-2014-7028660 with English Translations; 28 Pages.
Korean Office Action with English translation dated Oct. 29, 2018 for Korean Application No. 10-2014-7028350; 34 pages.
Response to Korean Office Action dated Sep. 28, 2018 with English bibliographic page for Korean Application No. 10-2014-7028660; 72 pages.
European Examination Report dated Aug. 23, 2018 for European Application No. 13712040.8; 8 pages.
Response to Office Action dated Sep. 26, 2018 for U.S. Appl. No. 15/447,320; 9 pages.

* cited by examiner

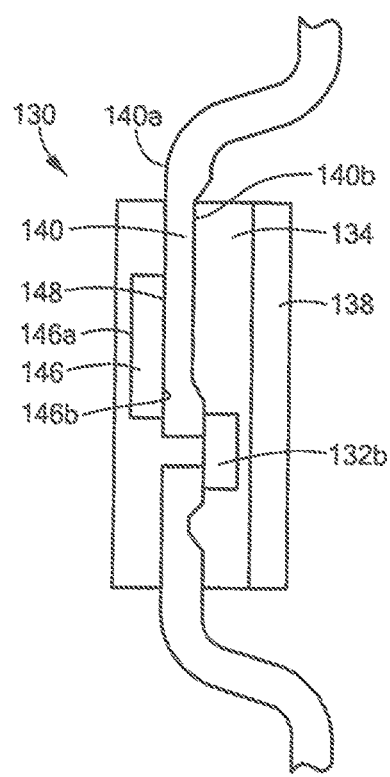
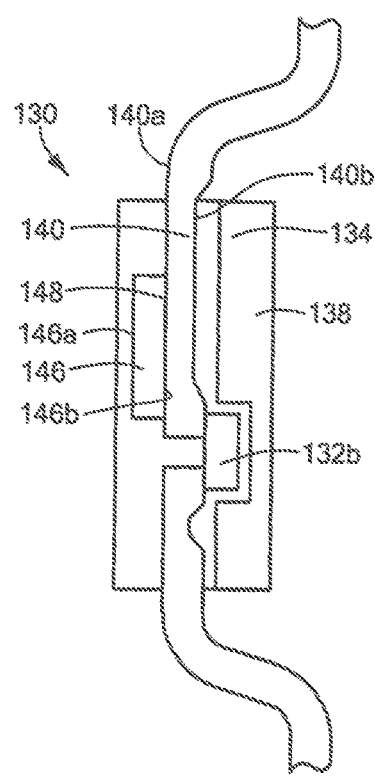
FIG. 5A                    FIG. 5B

MAGNETIC FIELD SENSOR INTEGRATED CIRCUIT WITH AN ELECTROMAGNETIC SUPPRESSOR

CROSS REFERENCE TO RELATED APPLICATIONS

This application is a Divisional application and claims the benefit of U.S. patent application Ser. No. 13/748,999, filed on Jan. 24, 2013, which is a Continuation-in-Part and claims the benefit of U.S. patent application Ser. No. 13/424,618, filed on Mar. 20, 2012, all of which are incorporated herein by reference in their entirety.

STATEMENT REGARDING FEDERALLY SPONSORED RESEARCH

Not Applicable.

FIELD OF THE INVENTION

This invention relates generally to magnetic field sensors and, more particularly, to integrated circuit magnetic field sensors having an integral ferromagnetic material.

BACKGROUND OF THE INVENTION

Magnetic field sensors including a magnetic field sensing element, or transducer, such as a Hall Effect element or a magnetoresistive element, are used in a variety of applications to detect aspects of movement of a ferromagnetic article, or target, such as proximity, speed, and direction. Illustrative applications include, but are not limited to, a magnetic switch or "proximity detector" that senses the proximity of a ferromagnetic article, a proximity detector that senses passing ferromagnetic articles (for example, magnetic domains of a ring magnet or gear teeth), a magnetic field sensor that senses a magnetic field density of a magnetic field, and a current sensor that senses a magnetic field generated by a current flowing in a current conductor. Magnetic field sensors are widely used in automobile control systems, for example, to detect ignition timing from a position of an engine crankshaft and/or camshaft, and to detect a position and/or rotation of an automobile wheel for anti-lock braking systems.

In applications in which the ferromagnetic target is magnetic, a magnetically permeable concentrator or magnetic flux guide is sometimes used to focus the magnetic field generated by the target on the magnetic field transducer, thus increasing the sensitivity of the sensor, allowing the use of a smaller magnetic target, and/or allowing the magnetic target to be sensed from a larger distance (i.e., a larger airgap). In other applications, in which the ferromagnetic target is not magnetic, a permanent magnet, sometimes referred to as a back bias magnet, may be used to generate the magnetic field that is then altered by movement of the target.

In some applications it is desirable to provide a back bias magnet with two magnetic poles on the magnet surface adjacent to the magnetic field transducer. For example, as described in a U.S. Pat. No. 5,781,005 entitled "Hall-Effect Ferromagnetic-Article-Proximity Sensor," which is assigned to the Assignee of the subject application, the near presence of opposite poles serves to short out the lines of flux when no ferromagnetic article is present, thereby presenting a significant and easily recognizable difference between an article present (e.g., gear tooth present) condition and an article absent (e.g., gear valley present) condition and maintaining a low magnetic flux density baseline regardless of airgap. Because of the easily recognizable difference in the magnetic field signal, these types of arrangements are advantageous for use in sensors in which it is necessary to detect the presence/absence of a magnetic article, such sensors sometimes being referred to as True Power On Sensors, or TPOS, sensors.

Generally, back bias magnets and concentrators are held in place relative to the magnetic field sensing element by mechanical means, such as an adhesive as shown in a U.S. Pat. No. 6,265,865 entitled "Single Unitary Plastic Package for a Magnetic Field Sensing Device," which is assigned to the Assignee of the subject application. Such mechanical positioning can lead to performance variations, such as sensitivity variations, from device to device due to position tolerances. Thus, it is advantageous to manufacture the sensor so that the sensor and the back bias magnet or concentrator are integrally formed, thereby eliminating position tolerances. A magnetic field sensor of this type is described in a U.S. Patent Application Publication No. 2010/0141249 entitled "Magnetic Field Sensors and Methods for Fabricating the Magnetic Field Sensors," which is also assigned to the Assignee of the subject application and in which a concentrator or magnet may be formed by a liquid encapsulant or a combination of a liquid encapsulant and permanent magnet in a cavity on the side of the sensor opposite the target.

While the use of a back bias magnet is advantageous in certain applications, the hard magnetic material used to form the magnet is relatively expensive and represents a significant part of the overall cost of the sensor.

There are many package types and fabrication techniques in use for providing integrated circuit magnetic field sensors. For example, the semiconductor die in which the magnetic field sensing element is formed may be attached to a lead frame by various techniques, such as with an adhesive tape or epoxy, and may be electrically coupled to the lead frame by various techniques, such as with solder bumps or wire bonding. Also, the lead frame may take various forms and the semiconductor die may be attached to the lead frame in an orientation with the active semiconductor surface (i.e., the surface in which the magnetic field sensing element is formed) being adjacent to the lead frame in a so called "flip-chip" arrangement, with the active semiconductor surface opposite the lead frame surface in a so called "die up" arrangement, or with the semiconductor die positioned below the lead frame in a so called "Lead on Chip" arrangement.

Molding is often used in fabricating integrated circuit magnetic field sensors to provide the protective and electrically insulative "overmold" to the semiconductor die. Transfer molding has also been used to form two different molded portions for various reasons. For example, in a U.S. Pat. No. 7,816,772 entitled "Methods and Apparatus for Multi-Stage Molding of Integrated Circuit Package" which is assigned to the Assignee of the subject application, a first molded structure is formed over the semiconductor die to protect wire bonds and the device is overmolded with a second molded structure formed over the first molded structure. In a U.S. Patent Application Publication No. 2009/0140725 entitled "Integrated Circuit Including Sensor having Injection Molded Magnetic Material," an injection molded magnetic material encloses at least a portion of a magnetic field sensor.

Molding, while providing a cost effective fabrication technique, can present challenges, such as removal of the device from the mold in a manner that does not subject the device to deleterious stresses.

SUMMARY OF THE INVENTION

A magnetic field sensor includes a lead frame having a first surface and a second opposing surface, a semiconductor die having a first surface in which a magnetic field sensing element is disposed and a second opposing surface attached to the first surface of the lead frame, a non-conductive mold material enclosing the die and at least a portion of the lead frame, and a ferromagnetic mold material secured to a portion of the non-conductive mold material, wherein the ferromagnetic mold material comprises a non-contiguous central region extending from a first end proximate to the lead frame to a second end distal from the lead frame, wherein the central region has an inner surface with a taper established by at least two differently sloped portions.

The ferromagnetic mold material is secured to a portion of the non-conductive mold material and a second portion of the lead frame that extends beyond the non-conductive mold material and may comprise a hard ferromagnetic material. A third mold material may be disposed in and secured to the central region of the ferromagnetic mold material. In some embodiments, a separately formed element, as may be comprised of a hard ferromagnetic material, a soft ferromagnetic material, or a non-ferromagnetic material, is disposed in and secured to the central region of the ferromagnetic mold material.

Also described is a magnetic field sensor including a lead frame having a first surface and a second opposing surface, a semiconductor die having a first surface in which a magnetic field sensing element is disposed and a second opposing surface attached to the first surface of the lead frame, a non-conductive mold material enclosing the die and at least a portion of the lead frame, a ferromagnetic mold material secured to a portion of the non-conductive mold material, wherein the ferromagnetic mold material comprises a non-contiguous central region extending from a first end proximate to the lead frame to a second end distal from the lead frame, and a separately formed element disposed in and secured to the central region of the ferromagnetic mold material. The separately formed element may be comprised of a hard ferromagnetic material, a soft ferromagnetic material, or a non-ferromagnetic material. In some embodiments, the lead frame may include at least one slot.

According to a further aspect, a magnetic field sensor includes a lead frame having a first surface, a second opposing surface, and at least one slot, a semiconductor die having a first surface in which a magnetic field sensing element is disposed and a second opposing surface attached to the first surface of the lead frame, a non-conductive mold material enclosing the die and at least a portion of the lead frame, and a ferromagnetic mold material secured to a portion of the non-conductive mold material. In some embodiments, the ferromagnetic mold material comprises a hard ferromagnetic material to form a bias magnet.

Also described is a magnetic field sensor including a lead frame having a first surface, a second opposing surface, and a plurality of leads, a semiconductor die having a first surface in which a magnetic field sensing element is disposed and a second opposing surface attached to the first surface of the lead frame, a non-conductive mold material enclosing the die and at least a portion of the lead frame, and a molded ferromagnetic suppression device spaced from the non-conductive mold material and enclosing a portion of at least one of the plurality of leads. A ferromagnetic mold material may be secured to a portion of the non-conductive mold material. The molded ferromagnetic suppression device may comprise comprises a hard ferromagnetic material or a soft ferromagnetic material.

In some embodiments, the molded ferromagnetic suppression device includes a first molded element enclosing the portion of a lead and a second molded element enclosing at least a portion of the first molded element. The first molded element may comprise a non-conductive mold material and the second molded element may comprise a ferromagnetic material. According to a further aspect, the sensor may include at least one of a passive component or a ferromagnetic bead coupled to a lead and enclosed by the molded ferromagnetic suppression device.

Also described is a magnetic field sensor including a lead frame having a first surface, a second opposing surface, and a plurality of leads, a semiconductor die having a first surface in which a magnetic field sensing element is disposed and a second opposing surface, a non-conductive mold material enclosing the die and at least a portion of the lead frame, a ferromagnetic mold material secured to a portion of the non-conductive mold material, and at least one capacitor coupled to at least two of the plurality of leads and spaced from the non-conductive mold material. Additional features may include a molded ferromagnetic suppression device enclosing the capacitor, at least one slot in the lead frame, and/or at least one ferromagnetic bead coupled to a lead.

According to a further aspect, a magnetic field sensor includes a lead frame having a first surface, a second opposing surface, and a plurality of leads, a semiconductor die having a first surface in which a magnetic field sensing element is disposed and a second opposing surface, a non-conductive mold material enclosing the die and at least a portion of the lead frame, a ferromagnetic mold material secured to a portion of the non-conductive mold material, and at least one ferromagnetic bead coupled to at least one of the plurality of leads. In some embodiments, the ferromagnetic bead is enclosed by the non-conductive mold material. A molded ferromagnetic suppression device may be provided spaced from the non-conductive mold material and may enclose the ferromagnetic bead.

Also described is a magnetic field sensor including a lead frame having a first surface and a second opposing surface, a semiconductor die having a first surface in which a magnetic field sensing element is disposed and a second opposing surface attached to the first surface of the lead frame, a non-conductive mold material enclosing the die and at least a portion of the lead frame, and a conductive coil secured to the non-conductive mold material. In some embodiments, the non-conductive mold material encloses the coil. Alternatively, a second mold material may be secured to a portion of the non-conductive mold material and enclose the coil. The non-conductive mold material may include a protrusion and the coil may be positioned concentrically with respect to the protrusion.

Also described is a magnetic field sensor including a lead frame having a first surface, a second opposing surface, and at least one lead comprising a first lead portion having an end and a second lead portion having an end spaced from and proximate to the end of the first lead portion, a semiconductor die having a first surface in which a magnetic field sensing element is disposed and a second opposing surface attached to the first surface of the lead frame, a non-conductive mold material enclosing the die and at least a portion of the lead frame, and a passive component coupled between the end of the first lead portion and the end of the second lead portion. In some embodiments, the passive component is a resistor.

BRIEF DESCRIPTION OF THE DRAWINGS

The foregoing features of the invention, as well as the invention itself may be more fully understood from the following detailed description of the drawings, in which:

FIG. 5A is a cross-sectional view of the sensor of FIG. 5 taken along line A-A of FIG. 5;

FIG. 5B is an alternative cross-sectional view of the sensor of FIG. 5 taken along line A-A of FIG. 5;

FIG. 23A is a plan view of the magnetic field sensor of FIG. 23;

FIG. 23B is a plan view of the magnetic field sensor of FIG. 23 showing an alternative arrangement for the passive components relative to the leads;

FIG. 26A is a plan view the magnetic field sensor of FIG. 26;

DETAILED DESCRIPTION OF THE INVENTION

Figure 1:
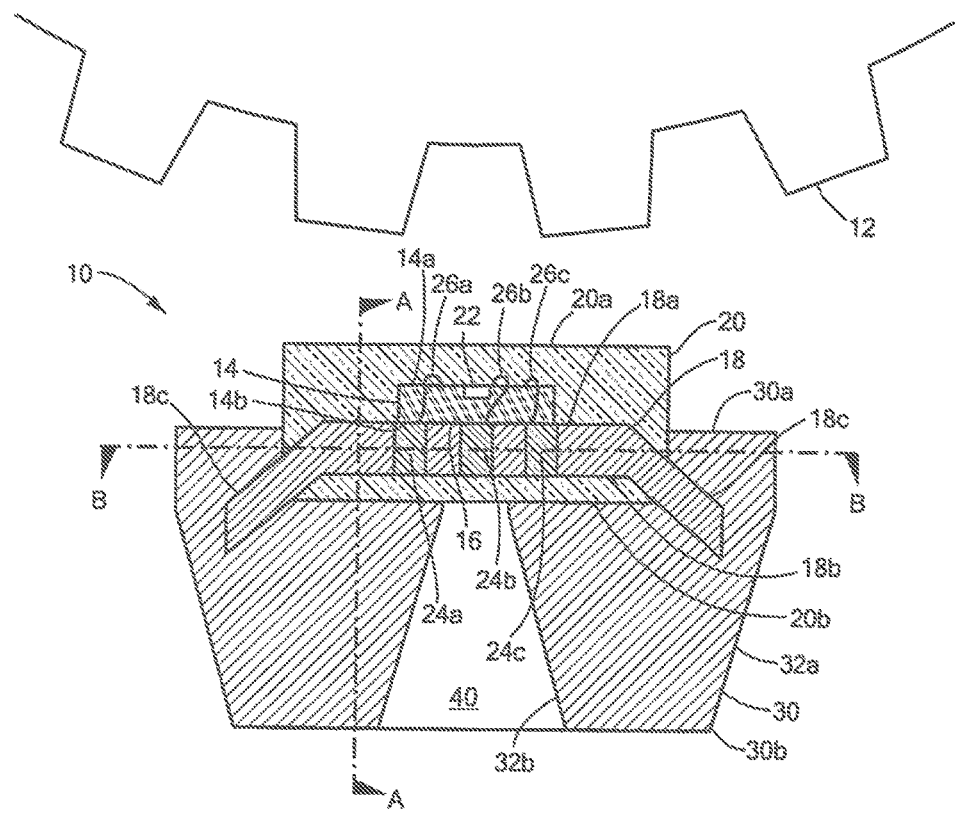
FIG. 1 is a cross-sectional view of a magnetic field sensor having a non-conductive mold material and a ferromagnetic mold material and a securing mechanism between the non-conductive and ferromagnetic mold materials.
Figure 1A:
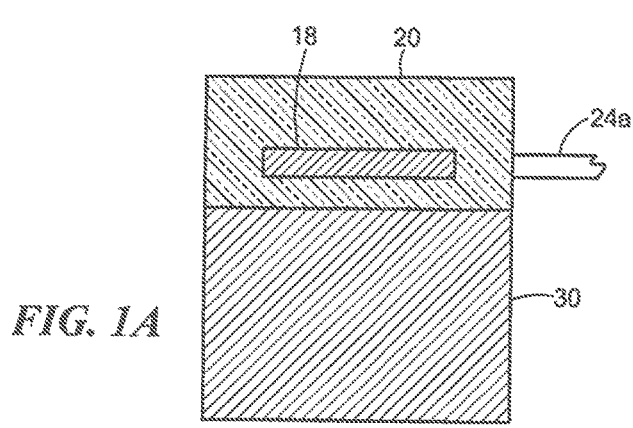
FIG. 1A is a cross-sectional view of the sensor of FIG. 1 taken along line A-A of FIG. 1.
Figure 1B:
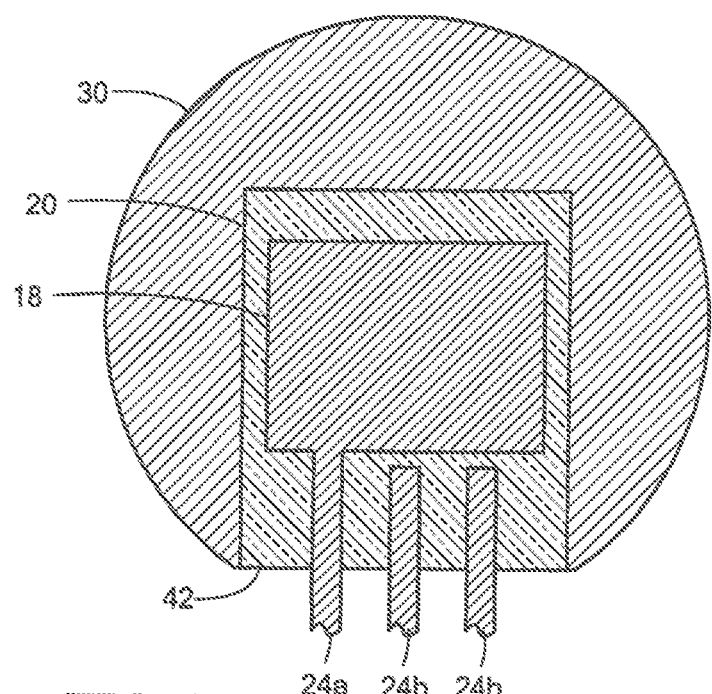
FIG. 1B is a cross-sectional view of the sensor of FIG. 1 taken along line B-B of FIG. 1.

Referring to the cross-sectional view of FIG. 1, and also to the cross-sectional views of FIGS. 1A and 1B, a magnetic field sensor 10 includes a semiconductor die 14 having a first, active surface 14a in which a magnetic field sensing element or transducer 22 is formed and a second, opposing surface 14b attached to a die attach area 16 on a first surface 18a of a lead frame 18, a non-conductive mold material 20 enclosing the die and at least a portion of the lead frame, and a ferromagnetic mold material 30 secured to the non-conductive mold material. The ferromagnetic mold material 30 comprises a ferromagnetic material and is tapered from a first end 30a proximate to the lead frame 18 to a second end 30b distal from the lead frame. The active die surface 14a is opposite the die surface 14b which is attached to the die attach area 16 and thus, this configuration may be referred to as a "die up" arrangement.

The magnetic field sensing element 22 in this and other embodiments can be, but is not limited to, a Hall effect element, a magnetoresistance element, or a magnetotransistor. As is known, there are different types of Hall effect elements, for example, a planar Hall element, a vertical Hall element, and a circular vertical Hall element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The sensing element 22 may include a single element or, alternatively, may include two or more elements arranged in various configurations, e.g., a half bridge or full (Wheatstone) bridge. The sensing element 22 may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb). In some embodiments, it may be desirable to use two or more substrates, one for the magnetic field sensing element(s) and another, such as a Si substrate, for associated processing circuitry. Illustrative multiple substrate arrangements are described in U.S. Pat. No. 7,768,083 entitled "Arrangements for an Integrated Sensor," which is assigned to the Assignee of the subject application.

It will be appreciated by those of ordinary skill in the art that while the active surface 14a of the semiconductor die 14 is described herein as the surface "in" which the magnetic field sensing element is disposed or formed as is the case with certain types of magnetic field elements (e.g., Hall plate), the element may be disposed "over" or "on" the active semiconductor surface (e.g. magnetoresistance elements). For simplicity of explanation however, while the embodiments described herein may utilize any suitable type of magnetic field sensing elements, such elements will be described generally herein as being formed or disposed "in" the active semiconductor surface.

In use, the magnetic field sensor 10 like the other sensor embodiments described herein may be positioned in proximity to a movable magnetically permeable ferromagnetic article, or target, such as the illustrated gear 12, such that the magnetic field transducer 22 is adjacent to the article 12 and is thereby exposed to a magnetic field altered by movement of the article. The magnetic field transducer 22 generates a magnetic field signal proportional to the magnetic field.

While the magnetic field sensor 10 in FIG. 1 is oriented relative to the target 12 such that the transducer 22 is closer to the target than the ferromagnetic mold material 30, it will be appreciated that it may be desirable in certain applications to rotate the sensor 10 by 180° so that the ferromagnetic mold material is closer to the target than the transducer. Also, the sensor 10 may be rotated by 90° so that the major face of the transducer is orthogonal to the target, thereby achieving a different type of magnetically sensitive sensor, as may be desirable when the transducer is a magnetoresistance element for example.

The ferromagnetic article 12 may be comprised of a hard ferromagnetic, or simply hard magnetic material (i.e., a permanent magnet such as a segmented ring magnet), a soft ferromagnetic material, or even an electromagnet and embodiments described herein may be used in conjunction with any such article arrangement.

In embodiments in which the article 12 is comprised of a soft ferromagnetic material, the ferromagnetic mold material 30 is comprised of a hard ferromagnetic material to form a bias magnet; whereas in embodiments in which the article 12 is comprised of a hard ferromagnetic material, the ferromagnetic mold material 30 may be soft ferromagnetic material to form a concentrator, or a hard magnetic material where a bias field is desired (for example, in the case of a magnetoresistance element that is biased with a hard magnetic material or permanent magnet). In embodiments in which the ferromagnetic mold material 30 comprises a hard ferromagnetic material to form a bias magnet and in which the sensor 10 is oriented relative to the target such that transducer 22 is closer to the target than the ferromagnetic mold material 30 as shown, the bias magnet may be referred to as a back bias magnet.

The magnetic field sensor 10 generally includes additional circuitry formed in the active surface 14a of the die 14 for processing the magnetic field signal provided by the transducer 22. The lead frame 18 includes leads 24a-24c for coupling the circuitry to system components (not shown), such as a power source or microcontroller. Electrical connection between the leads 24a-24c and the semiconductor die 14 can be provided with wire bonds 26a-26c, respectively as shown. While the sensor 10 is shown to include three leads 24a-24c, it will be appreciated by those of ordinary skill in the art that various numbers of leads are possible. Other techniques for electrically coupling the lead frame leads to the sensor components include solder bumps or balls (FIG. 6) or pillar bumps.

The integrated circuit sensor 10 may be provided in the form of a two to six pin Single In-Line (SIP) package, or some other number of pins as appropriate. The die attach area 16 on the first surface 18a of a lead frame 18 is generally a dedicated area of the conductive lead frame to accept the semiconductor die 14. The die attach area 16 is sometimes referred to as a die attach paddle or a die attach pad and in some embodiments the die attach pad may be a silver plated or a NiPdAu area for example. Alternatively, as described in a co-pending U.S. patent application Ser. No. 13/350,970 entitled "Methods and Apparatus for a Magnetic Sensor having a Non-conductive Die Paddle" which was filed on Jan. 16, 2012 and assigned to the Assignee of the subject application, it may be desirable to form the die attach area with a non-conductive material, particularly in applications where Eddy currents can occur. Conventional techniques for securing the die 14 to the die attach area 16 include the use of adhesives, such as epoxy or an adhesive tape. It will be appreciated by those of ordinary skill in the art that the die attach area may or may not be a contiguous area. For example, in the embodiment of FIG. 17, the die attach area spans a plurality of leads.

The non-conductive mold material 20 is comprised of a non-conductive material so as to electrically isolate and mechanically protect the die 14 and the enclosed portion of the lead frame 18. Suitable materials for the non-conductive mold material 20 include thermoset and thermoplastic mold compounds and other commercially available IC mold compounds. It will be appreciated that the non-conductive mold material 20 can contain a ferromagnetic material, such as in the form of ferromagnetic particles, as long as such material is non-conductive.

The non-conductive mold material 20 is applied to the lead frame/die subassembly, such as in a first molding step (FIG. 8), to enclose the die 14 and a portion of the lead frame 18. The non-conductive mold material 20 has a first surface 20a and a second, opposing surface 20b. The shape and dimensions of the non-conductive mold material are selected to suit a particular IC package.

In some embodiments as noted above, the ferromagnetic mold material 30 is comprised of a hard or permanent magnetic material to form a bias magnet. As will be apparent to those of ordinary skill in the art, various materials are suitable for providing the ferromagnetic mold material 30 depending on the operating temperature range and final package size. In some embodiments, it may be desirable for the ferromagnetic mold material to have a coercivity larger than its remanence.

Illustrative hard magnetic materials for the ferromagnetic mold material include, but are not limited to hard magnetic ferrites, SmCo alloys, NdFeB alloy materials, or Plastiform® materials of Arnold Magnetic Technologies Corp., or other plastic compounds with hard magnetic particles, for example a thermoset polymer such as polyphenylene sulfide material (PPS) or nylon material containing SmCo, NdFeB, or hard ferromagnetic ferrite magnetic particles; or a thermoset polymer such as SUMIKON® EME of Sumitomo Bakelite Co., Ltd or similar type of thermoset mold material containing hard magnetic particles. In some embodiments it may be desirable to align the hard ferromagnetic particles during molding to form a more isotropic or directional permanent magnetic material by molding in the presence of a magnetic field; whereas, in other embodiments, a sufficient magnet may result without an alignment step during molding for isotropic materials. It will be appreciated that a NdFeB or a SmCo alloy may contain other elements to improve temperature performance, magnetic coercivity, or other magnetic properties useful to a magnetic design.

In other embodiments, the ferromagnetic mold material 30 is comprised of a soft ferromagnetic material to form a concentrator. As will be apparent to those of ordinary skill in the art, various materials are suitable for providing the ferromagnetic mold material 30 in the form of a soft ferromagnetic material. In some embodiments, it may be desirable for the soft ferromagnetic mold material to have a relatively low coercivity and high permeability. Suitable soft ferromagnetic materials include, but are not limited to permalloy, NiCo alloys, NiFe alloys, steel, nickel, and soft magnetic ferrites.

Figure 8:
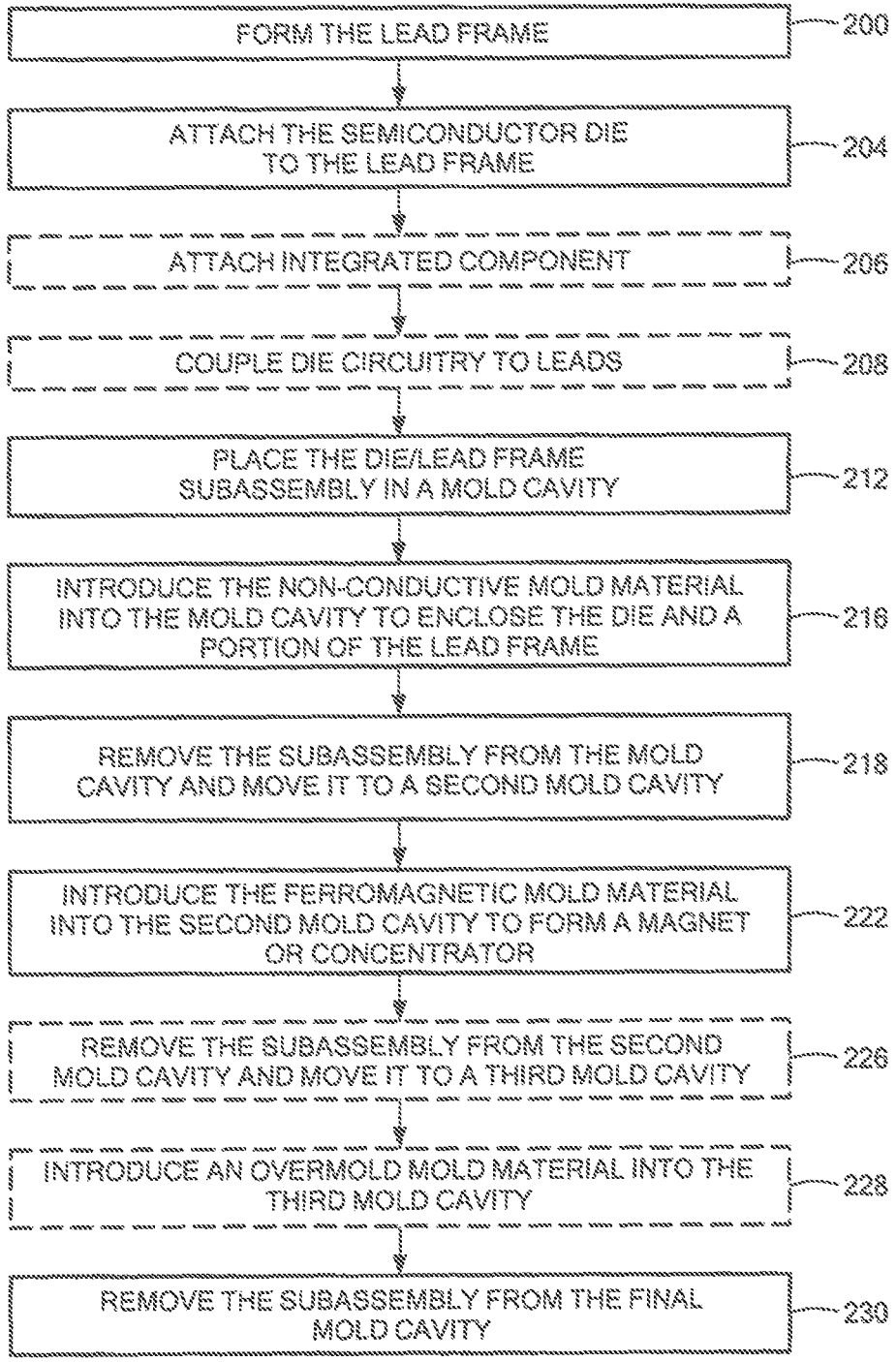
FIG. 8 is a flow diagram illustrating an exemplary process for fabricating the magnetic field sensors of FIGS. 1-7.

The ferromagnetic mold material 30 is secured to the non-conductive mold material 20, such as in a second molding step (FIG. 8). The ferromagnetic mold material contacts the second surface 20b of the non-conductive mold material and also a portion of the sides of the non-conductive mold material between the first and second surfaces 20a, 20b, as shown. It will be appreciated that while a molding process is described in FIGS. 8 and 8A as being the process by which the ferromagnetic mold material 30 is secured to the non-conductive mold material 20, the ferromagnetic mold material can be (either additionally or alternatively) secured to the non-conductive mold material 20 using an adhesive, such as a thermoset adhesive (e.g., a two part epoxy).

In some embodiments, a portion of the non-conductive mold material 20 that contacts the ferromagnetic mold material 30 and/or the portion of the ferromagnetic mold material that contacts the non-conductive mold material has a securing mechanism in order to improve the adhesion between the two materials and to prevent or reduce lateral slippage or shear between the materials. As one example, the lead frame 18 has extensions 18c which extend beyond the non-conductive mold material and are enclosed by the ferromagnetic mold material, as shown. Such lead frame extensions additionally enhance the adhesion of the ferromagnetic mold material to the lead frame itself. In such embodiments utilizing lead frame portions as a securing mechanism such that the ferromagnetic mold material contacts such lead frame portions, it will be appreciated that the ferromagnetic mold material should be non-conductive or have a sufficiently low conductivity to prevent the leads from electrically shorting resulting in the device not operating as intended. Alternative forms of securing mechanisms are shown in other embodiments.

As is shown in FIG. 1B, a portion of the leads 24a-24c is enclosed by the non-conductive mold material 20. The non-conductive mold material surrounds the leads out to the edge of the package in order to isolate the ferromagnetic mold material 30 from the leads (since the ferromagnetic mold material may be electrically conductive).

Figure 1C:
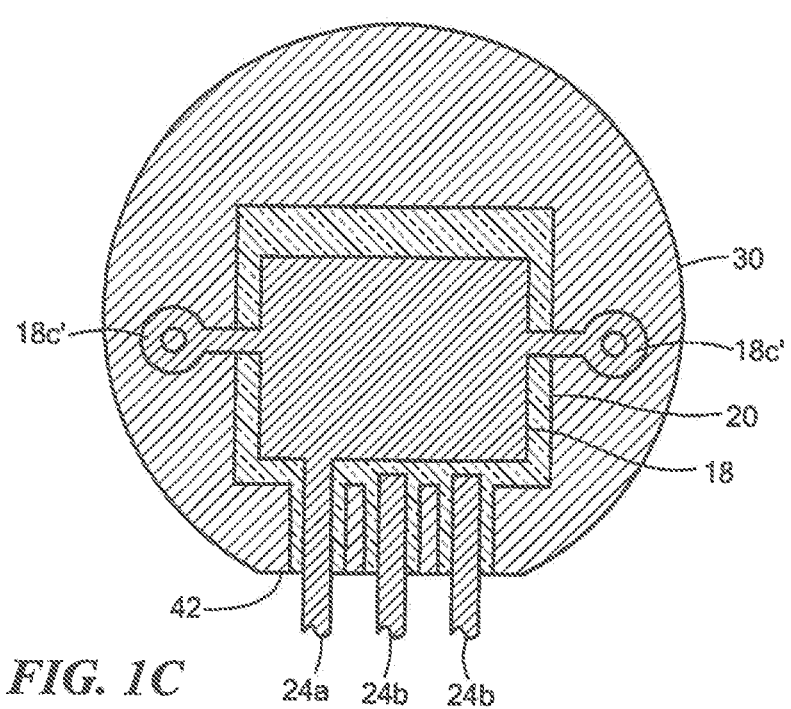
FIG. 1C is an alternative cross-sectional view of the sensor of FIG. 1 taken along line B-B of FIG. 1 and illustrating an alternative securing mechanism.

According to the alternative cross-sectional view of FIG. 1C, portions of the non-conductive mold material 20 adjacent to the leads 24a-24c may be "cut out" around the leads so as to follow the contours of the leads, as shown. This arrangement may be desirable in some applications for magnetic performance reasons, to thereby increase the amount of the hard ferromagnetic material of the ferromagnetic mold material in proximity to the transducer 22. Also shown in FIG. 1C is an alternative securing mechanism in the form of lead frame tabs 18c'. The tabs 18c' may be planar and may have an eye as shown. With this arrangement, the ferromagnetic mold material 30 flows through the eye of the tabs and around the tabs to improve the adhesion of the ferromagnetic mold material to the lead frame and non-conductive mold material.

It will be appreciated by those of ordinary skill in the art, that various types of processes may be used to form the mold materials including but not limited to molding, such as compression molding, injection molding, and transfer molding, and potting. Furthermore, combinations of the various techniques for forming the mold materials are possible.

A mold cavity used to define the ferromagnetic mold material 30 may include a mandrel so that the ferromagnetic mold material forms a ring-shaped structure having a central aperture 40, here extending from the second surface 20b of the non-conductive mold material to a second end 30b of the ferromagnetic mold material. The mold material 30 may form a conventional O-shaped ring structure or a D-shaped structure. Alternatively, the ferromagnetic mold material 30 may form only a partial ring-like structure, as may be described as a "C" or "U" shaped structure. More generally, the ferromagnetic mold material 30 comprises a non-contiguous central region such that the central region is not formed integrally with its outer region. Such central region may be an open area, such as in the case of aperture 40 in FIG. 1, or may contain a ferromagnetic material such as in the embodiment of FIG. 2 for example.

The ferromagnetic mold material 30 is tapered from its first end 30*a* (or a location close to its first end) to its second end 30*b* as is apparent from the side view of FIG. 1. In particular, the ferromagnetic mold material has a first taper to its outer circumferential surface 32*a* and a second taper to its inner central aperture surface 32*b*. The purpose of the taper is to facilitate removal of the sensor 10 from the mold cavity. The angle of the taper of the surfaces 32*a*, 32*b* may be the same or similar to each other and generally, the angle of the taper of the surfaces 32*a*, 32*b* is less than approximately 15 to 20 degrees. In some embodiments, the angle of taper is on the order of 2-7 degrees.

As can be seen from the views of FIGS. 1B and 1C, the packaged magnetic field sensor 10 may have a truncated edge 42 for ease of assembly, for example to facilitate bending the leads and to help mechanically locate the sensor 10 relative to other structures, such as a circuit board or housing which holds the sensor, in use. In this case, the ferromagnetic mold material 30 may be more accurately described as a D-ring structure or magnet.

Figure 2:
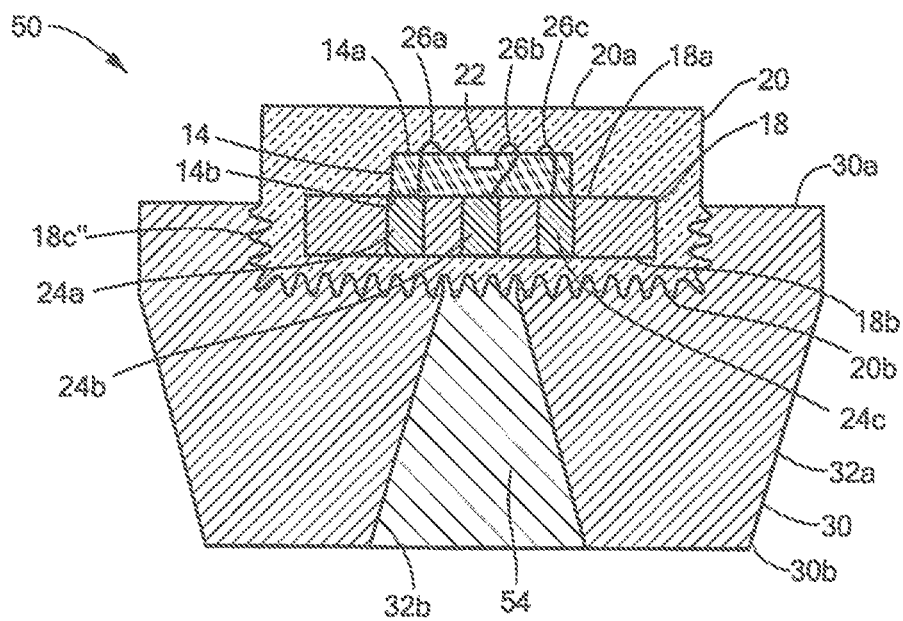
FIG. 2 is a cross-sectional view of the magnetic field sensor of FIG. 1 further having a third mold material and illustrating a further alternative securing mechanism.

Referring also to FIG. 2, an alternative magnetic field sensor 50, in which like elements to FIG. 1 are labeled with like reference characters, includes semiconductor die 14, a magnetic field sensing element 22, lead frame 18, non-conductive mold material 20, and ferromagnetic mold material 30. The sensor 50 differs from the sensor 10 (FIG. 1) in the addition of a third mold material 54 in the central region of the ferromagnetic mold material 30.

The third mold material 54 may be formed by a third molding step (FIG. 8) or other suitable fabrication technique so as to be secured to the ferromagnetic mold material 30. The third mold material 54 may be comprised of a hard ferromagnetic material, a soft ferromagnetic material, or a non-ferromagnetic mold compound.

In one embodiment, the ferromagnetic mold material 30 is comprised of a hard ferromagnetic material and the third mold material 54 is comprised of a soft ferromagnetic material and provides a concentrator magnetized such that two poles are adjacent to the second surface 20*b* of the non-conductive mold material. As described in the above-referenced U.S. Pat. No. 5,781,005, the near presence of opposite poles with respect to the magnetic field transducer 22 serves to short out the lines of flux when no ferromagnetic target is present, thereby lowering the baseline of the flux density map regardless of airgap, and enhancing the ability to discern a target present from a target absent condition.

The sensor 50 includes an alternative securing mechanism between the first, ferromagnetic and third mold materials, here in the form or ridges 18*c*'''. Other examples of securing mechanisms include the use of an adhesive material and/or various other features designed to provide interference and/or an interlocking mechanism between the mold materials.

Figure 2A:
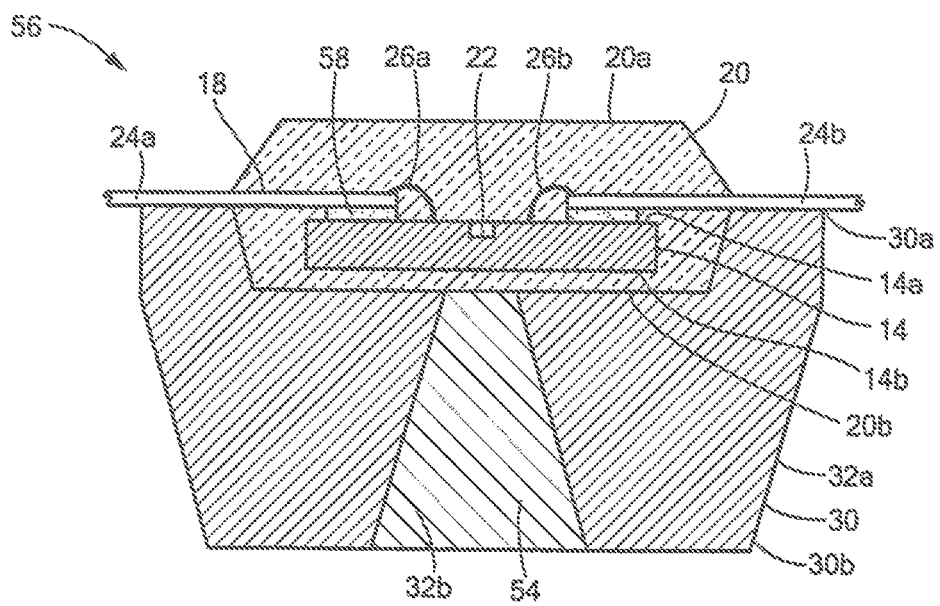
FIG. 2A is a cross-sectional view of an alternative magnetic field sensor having the third mold material and alternative securing mechanism as shown in FIG. 2.

Referring also to FIG. 2A, an alternative magnetic field sensor 56, in which like elements to FIG. 2 are labeled with like reference characters, includes semiconductor die 14, magnetic field sensing element 22, lead frame 18, non-conductive mold material 20, ferromagnetic mold material 30, and third mold material 54 in the central region of the ferromagnetic mold material. The sensor 56 differs from the sensor 50 of FIG. 2 in that here, the sensor is arranged in a lead on chip configuration with the lead frame 18 positioned above the die 14. An adhesive 58 may be used to secure the lead frame 18 to the active surface 14*a* of the die. Here leads 24*a* and 24*b* are electrically coupled to the die 14 by respective wire bonds 26*a*, 26*b*.

Figure 3:
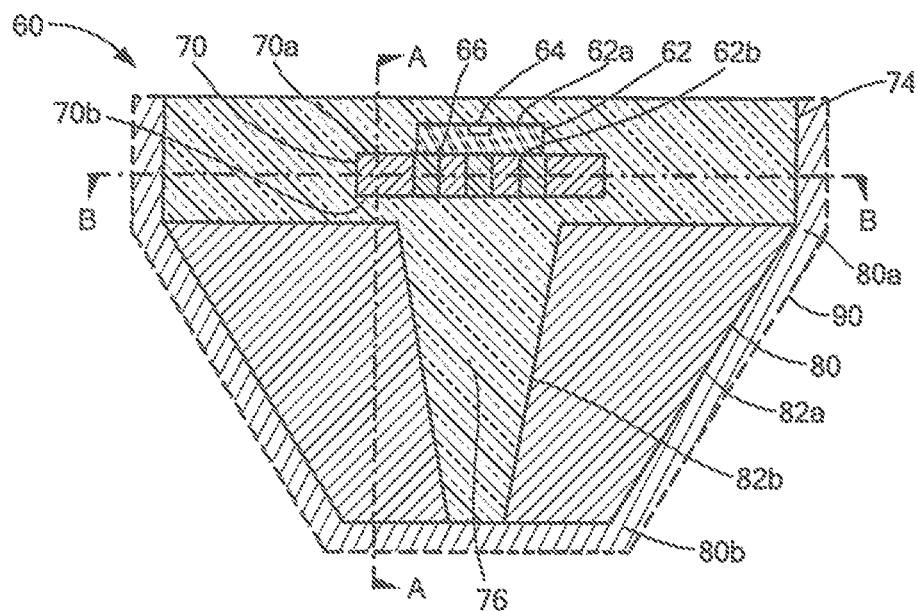
FIG. 3 is a cross-sectional view of an alternative packaged magnetic field sensor having a non-conductive mold material, a ferromagnetic mold material, and a third mold material.

Referring to FIG. 3, a further alternative magnetic field sensor 60 includes a semiconductor die 62 having a first active surface 62*a* in which a magnetic field sensing element 64 is disposed and a second, opposing surface 62*b* attached to a die attach area 66 on a first surface 70*a* of a lead frame 70, a non-conductive mold material 74 enclosing the die and at least a portion of the lead frame, and a ferromagnetic mold material 80 secured to a portion of the non-conductive mold material. A securing mechanism, such as barbs 18*c* of FIG. 1, tabs 18*c*' of FIG. 1C, ridges 18*c*'' of FIG. 2 or other suitable mechanisms, may be provided to enhance the adhesion between the non-conductive and ferromagnetic mold materials.

The ferromagnetic mold material 80 comprises a ferromagnetic material and is tapered from a first end 80*a* proximate to the lead frame 70 to a second end 80*b* distal from the lead frame. The active die surface 62*a* is opposite the die surface 62*b* which is attached to the die attach area 66 and thus, this configuration may be referred to as a "die up" arrangement.

The ferromagnetic mold material 80 is tapered along both its outer circumferential surface 82*a* and its inner surface 82*b* from its first end 80*a* to its second end 80*b*. Here again, the angle of taper of the surface 82*a* may be on the order of less than 15-20 degrees. The angle of the taper of the inner surface 82*b* may be the same as or similar to the angle of the taper of the outer surface 82*a*.

The non-conductive mold material 74 has a protrusion 76 extending away from a second surface 70*b* of the lead frame 70 as shown. The protrusion 76 prevents there being a void in the bottom surface of the sensor 60 (adjacent to the second end 80*b* of the ferromagnetic mold material), since the presence of a void may make overmolding (described below) more difficult. It will be appreciated by those of ordinary skill in the art that the protrusion may extend all or only part of the way to the second end 80*b* of the ferromagnetic mold material (see also FIG. 3A).

The ferromagnetic mold material 80 has a non-contiguous central region, here in the form of a central aperture defined by the inner circumferential surface 80*a* and resulting in a ring, or O-shaped magnet 80. Here again however, it will be appreciated that the non-contiguous central region of the ferromagnetic mold material 80 may take other shapes, so as to form a D-shaped, C-shaped, or U-shaped structure as examples.

The ferromagnetic mold material 80 may be comprised of a hard ferromagnetic material to form a bias magnet. Alternatively, it will be appreciated that the ferromagnetic mold material 80 may be comprised of a soft ferromagnetic material to thereby form a concentrator.

The sensor 60 may, optionally, include a third mold material 90 in the form of an overmold in order to protect and electrically insulate the device. The third mold material 90 may be applied during a third molding step (FIGS. 8 and 8A) or alternatively by any suitable fabrication method. The overmold 90 is considered optional because its purpose is to provide electrical insulation and, in embodiments in which the ferromagnetic mold material 80 is sufficiently electrically insulative (e.g., provides more than approximately 1 megaohm of resistance in certain applications), the overmold 90 may be eliminated. It will be appreciated that the overmold 90 may be provided for the sensors 10, 50 of FIGS. 1-2 and other embodiments.

Suitable materials for providing the overmold material 90 include, but are not limited to standard die encapsulation mold compounds such as PPS, nylon, SUMIKON® EME of Sumitomo Bakelite Co., Ltd., or Hysol® mold compounds of Henkel AG & Co. KGaA.

Figure 3A:
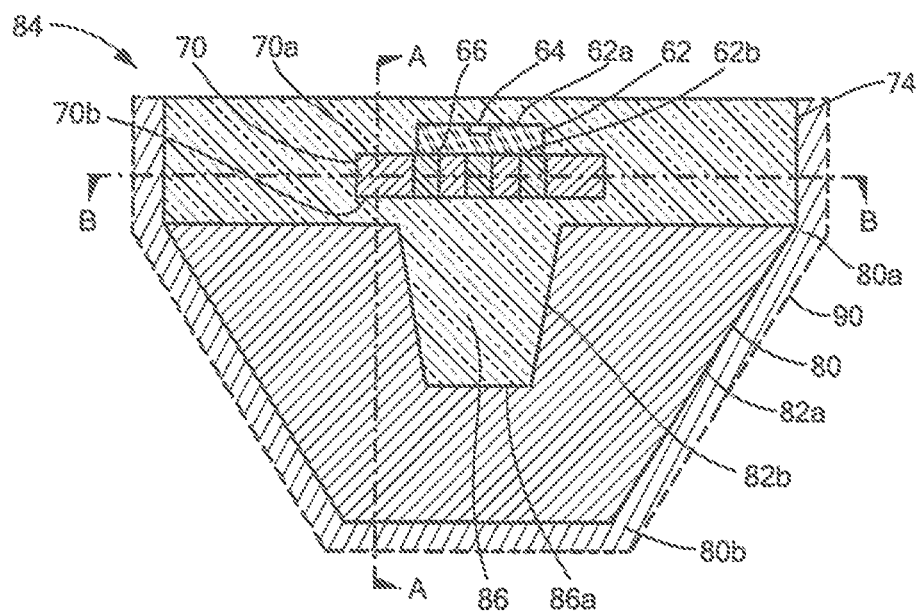
FIG. 3A is a cross-sectional view of another alternative packaged magnetic field sensor having a non-conductive mold material, and a ferromagnetic mold material, and a third mold material.

Referring also to FIG. 3A, another magnetic field sensor 84 is shown with like features having like reference characters. As will be apparent, the sensor 84 of FIG. 3A differs from the sensor 60 of FIG. 3 only in that the protrusion 86 terminates before the second end 80b of the ferromagnetic mold material 80. Thus, in the embodiment of FIG. 3A, the distal end 86a of the protrusion is covered with the ferromagnetic mold material 80, as shown.

Figure 4:
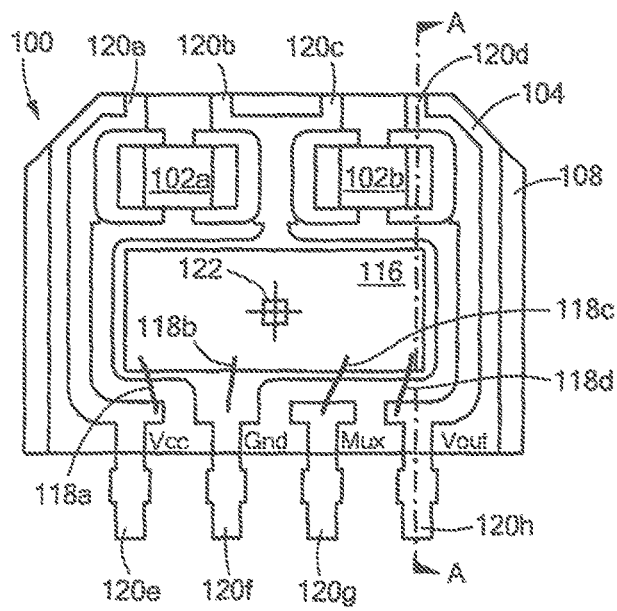
FIG. 4 is a plan view of a packaged magnetic field sensor having integrated components coupled to the lead frame, a non-conductive mold material, and a ferromagnetic mold material.
Figure 4A:
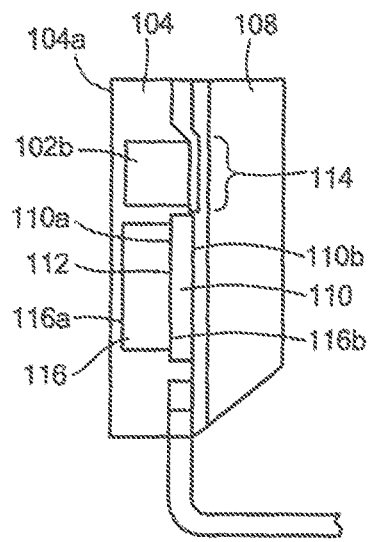
FIG. 4A is a cross-sectional view of the sensor of FIG. 4 taken along line A-A of FIG. 4.

Referring also to FIGS. 4 and 4A, a magnetic field sensor 100 provided in an alternative IC SIP package includes non-conductive and ferromagnetic mold materials 104, 108, respectively, and further includes at least one, and here two, integrated passive components such as resistors, inductors, or capacitors, and here capacitors 102a, 102b, attached to a lead frame 110. The sensor 100 includes the lead frame 110 having a die attach area 112 to which a semiconductor die 116 is secured. A magnetic field sensing element 122 is disposed in an active surface 116a of the die 116. Here again, the active die surface 116a is opposite the die surface 116b that is secured to the die attach area 112 of the lead frame 110. Thus, this arrangement may be referred to as a "die up" arrangement. As will be apparent from comparing the thickness of the ferromagnetic mold material 108 in FIG. 4A with that in FIGS. 1-3, various thicknesses are possible depending on the particular embodiment. As one example, in some embodiments in which the ferromagnetic mold material comprises a soft ferromagnetic material to provide a concentrator, it may be desirable for the ferromagnetic mold material to be somewhat thinner than when the ferromagnetic mold material comprises a hard ferromagnetic material to provide a permanent magnet. Similarly, various package shapes are possible.

A plurality of leads 120a-120h of the lead frame are electrically coupled to circuitry supported by the die, here with wire bonds 118a-118d (as shown for leads 120e-120h, respectively). The capacitors 102a, 102b may be useful to reduce EMC, ESD or address other electrical issues with the sensor 100. For example, with capacitors 102a, 102b, power to the sensor may be held longer in order to prevent a power on reset state by holding an output state in the case of a broken or damaged wire. It is also possible to have other numbers of capacitors, for example one capacitor may be provided between a power and ground or output and ground pins.

The lead frame 110 may have a cutout, depressed, or recessed region 114 (FIG. 4A) in which the capacitors 102a, 102b can be positioned below a surface 110a of the lead frame on which the die 116 is positioned. With the capacitors positioned below the lead frame surface 110a, the "active area depth" of the sensor and the entire package thickness is advantageously reduced as compared to a package having a capacitor mounted on the lead frame surface 110a. The active area depth refers to the distance from the magnetic field transducer 122 to the "top" surface 104a of the non-conductive mold material. Additional aspects of the sensor 100 including integrated capacitors are described in a U.S. Patent Application Publication No. US-2008-0013298-A1, entitled "Methods and Apparatus for Passive Attachment of Components for Integrated Circuits," which is assigned to the Assignee of the subject application.

The non-conductive mold material 104 and the ferromagnetic mold material 108 may be the same as, or similar to the non-conductive and ferromagnetic mold materials discussed above in connection with FIGS. 1-3. The non-conductive mold material 104 encloses the semiconductor die 116, at least a portion of the lead frame 110, and the capacitors 102a, 102b. The ferromagnetic mold material 108 is secured to a portion of the non-conductive mold material 104 and a securing mechanism may be provided between the non-conductive and ferromagnetic mold materials to enhance adhesion.

The ferromagnetic mold material 108 is comprised of a ferromagnetic material. Here again, the ferromagnetic material comprising the ferromagnetic mold material 108 may be a soft ferromagnetic material of the type described above, in which case the ferromagnetic mold material forms a concentrator. Alternatively, the ferromagnetic material comprising the ferromagnetic mold material 108 may be a hard ferromagnetic material of the type described above, in which case the ferromagnetic mold material forms for example a bias magnet.

Figure 5:
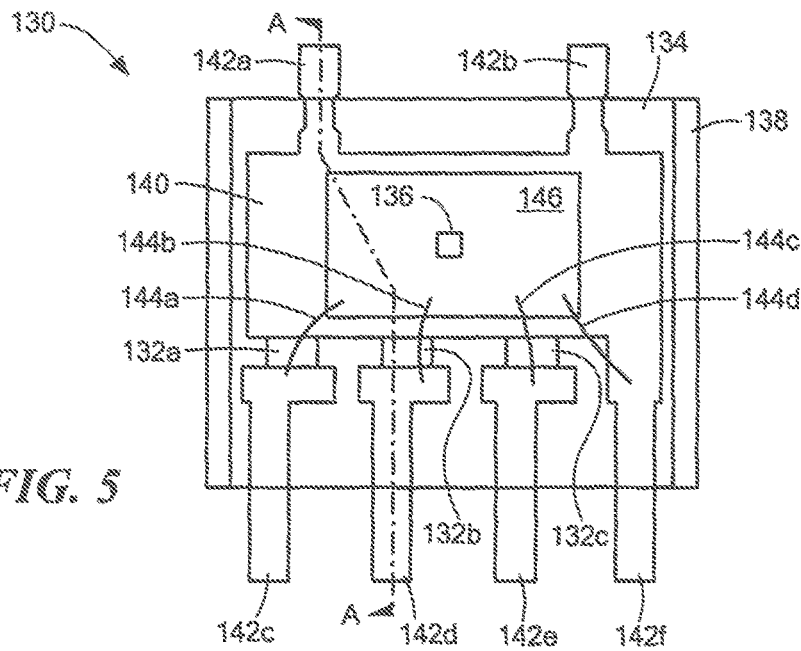
FIG. 5 is a plan view of a surface mount packaged magnetic field sensor having integrated components coupled to the opposite side of the lead frame from the die, a non-conductive mold material, and a ferromagnetic mold material.

Referring also to FIGS. 5 and 5A, a magnetic field sensor 130 having a further alternative IC package includes non-conductive and ferromagnetic mold materials 134, 138, respectively, and further includes at least one, and here three, integrated passive components, here capacitors 132a, 132b, and 132c. The sensor 130 includes a lead frame 140 having a die attach area 148 on a first surface 140a to receive a semiconductor die 146 and a second, opposing surface 140b. A magnetic sensing element 136 is disposed in an active surface 146a of the die 146. Here again, the active surface 146a of the die 146 is opposite the die surface 146b that is secured to the die attach area. Thus, this arrangement may be referred to as a "die up" arrangement.

A plurality of leads 142a-142f of the lead frame, here in the form of surface mount leads, are electrically coupled to circuitry supported by the die, here with wire bonds 144a-144d (as shown for leads 142c-142f, respectively). Capacitors 132a-132c are attached to the lead frame 140 on the second surface 140b of the lead frame opposite the surface 146a on which the die attach area 148 is located, as shown in the cross-section of FIG. 5A for capacitor 132b. With the capacitors positioned below the lead frame 140 in this fashion, the active area depth and the entire thickness of the package is advantageously reduced as compared to a package having a capacitor mounted on the "top" surface 140a of the lead frame. Additional aspects of the sensor 130 including integrated capacitors are described in a U.S. Patent Application Publication No. US-2008-0013298-A1 entitled "Methods and Apparatus for Passive Attachment of Components for Integrated Circuits," which is assigned to the Assignee of the subject application.

The non-conductive mold material 134 and the ferromagnetic mold material 138 may be the same as, or similar to the non-conductive and ferromagnetic mold materials discussed above in connection with FIGS. 1-3. The non-conductive mold material 134 encloses the semiconductor die 146, at least a portion of the lead frame 140, and the capacitor 132a-132c. The ferromagnetic mold material 138 is secured to a portion of the non-conductive mold material 134 and a securing mechanism may be provided between the non-conductive and ferromagnetic mold materials to enhance adhesion.

The ferromagnetic mold material 138 is comprised of a ferromagnetic material. Here again, the ferromagnetic material comprising the ferromagnetic mold material 138 may be a soft ferromagnetic material of the type described above, in which case the ferromagnetic mold material forms a concentrator or magnetic flux guide. Alternatively, the ferromagnetic material comprising the ferromagnetic mold material 138 may be a hard ferromagnetic material of the type described above, in which case the ferromagnetic mold material forms a bias magnet.

Referring also to FIG. 5B, an alternative cross-sectional view of the sensor 130 is shown in which the shape of the non-conductive and ferromagnetic mold materials 134, 138 is tailored to follow the contour of the surface 140b of the lead frame and the capacitor 132b. More particularly, the non-conductive mold material 134 encloses the magnetic field sensor die 146, a portion of the lead frame 140, and the capacitor 132b and has a reduced thickness adjacent to the surface 140b of the lead frame as shown. With this arrangement, the ferromagnetic mold material 138 is closer to the semiconductor die 146 than in the cross-sectional view of FIG. 5A. Close proximity between the ferromagnetic mold material 138 and the magnetic field sensing element 136 enhances the effectiveness of the concentrator and/or bias magnet provided by the ferromagnetic mold material.

Figure 6:
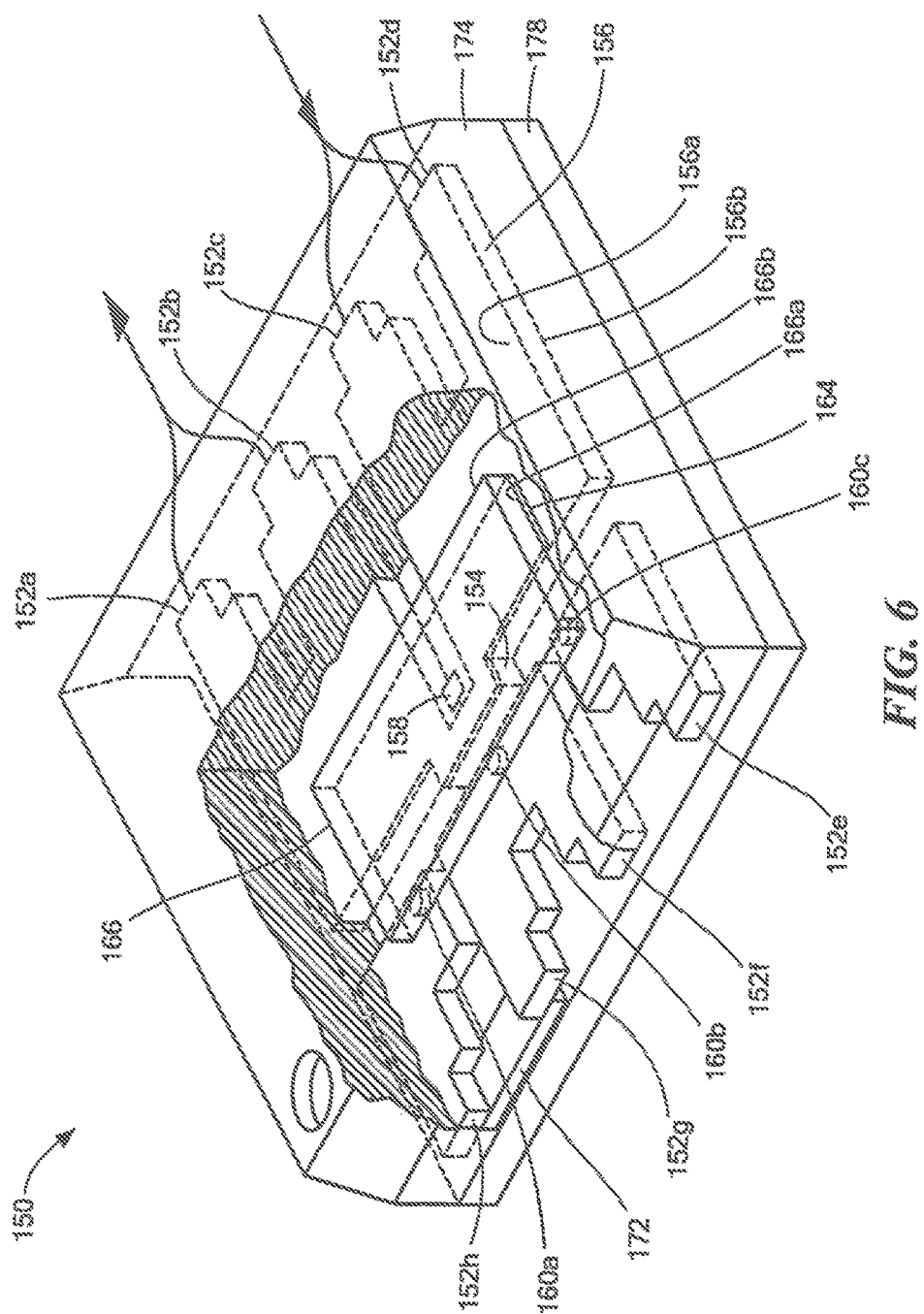
FIG. 6 is a perspective view of a flip-chip surface mount packaged magnetic field sensor having an integrated component coupled to the opposite side of the lead frame from the die, a non-conductive mold material, and a ferromagnetic mold material.

Referring to FIG. 6, a magnetic field sensor 150, as may provide a current sensor, includes non-conductive and ferromagnetic mold materials 174, 178, respectively, and further includes at least one integrated component, here a capacitor 172. The sensor 150 includes a lead frame 156 having a first surface 156a and a second, opposing surface 156b. The lead frame 156 includes a plurality of leads 152a-152h and a current conductor portion 154. Here, the capacitor 172 is secured to the lead frame 156 on the "bottom" (with respect to the view of FIG. 6) surface 156b of the lead frame.

The sensor 150 also includes a semiconductor die 166 having a first surface 166a and a second, opposing surface 166b. The die 166 has a magnetic field sensing element 158 disposed in the first surface 166a. The die 166 is disposed on the lead frame 156 so that the magnetic field sensing element 158 is in close proximity to the current conductor portion 154. The die 166 has an orientation that is upside down (i.e., the first surface 166a is directed downward) in relation to the conventional orientation with which a die is mounted in an integrated circuit package and may be referred to as a "flip-chip" configuration.

Solder balls 160a-160c on the first surface 166a are coupled directly to the leads 152e-152h as shown. An insulator 164 separates the die 166 from the lead frame 156. The insulator 164 can be provided in a variety of ways. For example, in one embodiment, a first portion of the insulator 164 includes a layer of a BCB resin material deposited directly on the first surface 166a of the die 166. A second portion of the insulator 164 may include a layer of underfill material or a tape material including but not limited to a polymer tape such as a Kapton® tape, deposited on the lead frame 156.

With this small outline integrated circuit (SOIC) package arrangement, the Hall effect element 158 is disposed in close proximity to the current conductor portion 154 and at a predetermined position relative to the conductor portion 154, such that a magnetic field generated by an electrical current passing though the current conductor portion 154, is in a direction substantially aligned with a maximum response axis of the magnetic field sensing element 158. Additional aspects of the sensor 150 are described in a U.S. Patent Application Publication No. US2008/0297138, entitled "Current Sensor," which is assigned to the Assignee of the subject application.

While three solder balls 160a-160c are shown, any number of solder balls can be provided, including dummy solder balls for stabilizing the die 166. Also, while solder balls 160a-160c are shown, other connection methods can also be used, including, but not limited to gold bumps, eutectic or high lead solder bumps, no-lead solder bumps, gold stud bumps, polymeric conductive bumps, anisotropic conductive paste, or conductive film.

The non-conductive mold material 174 and the ferromagnetic mold material 178 may be the same as, or similar to the non-conductive and ferromagnetic mold materials discussed above in connection with FIGS. 1-3. Thus, the non-conductive mold material 174 encloses the magnetic field sensor die 166, at least a portion of the lead frame 152, and the capacitor 172. The ferromagnetic mold material 178 is secured to a portion of the non-conductive mold material 174 and a securing mechanism may be provided between the non-conductive and ferromagnetic mold materials to enhance adhesion.

The ferromagnetic mold material 178 is comprised of a ferromagnetic material. Here again, the ferromagnetic material comprising the ferromagnetic mold material 178 may be a soft ferromagnetic material of the type described above, in which case the ferromagnetic mold material forms a concentrator or magnetic flux shield. In operation, the flux concentrator 178 tends to concentrate the magnetic flux generated by the current passing through the current conductor portion 154 so as to cause the current sensor 150 to have a higher sensitivity than otherwise possible. The flux concentrator 178 will also tend to guide small fields away from the magnetic sensor element in certain configurations and therefore shield the sensor from externally applied stray fields. Alternatively, the ferromagnetic material comprising the ferromagnetic mold material 178 may be a hard ferromagnetic material of the type described above, in which case the ferromagnetic mold material forms a bias magnet.

Figure 7:
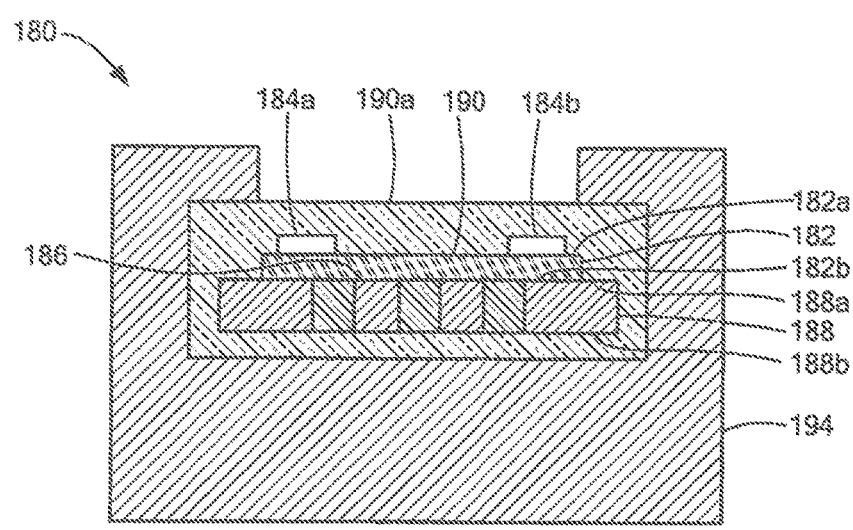
FIG. 7 is a cross-sectional view of a magnetic field sensor having a plurality of magnetic field sensing elements, a non-conductive mold material, and a ferromagnetic mold material.

Referring to FIG. 7, another alternative magnetic field sensor 180 includes a semiconductor die 182 having a first surface 182a in which a plurality of magnetic field sensing elements 184a-184b are disposed and a second, opposing surface 182b attached to a die attach area 186 on a first surface 188a of a lead frame 188, a non-conductive mold material 190 enclosing the die and at least a portion of the lead frame, and a ferromagnetic mold material 194 secured to a portion of the non-conductive mold material. As is apparent, the magnetic field sensing elements 184a-184b are here shown to be disposed "on" the first die surface 182a in the manner of a magnetoresistance element. However, as noted above, it will be appreciated that this and the other embodiments described herein may utilize any magnetic field sensing device type.

The non-conductive mold material 190 and the ferromagnetic mold material 194 may be the same as, or similar to the non-conductive and ferromagnetic mold materials discussed above in connection with FIGS. 1-3. The ferromagnetic mold material 194 is comprised of a ferromagnetic material. Here again, the ferromagnetic material comprising the ferromagnetic mold material 194 may be a soft ferromagnetic material of the type described above, in which case the ferromagnetic mold material forms a concentrator. Alternatively, the ferromagnetic material comprising the ferromagnetic mold material 194 may be a hard ferromagnetic material of the type described above, in which case the ferromagnetic mold material forms a bias magnet.

The ferromagnetic mold material 194 contacts several surfaces of the non-conductive mold material 190, including portions of a top surface 190a of the non-conductive mold material, as shown. With this arrangement of the ferromagnetic mold material 194 being adjacent to the magnetic field sensing elements 184a, 184b, lower magnetic fields may be achieved than in embodiments in which the ferromagnetic mold material does not extend over the top surface 190a of the non-conductive mold material (e.g., FIGS. 1-3), as may be particularly desirable in embodiments in which the magnetic field sensing elements are GMR elements. Furthermore, providing the ferromagnetic mold material over a portion of the top surface 190a may also operate as a form of securing mechanism, to thereby improve the adhesion between the non-conductive and ferromagnetic mold materials.

Referring to FIG. 8, a flow diagram shows an illustrative process for fabricating the sensors of FIGS. 1-7. In a step 200, the lead frame (e.g., lead frame 18 of FIG. 1) is formed. Various materials and processes may be used to form the lead frame. As an example, the lead frame may be a stamped or etched metal, such as copper or a copper alloy.

In step 204, the semiconductor die (e.g., die 14 of FIG. 1) is attached to the lead frame. For example, the die may be attached to the die attach area (e.g., die attach area 16 of FIG. 1) by a conventional technique such as by soldering or with the use of an epoxy (either conductive or non-conductive epoxy may be used depending on the need) or an adhesive tape. Alternatively, in the case of a flip-chip arrangement, the die may be attached to the lead frame with solder balls for example.

In an optional step 206, an integrated component (e.g., capacitors 102a-102b of FIG. 4) is provided on the lead frame. The capacitors may be attached via a solder process or a conductive epoxy process onto the lead frame. Furthermore, step 206 may be combined with step 204 such that a single solder reflow or epoxy cure heat cycle may be used to secure the die to the die attach area and also secure the capacitor to the lead frame.

In a further optional step 208, circuitry supported by the die including, but not limited to the magnetic field sensing element, is electrically coupled to leads of the lead frame, such as by wire bonding. Step 208 is optional because in certain configurations, such as the flip-chip configuration of FIG. 6, attaching the die to the lead frame in step 204 includes coupling the circuitry to the leads, such as with the use of the solder bumps.

The non-conductive mold material is formed in steps 212 and 216 in which the die/lead frame subassembly is placed in a mold cavity into which the non-conductive mold material is introduced, such as by injection molding, compression molding, transfer molding or potting.

In step 218, the subassembly, now including the non-conductive mold material, is removed (optionally following a time interval appropriate for curing, depending on the composition of the non-conductive mold material) from the first mold cavity and placed in a second mold cavity. In step 222, the ferromagnetic mold material is introduced into the second mold cavity to form a bias magnet or concentrator.

As noted above, in some embodiments, the ferromagnetic mold material can be secured to the non-conductive mold material using an adhesive, such as a thermoset adhesive (e.g., a two part epoxy). According to one such example, prior to step 222 (for example between steps 218 and 222), the epoxy is applied to the bottom surface 20b and lower side portions of the non-conductive mold material 20 (FIG. 1) and the epoxy cures as a result of the heat applied during the molding of the ferromagnetic mold material in step 222.

If the sensor is to include a third mold material (e.g., third mold material 54 of FIG. 2 or overmold material 90 of FIG. 3), then in step 226 (optionally following a time interval appropriate for curing, depending on the third or overmold material), the subassembly including the non-conductive and ferromagnetic mold materials, is removed from the second mold cavity and placed into a third mold cavity and in step 228, the third mold or overmold material is introduced into the third mold cavity. It will be appreciated by those of ordinary skill in the art that the use of additional mold materials is possible. In step 230, the subassembly is removed from the final mold cavity (i.e., the second mold cavity in embodiments in which a third mold is not used, or the third mold cavity in embodiments in which such is used).

Figure 8A:
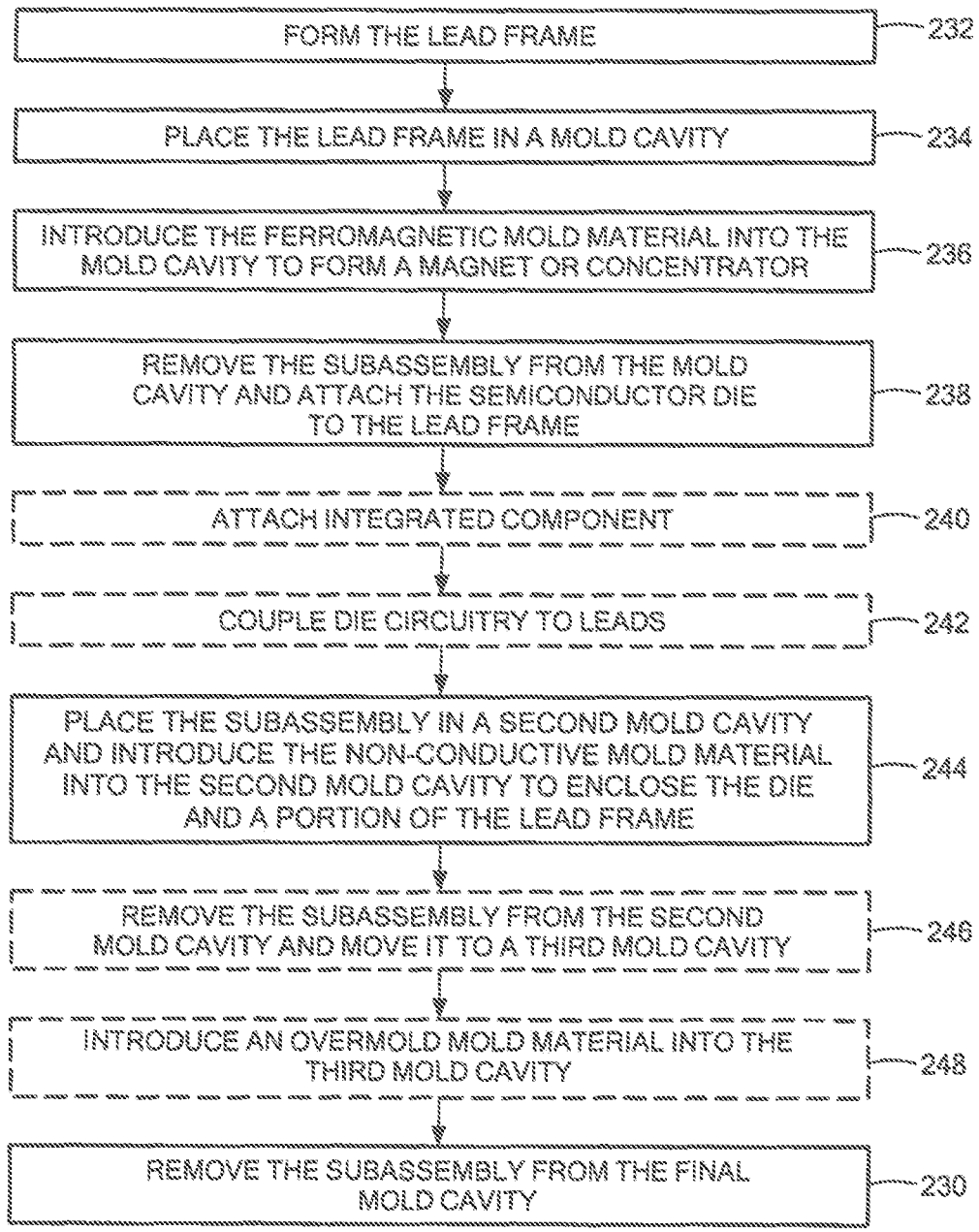
FIG. 8A is a flow diagram illustrating an alternative process for fabricating the magnetic field sensors of FIGS. 1-7.

Referring also to FIG. 8A, a flow diagram shows an alternative process for fabricating the sensors of FIGS. 1-7. In a step 232, the lead frame is formed. In step 234, the lead frame is placed in a mold cavity. In step 236, the ferromagnetic mold material (e.g., mold material 30 of FIG. 1) is introduced into the mold cavity to form a magnet or concentrator.

In step 238, the subassembly including the lead frame and ferromagnetic mold material is removed from the mold cavity and the semiconductor die is attached to the lead frame die attach area, such as by soldering or with the use of an epoxy or an adhesive tape. In optional step 240, an integrated component, such as capacitors 102a-102b of FIG. 4, is attached to the lead frame. Here again steps 238 and 240 may be combined such that a single solder reflow or epoxy cure may be used to secure the die to the die attach area and also secure the capacitor to the lead frame.

In a further optional step 242, circuitry supported by the die including is electrically coupled to leads of the lead frame, such as by wire bonding. Step 242 is optional because in certain configurations, such as the flip-chip configuration of FIG. 6, attaching the die to the lead frame in step 238 includes coupling the circuitry to the leads, such as with the use of the solder bumps.

The non-conductive mold material (such as mold material 20 of FIG. 1) is formed in step 244 in which the die/lead frame subassembly is placed into a mold cavity into which the non-conductive mold material is introduced, such as by injection molding, compression molding, transfer molding or potting.

In embodiments in which the sensor includes a third mold material (e.g., third mold material 54 of FIG. 2 or overmold material 90 of FIG. 3), then in step 246 (optionally following a time interval appropriate for curing, depending on the third or overmold material), the subassembly including the non-conductive and ferromagnetic mold materials, is removed from the second mold cavity and placed into a third mold cavity and in step 248, the third mold or overmold material is introduced into the third mold cavity. In step 249, the subassembly is removed from the final mold cavity (i.e., second or third mold cavity depending on whether optional steps 246, 248 are performed).

The mold steps of the fabrication processes described in connection with FIGS. 8 and 8A may be achieved by the same or different mold processes. For example, all of the molding steps 216, 222, and 230 may be achieved by the same molding process, such as transfer molding. Alternatively, one or more such steps may be by transfer molding and the other such steps may be by injection molding. Thus, it will also be appreciated by those of ordinary skill in the art that the different mold steps may be by the same or different molding processes and therefore at the same or different speeds and/or pressures for example. In general, the mold setup and cure times can be selected based on the mold process (e.g., taking into account molding pressure, speed, and temperature), mold materials and mold geometry.

In some applications transfer molding is desirable because of the relatively lower pressures and thinner mold cavity requirements (as compared to injection molding for example). As a result the lower pressures, transfer molding generally can result in lower stress on the sensor and the ability to use thinner mold cavities can increase the throughput per mold shot, thereby reducing the cost of fabrication.

Figure 9:
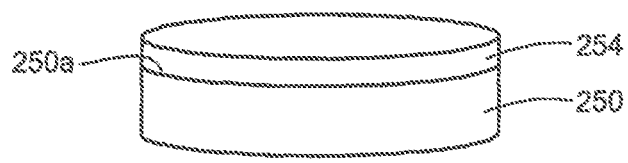
FIG. 9 shows a semiconductor wafer having a ferromagnetic material layer according to a further aspect.

Referring also to FIG. 9, according to a further aspect, a bias magnet or concentrator can be provided by a layer 254 of ferromagnetic material formed over a first surface 250a of a semiconductor wafer 250. Various conventional wafer level packaging techniques may be used to provide the layer 254, such as pouring, molding, or coating. The magnetic field sensor embodiments of FIGS. 10-13 are formed from wafer 250. In embodiments in which the layer 254 provides a bias magnet, the layer is comprised of a material containing hard magnetic material particles, such as a hard ferrite, a NdFeB alloy, a SmCo alloy, a NdFeB alloy, a thermoplastic polymer with hard magnetic particles, or a thermoset polymer with hard magnetic particles. And in embodiments in which the layer 254 provides a concentrator, the layer is comprised of a soft ferromagnetic material, such as NiFe, Ni, a Ni alloy, steel, or ferrite.

The thickness of the ferromagnetic layer 254 may be tailored for a particular application and particular sensor characteristics, including but not limited to the sensitivity of the magnetic field sensing element and the airgap. Illustrative thicknesses for layer 254 are on the order of 100 to 500 microns.

Figure 10:
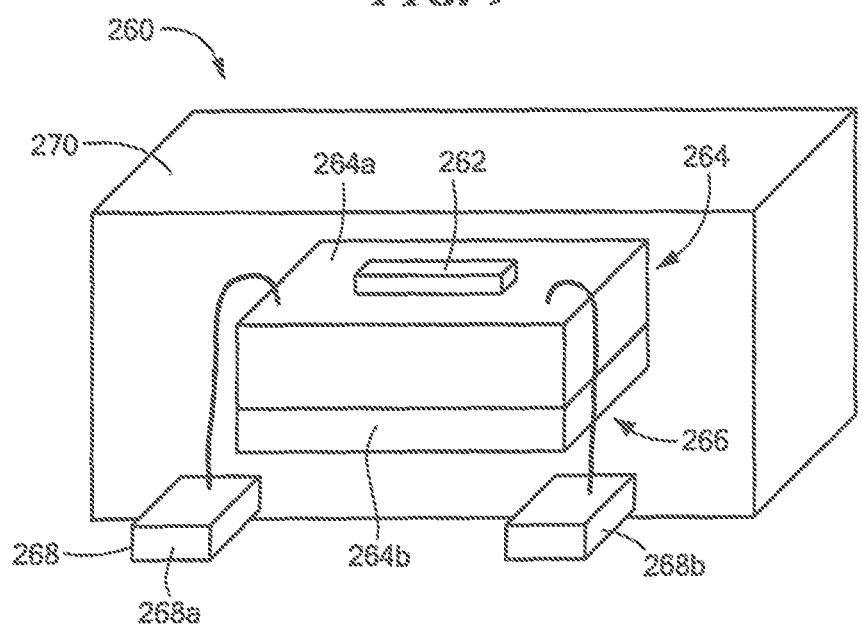
FIG. 10 shows a packaged magnetic field sensor formed from the wafer of FIG. 9.

Referring also to FIG. 10, a magnetic field sensor 260 includes a magnetic field sensing element 262 disposed in a first surface 264a of the die 264 and a ferromagnetic material layer 266 formed over a second, opposing surface 264b of the die 264. The die 264 and layer 266 may be provided by dicing the wafer 250 (FIG. 9) into individual IC device die. A lead frame 268 includes leads 268a, 268b and a die attach area (not visible in the view of FIG. 10) to which the second surface 264b of the die is attached. Portions of the lead frame 268 (not shown in FIG. 10 for clarity) may extend to support the die in the manner of other lead frame embodiments. The sensing element 262 and other circuitry supported by the first surface 264a of the die may be coupled to the leads by various techniques, such as wire bonds as shown. The die/lead frame subassembly may be overmolded with an overmold material 270 as shown to provide a packaged magnetic field sensor device 260.

Figure 11:
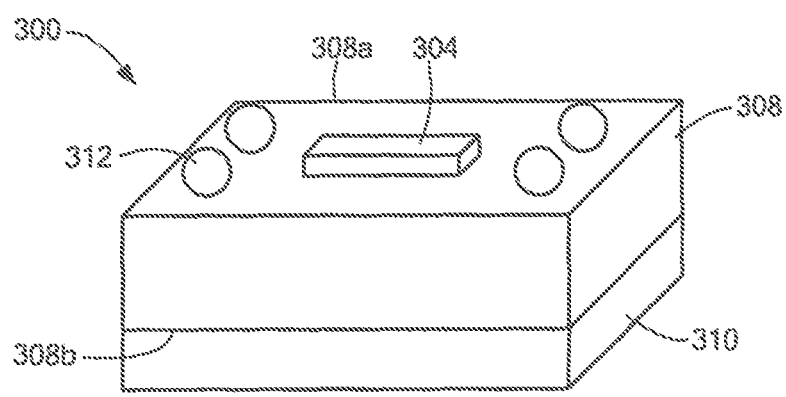
FIG. 11 is a perspective view of a magnetic field sensor formed from the wafer of FIG. 9 and having solder bumps suitable for certain integrated circuit packaging options.

Referring also to FIG. 11, a further alternative magnetic field sensor 300 as may be formed by separating the wafer 250 of FIG. 9 into individual IC device die is shown. The sensor 300 includes a magnetic field sensing element 304 disposed in a first surface 308a of the die 308 and a ferromagnetic material layer 310 formed over the second, opposing surface 308b of the die 308. Solder balls 312 are provided over the first surface 308a of the die for coupling the magnetic field sensing element 304 and associated circuitry to a lead frame (not shown), such as in a flip-chip arrangement similar to the arrangement shown in FIG. 6. Thus the lead frame may be the same as or similar to the lead frame of FIG. 6.

Figure 12:
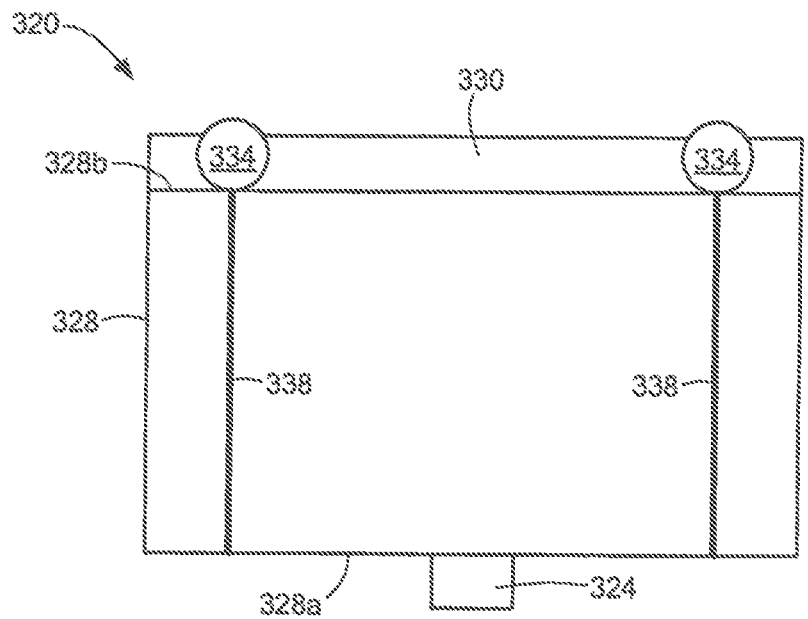
FIG. 12 is a cross-sectional view of an alternative magnetic field sensor formed from the wafer of FIG. 9 and having solder bumps.

Referring also to FIG. 12, another alternative magnetic field sensor 320, that also may be formed by separating the semiconductor wafer 250 of FIG. 9 into individual die, includes a magnetic field sensing element 324 disposed in a first surface 328a of the die 328 and a ferromagnetic material layer 330 formed over the second, opposing surface 328b of the die 308.

Solder balls 334 are formed for coupling the magnetic field sensing element 324 and associated circuitry to a lead frame, such as any of the above-described lead frames, a Printed Circuit Board (PCB), or other substrate with die or components, such as may take the form of a Multi-Chip Module (MCM) for example. While the solder balls 334 may be formed over the ferromagnetic layer 330, here, regions of the layer 330 are opened, such as by laser ablation, to permit the solder balls to contact the die 328, as shown. Through Silicon Vias (TSVs) 338 are formed through the die 328 to couple the magnetic field sensing element 324 and associated circuitry to the solder balls 334, as shown, for further coupling to a lead frame. The TSVs may be formed prior to application of the ferromagnetic material 330 to the wafer to isolate the ferromagnetic materials from the wafer fabrication process and reduce potential cross-contamination of the TSV tool.

Figure 13:
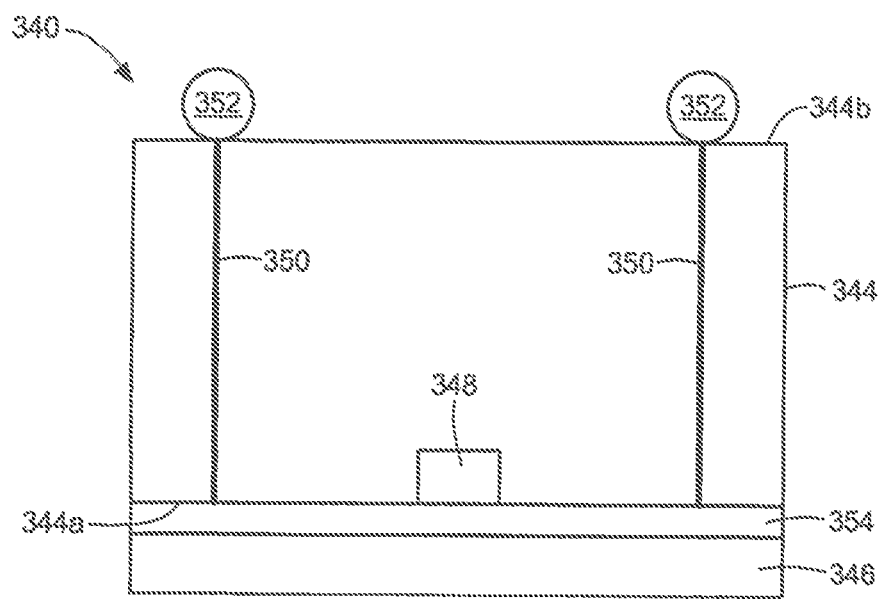
FIG. 13 is yet another alternative magnetic field sensor formed with the wafer of FIG. 9 and having solder bumps.

Another magnetic field sensor embodiment 340, that may be formed by dicing the semiconductor wafer 250 of FIG. 9 into individual die, is shown in FIG. 13 to include a semiconductor die 344 having a first surface 344a over which the layer 346 of ferromagnetic material is formed and a second opposing surface 344b. A magnetic field sensing element 348 (shown as a Hall sensor in the substrate or epi layer) and associated circuitry (not shown) are disposed in the first surface 344a of the die. TSVs 350 are formed through the die 344 to couple the magnetic field sensing element 348 to solder balls 352, as shown, for further coupling to a lead frame that may be the same as or similar to any of the above-described lead frames. An optional layer 354 may be provided between the die surface 344a and the layer 346 in order to protect the die from particles in the layer 346. In such embodiments, the layer 354 may comprise, but is not limited to, a polyimide or BCB layer deposited at the wafer level, or a tape layer or other insulator.

Figure 14:
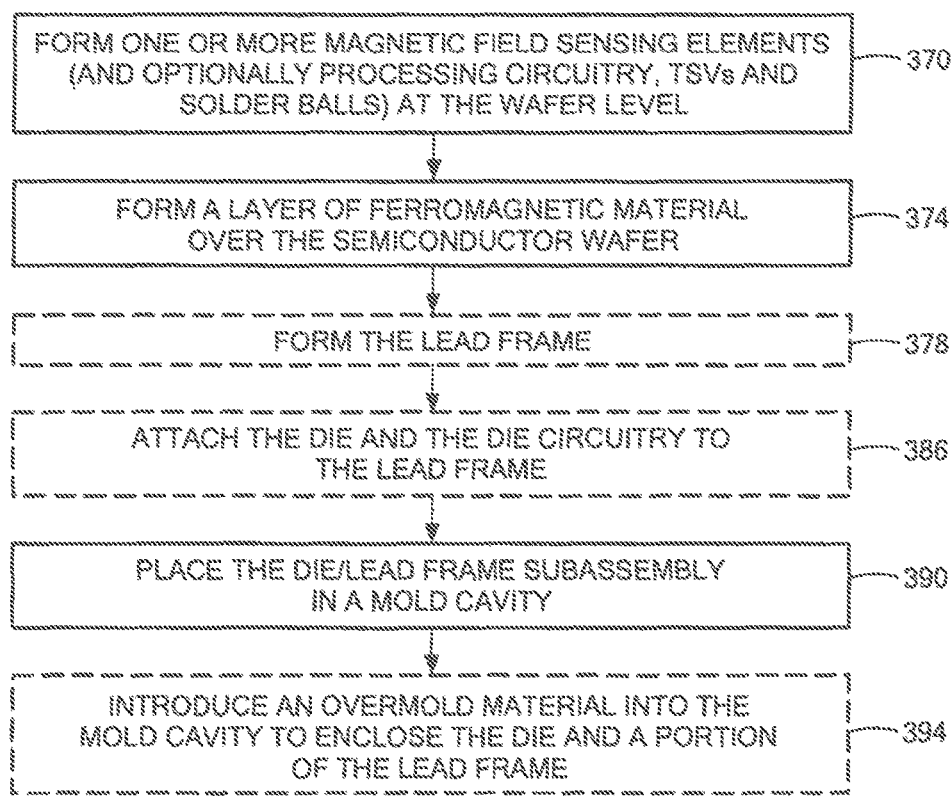
FIG. 14 is a flow diagram illustrating an exemplary process for fabricating the magnetic field sensors of FIGS. 10-13.

Referring also to FIG. 14, an illustrative process for fabricating the sensors 260, 300, 320, 340 of FIGS. 10-13, respectively, is shown. In step 370, one or more magnetic field sensing elements and associated circuitry are formed in the first, active surface of the wafer. In embodiments in which the magnetic field sensor and other circuitry formed in a first surface of the die are coupled to a lead frame or other structure from a second, opposing surface of the die, TSVs are formed through the wafer and solder balls (e.g., solder balls 334 of FIG. 12) are formed on or applied to the wafer in step 370.

In step 374, a layer of ferromagnetic material, such as layer 310 of FIG. 11, is formed over a surface of a semiconductor wafer by any of various wafer level packaging techniques, such as by pouring, molding, or coating.

A lead frame may be formed in an optional step 378. Various materials and processes may be used to form the lead frame. As an example, the lead frame may be a stamped or etched metal, such as copper, a copper alloy, or in some instances a soft magnetic material such as Kovar™.

In optional step 386, the die and the magnetic field sensing element and associated circuitry are attached to the lead frame. The die/lead frame subassembly is placed into a mold cavity in optional step 390, and an overmold material is introduced into the mold cavity to enclose the die and a portion of the lead frame in optional step 394. Steps 378-394 are considered optional since, as mentioned above in connection with FIG. 13 for example, in some embodiments, the die may be attached to a PCB, MCM, or other structure, without the use of a lead frame.

Figure 15:
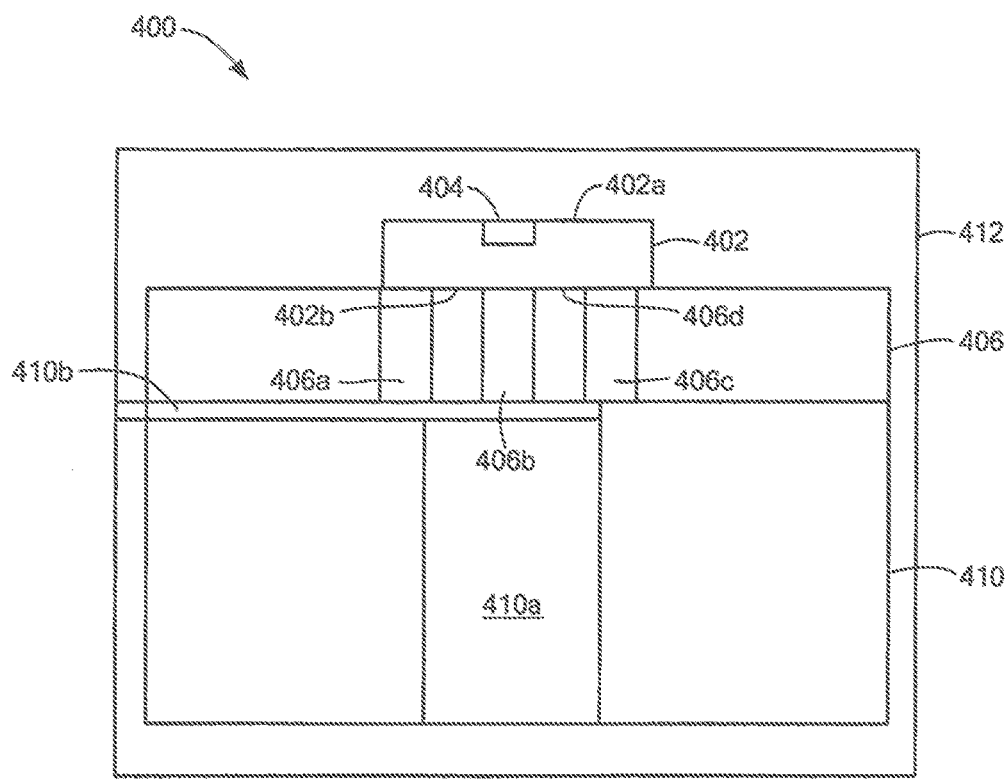
FIG. 15 is a magnetic field sensor according to a further aspect.

Another magnetic field sensor embodiment 400 is shown in FIG. 15 to include a semiconductor die 402 having a first, active surface 402a in which a magnetic field sensing element 404 is formed and a second, opposing surface 402b. A lead frame 406 having leads 406a-406c is provided with a die attach area 406d to which the surface 402b of the die 402 is attached, such as with the use of adhesives, such as epoxy or an adhesive tape.

A bias magnet 410 is provided with a non-contiguous central region 410a. As in the above-described embodiments, the bias magnet 410 may take the form of a ring-shaped structure in which case the non-contiguous central region is an aperture or alternatively may form only a partial or alternative ring-shaped structure, such as a D-shaped structure, a C-shaped structure, or a U-shaped structure.

The magnet 410 includes one or more channels 410b extending laterally from the central region 410a. The die/lead frame/magnet subassembly is overmolded with an overmold material 412 to enclose the die, magnet, and a portion of the lead frame. Here, the magnet channel 410b is provided for the purpose of facilitating the overmolding step as will be described.

The bias magnet 410 may be formed by a molding process, such as injection molding or transfer molding, as described above in the case of the ferromagnetic mold material in the various embodiments. In this case, the magnet 410 may be molded to the lead frame 406 (e.g., in the manner described above in connection with FIG. 8A). Alternatively, the magnet 410 may be a separately molded structure or may be a sintered magnet and may be attached to the lead frame with an epoxy or an adhesive tape.

Figure 16:
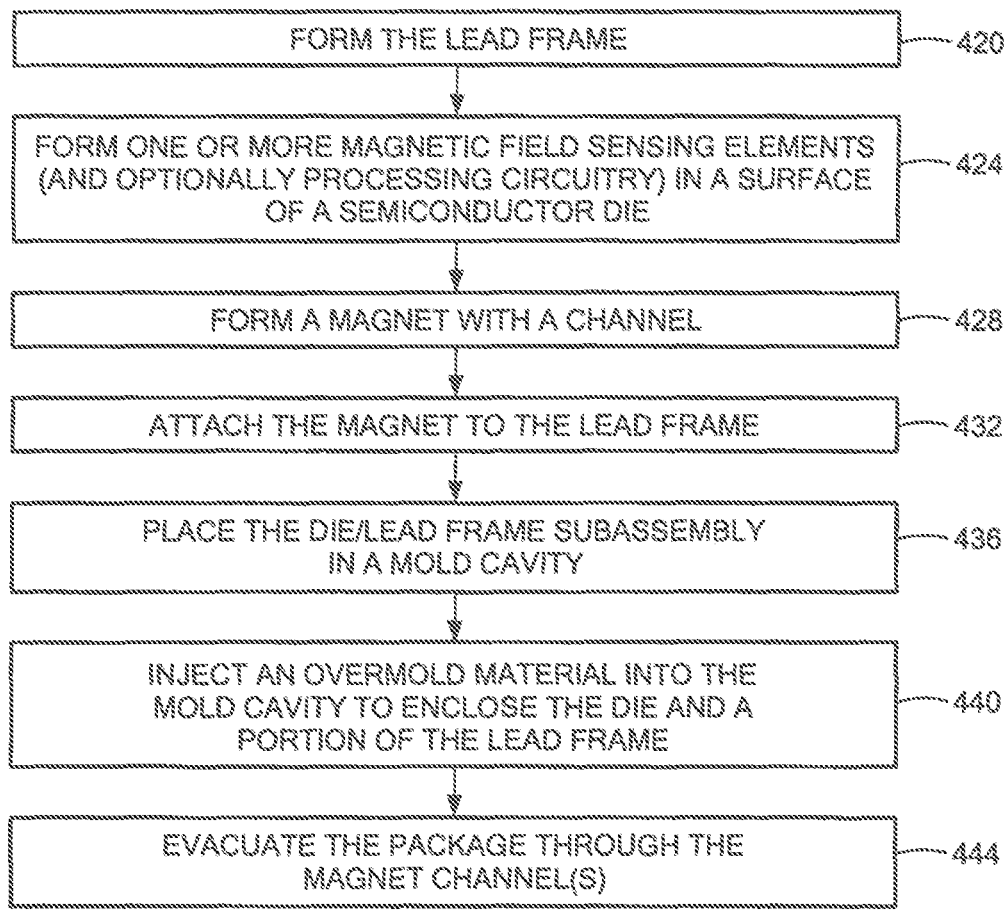
FIG. 16 is a flow diagram illustrating an exemplary process for fabricating the magnetic field sensor of FIG. 15.

Referring also to FIG. 16, an illustrative process for fabricating the magnetic field sensor 400 of FIG. 15 is shown. The lead frame 406 is formed in step 420 by any conventional method. In step 424, one or more magnetic field sensing elements and associated processing circuitry are formed in the first surface 402a of a semiconductor die 402. In step 428, the bias magnet 410 having a non-contiguous central region 410a and one or more laterally extending channels 410b is formed. In embodiments in which the magnet 410 is formed by a molding process, the mold cavity can be provided with structures to form the one or more channels in the ferromagnetic mold material. The magnet 410 is attached to the lead frame, such as with the use of epoxy or an adhesive tape, in step 432. In embodiments in which the magnet 410 is molded to the lead frame, steps 428 and 432 may be combined.

In step 436, the die/lead frame subassembly is placed into a mold cavity for overmolding with an overmold material 412 (FIG. 15) in step 440. In step 444, the device 400 is evacuated through the one or more channels 410b. For example, air may be removed from the central region 410a with a vacuum system (not shown) coupled to the channel(s) 410b. It will also be appreciated that use of one or more channels to permit evacuation of the non-contiguous central region can be applied to the above-described embodiments. For example, in step 222 of FIG. 8, the second mold cavity can have one or more structures sized and arranged so that the second mold material is formed so as to have one or more channels.

Figure 17:
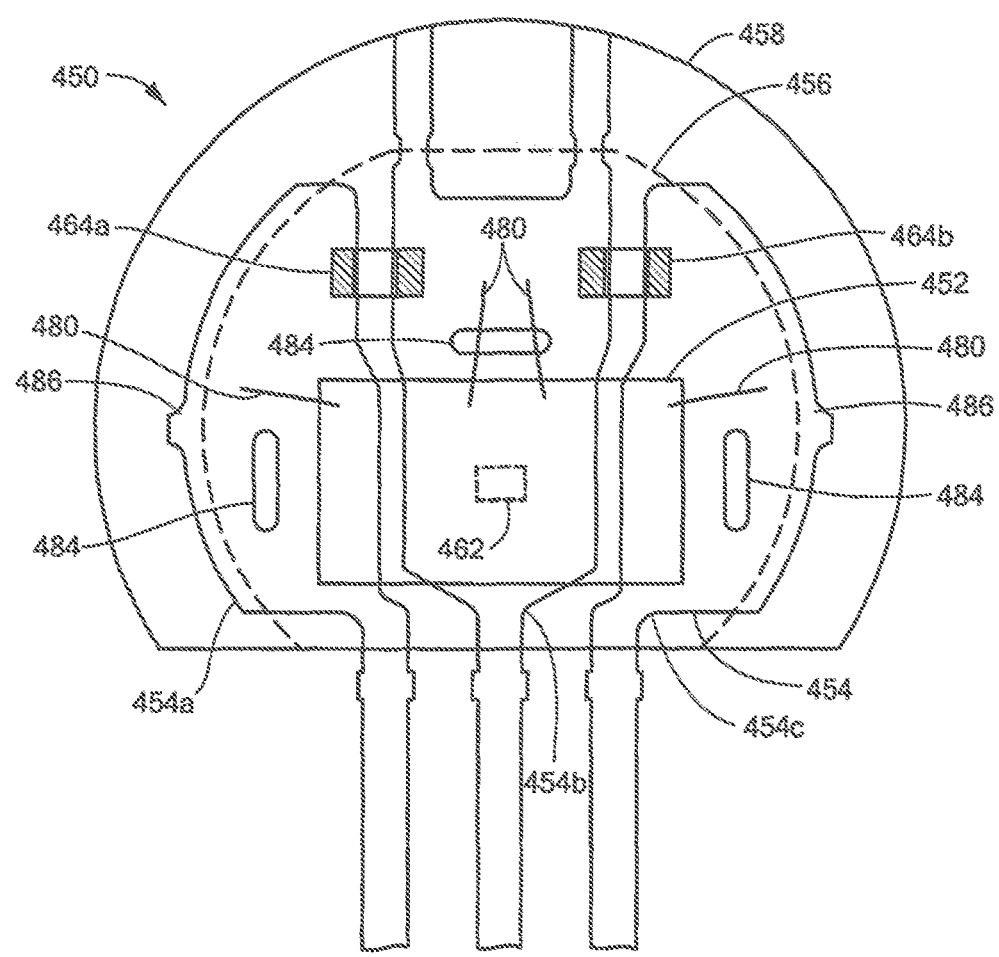
FIG. 17 is a plan view of an alternative packaged magnetic field sensor.

Referring also to FIG. 17, an alternative magnetic field sensor 450, includes a semiconductor die 452, a magnetic field sensing element 462, a lead frame 454, a non-conductive mold material 456, and a ferromagnetic mold material 458. The sensor may include a third, overmold material, not shown here, but described above in other embodiments, which may increase the size of the package beyond 458. The non-conductive mold material 456 and the ferromagnetic mold material 458 may be the same as or similar to like materials discussed above in connection with other embodiments. The sensor 450 further includes integrated passive components, here in the form of capacitors 464a, 464b, attached to lead frame portions 454a, 454b, and 454c which terminate in corresponding leads, as shown. Here again, the non-conductive mold material 456 encloses the die 452, at least a portion of the lead frame 454, and the capacitors 464a, 464b.

Here, the die 452 is attached to the top of the lead frame 454. An adhesive may be used to secure the die to the lead frame 454 and more particularly to lead frame portions 454a, 454b, and 454c. Thus, in this embodiment, since the die attach area of the lead frame 454 extends across multiple leads 454a-454c, the adhesive attaching the die to the lead frame must be comprised of a non-conductive material, such as a non-conductive epoxy, or a die attach tape such as a Kapton® tape. Here, leads 454a-454c are electrically coupled to the die 452 by wire bonds 480. The sensor 450 may be fabricated according to the above-described illustrative processes, such as are shown in FIGS. 8 and 8A.

The sensor 450 includes two securing mechanisms. The first securing mechanism is provided in the form of slots 484 in the lead frame that serve to enhance adhesion of the non-conductive mold material 456 to the lead frame 454. A second securing mechanism, in the form of overhanging portions 486 of the lead frame that extend beyond the non-conductive mold material, serve to enhance adhesion of the non-conductive mold material 456 to the ferromagnetic mold material 458 and the lead frame. As noted above in conjunction with FIG. 1, because the overhanging portions 486 of the lead frame extend into the ferromagnetic mold material, it will be appreciated that the ferromagnetic mold material should be non-conductive or have a sufficiently low conductivity to prevent the leads from electrically shorting resulting in the device not operating as intended.

Figure 18:
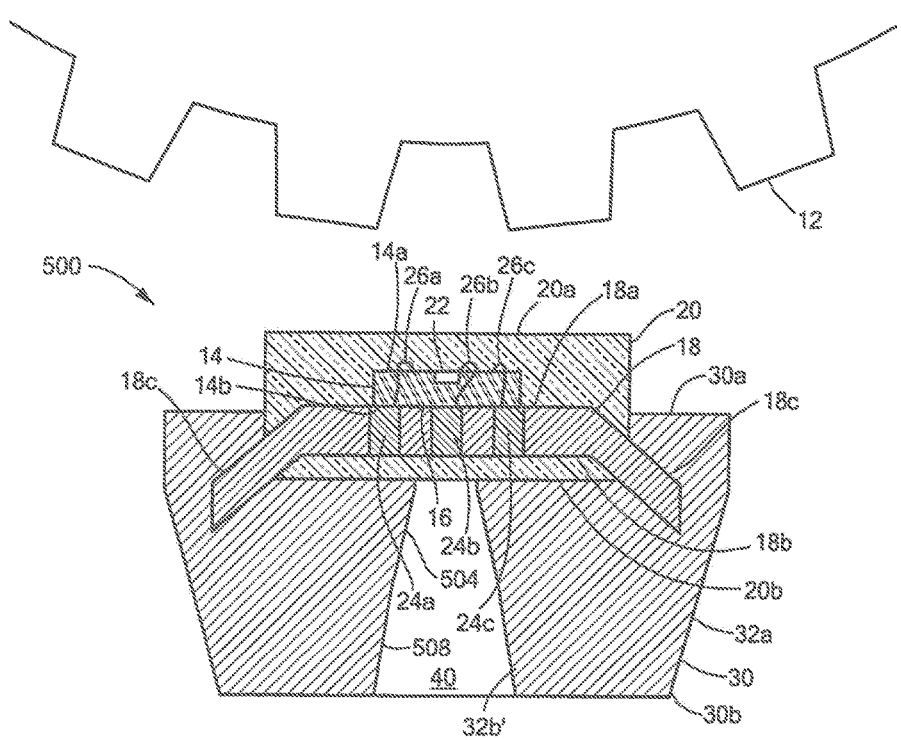
FIG. 18 is a cross-sectional view of an alternative magnetic field sensor having a central aperture surface with a dual-sloped taper.

Referring to FIG. 18, in which like elements to FIG. 1 are labeled with like reference characters, an alternative magnetic field sensor 500 of a form similar to the sensor 10 of FIG. 1 includes semiconductor die 14 having a first, active surface 14a in which a magnetic field sensing element or transducer 22 is formed and a second, opposing surface 14b attached to a die attach area 16 on a first surface 18a of a lead frame 18, a non-conductive mold material 20 enclosing the die and at least a portion of the lead frame, and a ferromagnetic mold material 30 secured to the non-conductive mold material.

As in the sensor 10 of FIG. 1, the ferromagnetic mold material 30 of the sensor 500 has a central aperture 40 extending from the second surface 20b of the non-conductive mold material 20 to a second end 30b of the ferromagnetic mold material 30. Also in the same manner as sensor 10, the ferromagnetic mold material 30 of sensor 500 is tapered from its first end 30a (or a location close to its first end) to its second end 30b. In particular, the ferromagnetic mold material has a first taper to its outer circumferential surface 32a and a second taper to its inner central aperture surface 32b'.

The sensor 500 differs from the sensor 10 (FIG. 1) in that the taper of the inner central aperture surface 32b' has multiple slopes rather than a single slope. The surface 32b' may have a first sloped portion 504 and a second sloped portion 508 as shown. It will be appreciated that with regard to the taper of surfaces 32a and 32b', the particular angle of the respective taper and whether the respective taper has a single slope or multiple sloped portions can be the same or different and can be selected to suit a particular sensor/fabrication. Although the surface 32b' is shown in FIG. 18 to have two sloped portions, it will be appreciated that more than two slopes are possible.

Figure 19:
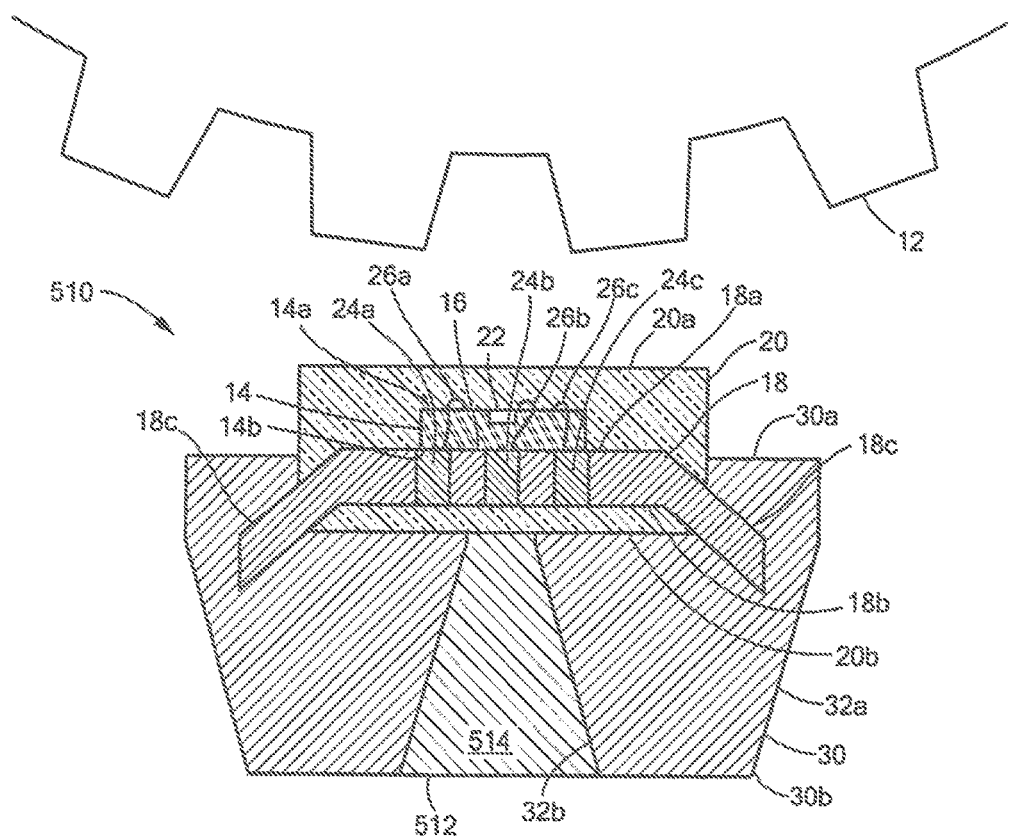
FIG. 19 is a cross-sectional view of yet another alternative magnetic field sensor having a separately formed element in the central aperture.

Referring to FIG. 19, in which like elements to FIG. 1 are labeled with like reference characters, an alternative magnetic field sensor 510 of a form similar to the sensor 10 of FIG. 1 includes semiconductor die 14 having a first, active surface 14a in which a magnetic field sensing element or transducer 22 is formed and a second, opposing surface 14b attached to a die attach area 16 on a first surface 18a of a lead frame 18, a non-conductive mold material 20 enclosing the die and at least a portion of the lead frame, and a ferromagnetic mold material 30 secured to the non-conductive mold material.

As in the sensor 10 of FIG. 1, the ferromagnetic mold material 30 of the sensor 500 has a non-contiguous central region, here labeled 512, extending from the second surface 20b of the non-conductive mold material 20 to a second end 30b of the ferromagnetic mold material 30.

The sensor 510 differs from the sensor 10 (FIG. 1) in that a separately formed element 514 is disposed in and secured to the central region 512 of the ferromagnetic mold material 30. This arrangement is in contrast to the open area central aperture 40 shown in FIG. 1 and also in contrast to the arrangement of FIG. 2 in which the central region of the mold material 30 contains a third mold material 54.

More particularly, the separately formed element 514 is not formed by a molding step in conjunction with other elements of the sensor 510. The element 514 may be a machined or sintered element or it may be a separately molded part, as examples.

The element 514 may be secured to the region 512 of the mold material 30 by various techniques. For example, the element 514 may be secured to the surface 32b of the mold material 30 with an adhesive or with a press fit arrangement. As another example, the separately formed element 514 may be placed in a mold cavity into which the mold material 30 is injected for example, in which case the element may be secured to the mold material 30 with interfering features, such as barbs extending from the element. As yet another example, the material 30 could be potted with a potting material that may be filled with a ferromagnetic material. It will be appreciated by those of ordinary skill in the art that while the illustrated element 514 has a taper complementary to the taper of the region 512 of the mold material 30, in some embodiments the element 514 and/or the region 512 may not be tapered, or tapered with different or multiple slopes.

The element 514 may be comprised of a hard ferromagnetic material, a soft ferromagnetic material, or a non-ferromagnetic, non-conductive material. As one example, the separately formed element 514 may be comprised of a potting compound filled with a soft ferromagnetic material, such as a soft ferrite. As another example, the separately formed element 514 may be a sintered steel rod sized and shaped to fit in the region 512. In assembly, the element 514 may be positioned in the region 512 and secured to the surface 32b of the mold material 30 with an adhesive. Alternatively, the mold material 30 may be molded around the steel rod element 514.

Figure 20:
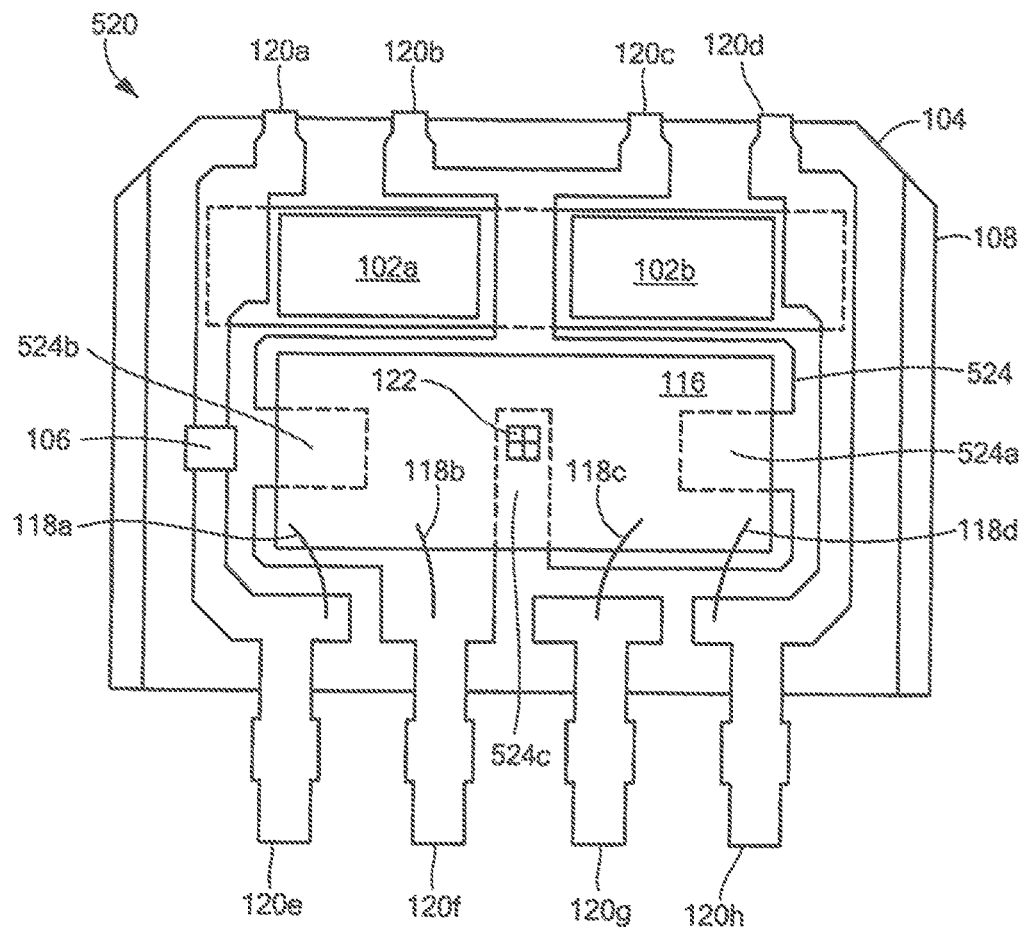
FIG. 20 is a plan view of an alternative magnetic field sensor having slots in the lead frame and a passive device in series with a lead.

Referring to FIG. 20, in which like elements to FIG. 4 are labeled with like reference characters, an alternative magnetic field sensor 520 of a form similar to the sensor 100 of FIG. 4 includes non-conductive and ferromagnetic mold materials 104, 108, respectively, and further includes at least one, and here two, integrated passive components such as resistors, inductors, or capacitors, and here capacitors 102a, 102b, attached to a lead frame 524. The lead frame 524 has a die attach area to which a semiconductor die 116 is secured. A magnetic field sensing element 122 is disposed in an active surface of the die 116.

The sensor 520 differs from the sensor 100 of FIG. 4 in that the lead frame 524 contains one or more slots, and here three slots 524a, 524b, and 524c. As is well known in the art, in the presence of a changing AC or transient magnetic field (e.g., a magnetic field surrounding a current carrying conductor), eddy currents can be induced in the conductive lead frame 524. The presence of the slots can move the position of the eddy currents and also the influence of the eddy currents to result in a smaller magnetic field error so that a Hall effect element experiences a smaller magnetic field from the eddy currents than it would otherwise experience, resulting in a less error in the measured field. Furthermore, if the magnetic field associated with the eddy current is not uniform or symmetrical about the Hall effect element, the Hall effect element might generate an undesirable offset voltage.

Lead frame slots 524a, 524b, and 524c tend to reduce a size (e.g., a diameter or path length) of the closed loops and the position of the loops with respect to the sensing element(s) in which the eddy currents travel in the lead frame 524. It will be understood that the reduced size of the closed loops in which the eddy currents travel results in smaller eddy currents for a smaller local affect on the changing magnetic field that induced the eddy current. Therefore, the measured magnetic field of a sensor having a Hall effect 122 element is less affected by eddy currents due to the slots 524a-524c.

Instead of an eddy current rotating about the Hall effect element 122, the slot(s) 524a-524c result in eddy currents to each side of the Hall element. While the magnetic fields resulting from the eddy currents are additive, the overall magnitude field strength, compared to a single eddy current with no slot, is lower due to the increased distance of the eddy currents to the sensing element(s). While three slots 524a-c are shown, the eddy current influence on the Hall effect element 122 would be reduced by only having the slot 524c under the sensing element 122.

It is understood that any number of slots can be formed in a wide variety of configurations to meet the needs of a particular application. In the illustrative embodiment of FIG. 20, first, second and third slots 524a, 524b, and 524c are formed in the lead frame 524 in relation to a Hall effect element 122 centrally located in the die. The slots reduce the eddy current flows and enhance the overall performance of the sensor.

It is understood that the term slot should be broadly construed to cover generally interruptions in the conductivity of the lead frame. For example, slots can include a few relatively large holes as well as smaller holes in a relatively high density. In addition, the term slot is not intended to refer to any particular geometry. For example, slot includes a wide variety of regular and irregular shapes, such as tapers, ovals, etc. Further, it is understood that the direction of the slot(s) can vary. Also, it will be apparent that it may be desirable to position the slot(s) based upon the type of sensor.

The slotted lead frame 524 can be formed from a metal layer of suitable conductive materials including but not limited to, for example, copper, copper alloys, aluminum, copper, titanium, tungsten, chromium, Kovar™ and/or nickel or alloys of the metals. Additional details of the slotted lead frame 524 may be found in U.S. Patent Application Publication No. US-2012-0086090-A1 for example, which application is assigned to the assignee of the subject invention and incorporated herein by reference in its entirety.

The sensor 520 further differs from the sensor 100 of FIG. 4 in that at least one lead of the lead frame has a passive component coupled in series, or "in-line". To this end, a lead otherwise formed by continuous or coupled leads or lead portions 120*a* and 120*e* is split or broken and the portions coupled by one or more passive component 106. More particularly, each of the lead portions 120*a* and 120*e* has an end that is spaced from and proximate to the end of the other lead. Passive component 106 is coupled to both the lead portion 120*a* and to lead portion 120*e*, thereby being electrically connected in series with the lead. This arrangement can advantageously permit series coupling of passive components with one or more leads.

The passive component 106 may take various forms, such as a resistor, capacitor, or inductor as examples, which component(s) is provided for various purposes, such as to improve EMC performance. In an embodiment the element 106 is a resistor. Also, it will be appreciated that while only one lead is shown to have an in-line passive component 106, the same or a different type of passive component can be similarly coupled in line with more than one lead. Also, a single lead, such as that formed by lead portions 120*a* and 120*e*, can have more than one break and more than one passive component coupled across the respective breaks so as to form an arrangement in which more than one passive component is coupled in series with a respective lead.

Figure 21:
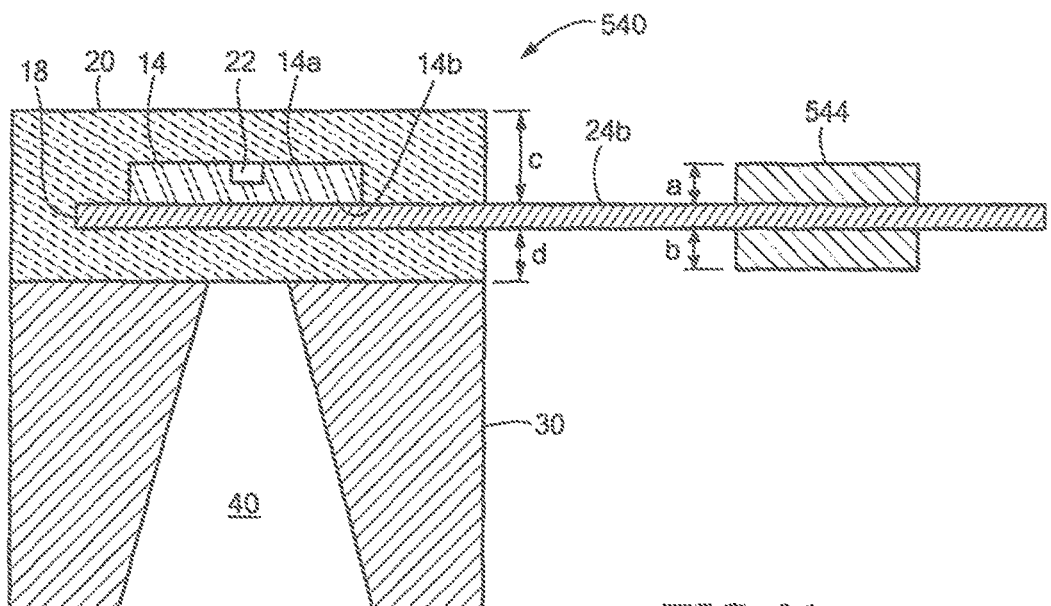
FIG. 21 is a side cross-sectional view of a magnetic field sensor having a non-conductive mold material, a ferromagnetic mold material, and molded ferromagnetic suppression device enclosing a portion of a lead.

Referring to FIG. 21, in which like elements to FIG. 1 are labeled with like reference characters, an alternative magnetic field sensor 540 of a form similar to the sensor 10 of FIG. 1 includes semiconductor die 14 having a first, active surface 14*a* in which a magnetic field sensing element or transducer 22 is formed and a second, opposing surface 14*b* attached to a die attach area on a first surface of a lead frame 18, a non-conductive, typically non-ferromagnetic, mold material 20 enclosing the die and at least a portion of the lead frame, and a ferromagnetic mold material 30 secured to the non-conductive mold material.

Figure 21A:
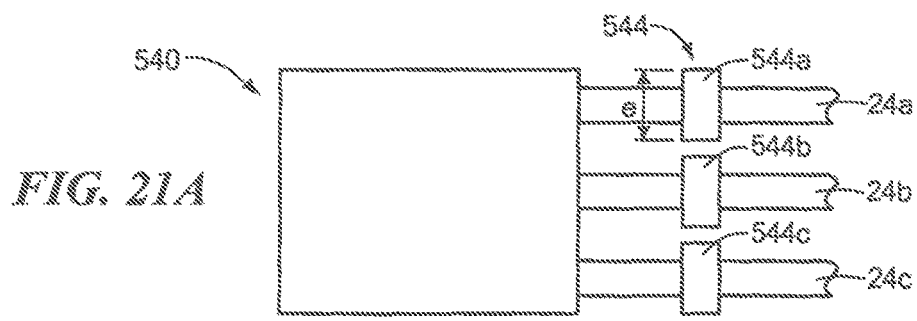
FIG. 21A plan view of the magnetic field sensor of FIG. 21.

Referring also to the top view of the sensor 540 in FIG. 21A, lead frame 18 has a plurality of leads 24*a*, 24*b*, and 24*c*. While three leads 24*a*-24*c* are shown, it will be appreciated that various numbers of leads are possible, such as between two and eight leads.

According to an aspect of the invention, the sensor 540 contains a suppression device 544. The suppression device 544 is provided in order to enhance the electromagnetic compatibility (EMC) of the sensor 540 and to reduce electrostatic discharge (ESD). To this end, the suppression device 544 comprises a ferromagnetic material.

The suppression device 544 may be provided in various geometries (i.e., size and shape), at various locations of the sensor, and may be fabricated by various techniques, including molding. Most generally, the suppression device 544 is integral with the sensor 540.

The molded ferromagnetic suppression device 544 is positioned to enclose a portion of one or more leads at a location on the respective lead(s) spaced from the non-conductive mold material 20. The particular location of the suppression device 544 along the length of the lead can be readily varied and may be a function of whether the leads will be bent for assembly for example.

The suppression device 544 comprises a ferromagnetic mold material, that may be the same as or similar to the ferromagnetic mold material 30. Due to the placement of suppression device 544 on the leads, the mold material comprising the device 544 must be of sufficient resistivity to prevent unwanted electrical signals from being passed between the leads. The molded ferromagnetic suppression device 544 may be comprised of a hard or permanent magnetic material. In some embodiments it may be desirable to align hard ferromagnetic particles during molding to form a more anisotropic or directional magnetic material by molding in the presence of a magnetic field; whereas, in other embodiments, a sufficient ferromagnetic material may result without an alignment step during molding for isotropic materials. It will be appreciated that a NdFeB or a SmCo alloy may contain other elements to improve temperature performance, magnetic coercivity, or other magnetic properties useful to a magnetic design.

In other embodiments, the suppression device 544 is comprised of a soft ferromagnetic material. In some embodiments, it may be desirable for the molded soft ferromagnetic element 544 to have a relatively low coercivity and high permeability. Suitable soft ferromagnetic materials include, but are not limited to permalloy, NiCo alloys, NiFe alloys, steel, nickel, and soft ferromagnetic ferrites. As described above for hard ferromagnetic materials, it may also be desirable to form a soft ferromagnetic suppression device 544 in the presence of a magnetic field for a more anisotropic ferromagnetic material. In another embodiment it may be desirable to form an isotropic soft ferromagnetic suppression body without using a magnetic field applied during molding.

The molded suppression device 544 may be formed at the same time and with the same fabrication technique as the ferromagnetic mold material 30, such as in step 222 of FIG. 8 or in step 236 of FIG. 8A for example, in which case such process steps additionally serve to form the molded ferromagnetic suppression device so as to enclose a portion of at least one lead. Alternatively, the molded suppression device 544 may be formed at a different time and/or with a different fabrication technique as the ferromagnetic mold material 30.

The suppression device 544 extends from the lead 24*a* in a first direction (e.g., above the lead) by a height "a" and extends from the lead 24*a* in a second direction (e.g., below the lead) by a height "b". Here, the heights a and b are shown to be approximately the same; however, it will be appreciated that this need not be the case. Thus, the overall height of the suppression device 544 is a+b, additionally plus the thickness of the lead. This overall height of the suppression device may be (but is not required to be) less than the overall height of the non-conductive mold material 20 (given by heights c+d, additionally plus the thickness of the lead), so that the suppression device does not extend beyond the main package body defined by mold material 20 alone or in combination with mold material 30.

Figure 21B:
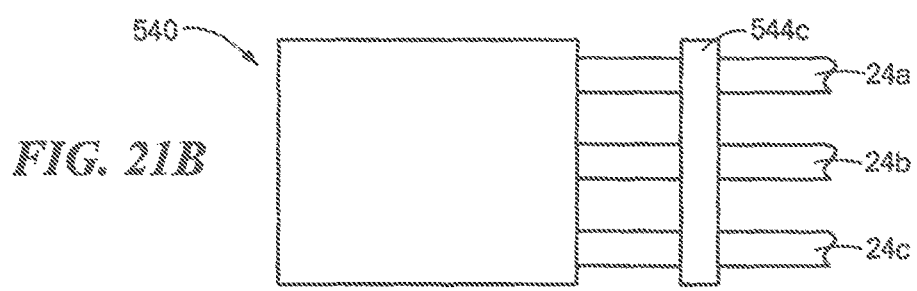
FIG. 21B is a plan view of the magnetic field sensor of FIG. 21 showing an alternative molded ferromagnetic suppression device.

Referring also to the top view of FIG. 21A, the suppression device 544 may comprise a plurality of individual molded ferromagnetic devices 544*a*, 544*b*, 544*c*, each enclosing a portion of a respective lead 24*a*, 24*b*, and 24*c* and each having a width "e" selected to ensure a nominal spacing between adjacent devices and/or leads. Alternatively, and as shown in the alternative top view of FIG. 21B, the suppression device 544 may be provided in the form of a shared molded device formed to enclose a portion of more than one lead, and here all three leads 24*a*, 24*b*, and 24*c*. It will be appreciated by those of ordinary skill in the art that in embodiments in which the suppression device 544 encloses a portion of more than one lead, the mold material comprising the device 544 is a non-conductive or high resistivity ferrite type of soft or hard ferromagnetic material or other high resistivity ferromagnetic material. Furthermore, it will be appreciated that a combination of individual molded ferromagnetic devices enclosing a portion of a single respective lead and shared molded ferromagnetic devices enclosing a portion of more than one lead is also possible.

Figure 22:
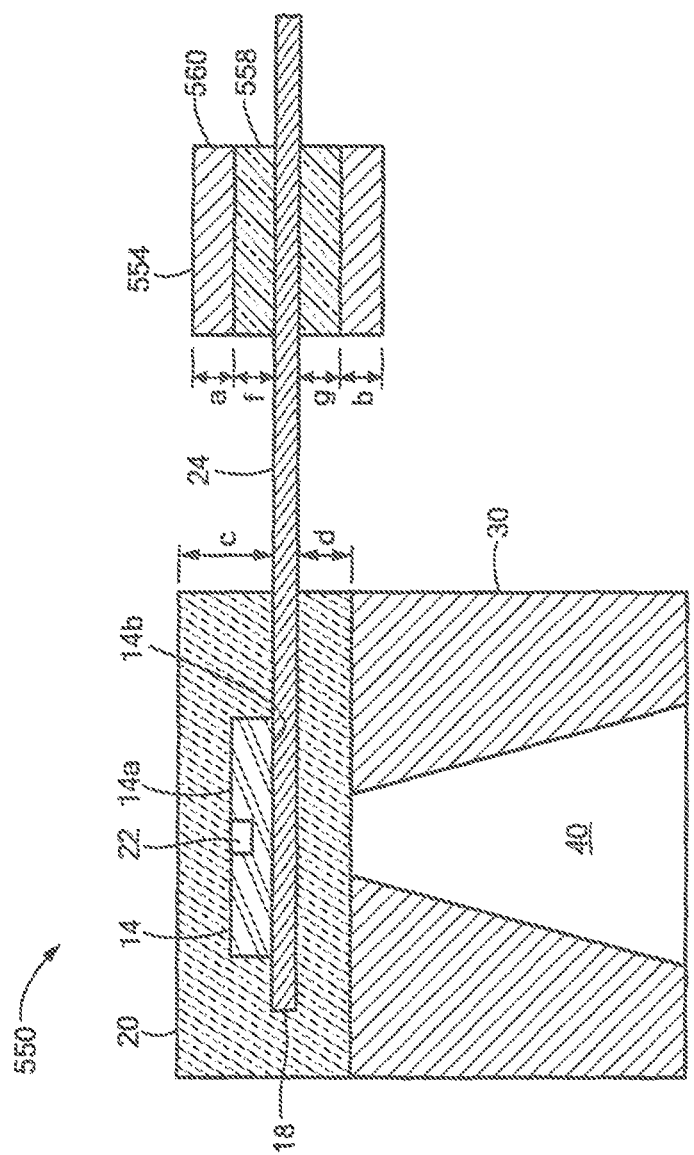
FIG. 22 is a side cross-sectional view of a magnetic field sensor having a non-conductive mold material, a ferromagnetic mold material, and an alternative molded ferromagnetic suppression device enclosing a portion of a lead.

Referring also to FIG. 22, in which like elements to FIG. 1 are labeled with like reference characters, an alternative magnetic field sensor 550 of a form similar to the sensor 10 of FIG. 1 includes semiconductor die 14 having a first, active surface 14a in which a magnetic field sensing element or transducer 22 is formed and a second, opposing surface 14b attached to a die attach area on a first surface of a lead frame 18, a non-conductive mold material 20 enclosing the die and at least a portion of the lead frame, and a ferromagnetic mold material 30 secured to the non-conductive mold material. The lead frame 18 has a plurality of leads (represented in FIG. 22 by illustrative lead 24) and the sensor 540 contains an alternative molded ferromagnetic suppression device 554.

Suppression device 554 comprises a first mold element 558 and a second mold element 560. The first mold element 558 encloses a portion of at least one lead and the second mold element 560 encloses at least a portion of the first mold element.

The first mold element 558 may be the same as or similar to the non-conductive mold material 20 and thus, may comprise thermoset and thermoplastic mold compounds and other commercially available IC mold compounds. It will be appreciated that the first mold element 558 can contain a ferromagnetic material, such as in the form of ferromagnetic particles, as long as such material is non-conductive. The second mold element 560 of the suppression device 554 may be the same as or similar to the ferromagnetic mold material 30 as discussed above or may be comprised of a soft ferromagnetic material. And a third mold element may also be provided.

The first and second mold elements 558, 560 may be fabricated by the same or different techniques and at the same or a different time as the non-conductive and ferromagnetic mold materials 20, 30, respectively, and as each other. In one embodiment, the first mold element 558 is formed by transfer molding at the same time as the non-conductive mold material 20 (e.g., in step 216 of FIG. 8 or in step 244 of FIG. 8A) and the second mold element 560 is formed by injection molding at the same time as the ferromagnetic mold material 30 (e.g., in step 222 of FIG. 8 or in step 236 of FIG. 8A). Benefits of using the first, non-conductive mold element 558 may include eliminating any electrical performance degradation or changes that may result from the second, ferromagnetic mold element 560 contacting the lead and/or reducing stress on the lead due to the fabrication technique by which the ferromagnetic mold element 560 is formed (e.g., injection molding).

While the second mold element 560 is shown to be spaced from and not in contact with the lead 24, it will be appreciated by those of ordinary skill in the art that in certain embodiments, it may be desirable to allow the second mold element to contact the lead. In fact, if the second mold element 560 is sufficiently non-conductive, so as not to undesirably alter the electrical performance of the lead, then the second molded element can enclose the first mold element 558 and thus contact the lead.

The suppression device 554 extends from the lead 24 in a first direction (e.g., above) by a height f+a (the height of the first and second mold elements, respectively) and extends from the lead 24 in a second direction (e.g., below) by a height g+b (the height of the first and second mold elements, respectively). Here, the heights a and b are shown to be approximately the same as each other and the heights f and g are shown to be approximately the same as each other; however, it will be appreciated that this need not be the case. In other words, the first and/or second mold element can extend in one direction from the lead more than in another direction. Also, in the illustrated embodiment, while the thickness of the first mold element 558 is shown to be approximately the same as the thickness of the second mold element, this need not be the case.

The overall height of the suppression device 554 (i.e., a+b+f+g, additionally plus the thickness of the lead) may be (but is not required to be) less than the overall height of main package body defined by the height of the mold material 20 in combination with the height of the mold material 30.

Figure 23:
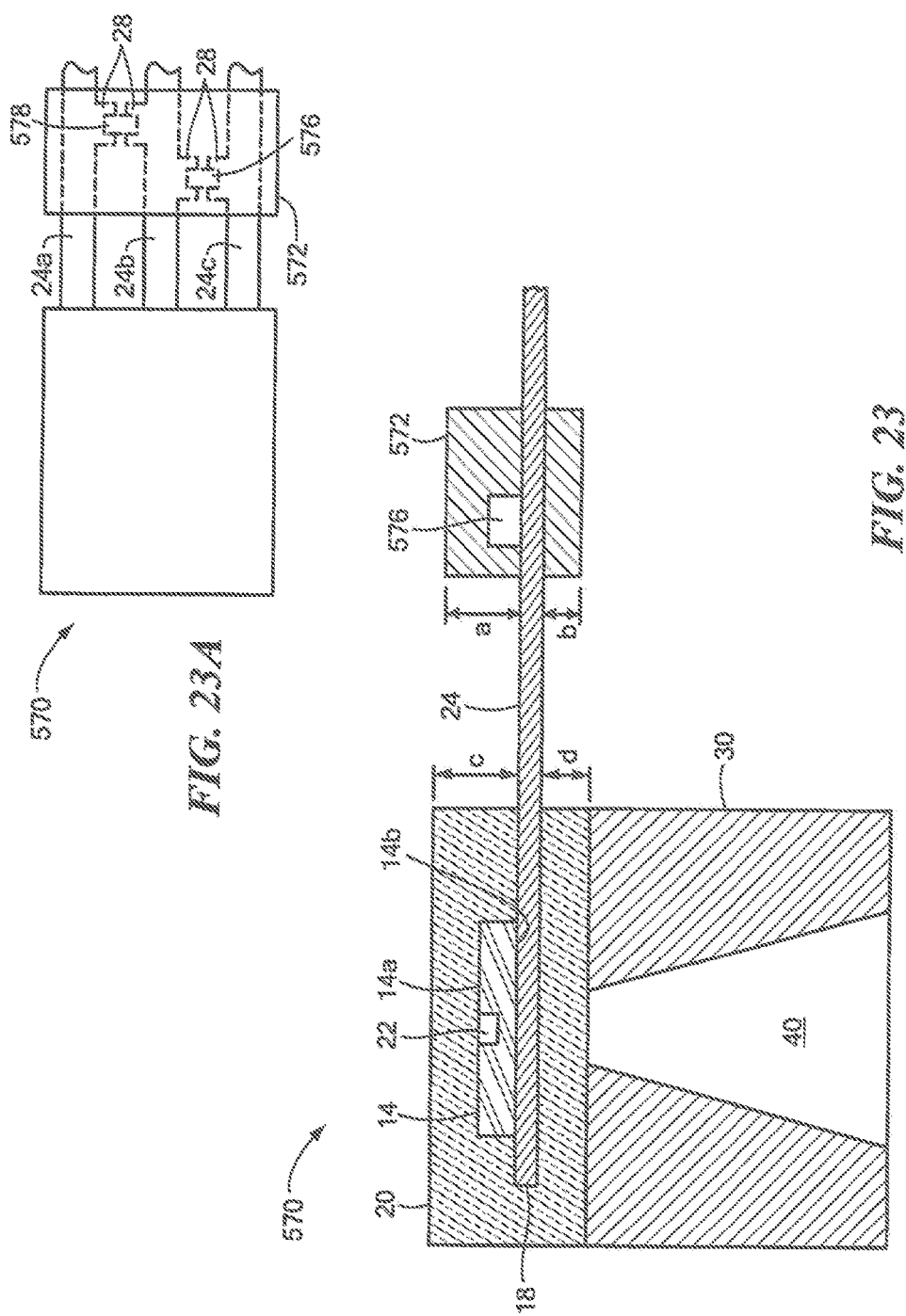
FIG. 23 is a side cross-sectional view of a magnetic field sensor having a non-conductive mold material, a ferromagnetic mold material, and molded ferromagnetic suppression device enclosing a passive component and a portion of a lead.

Referring to FIG. 23 and according to a further aspect of the invention, a magnetic field sensor 570 is provided with a molded ferromagnetic suppression device 572 enclosing a passive component 576. The sensor 570 is of a form similar to the sensor 10 of FIG. 1, in which like elements are labeled with like reference characters, and includes semiconductor die 14 having a first, active surface 14a in which a magnetic field sensing element or transducer 22 is formed and a second, opposing surface 14b attached to a die attach area on a first surface of a lead frame 18, a non-conductive mold material 20 enclosing the die and at least a portion of the lead frame, and a ferromagnetic mold material 30 secured to the non-conductive mold material.

As is known and described in the above-referenced U.S. Patent Application Publication No. US-2012-0086090-A1, it is sometimes desirable to integrate one or more passive components, such as capacitors, resistors, inductors, on an integrated circuit lead frame for filtering and/or other functionality. The passive component 576, such as a surface mount capacitor, may be fabricated by techniques described in the above-referenced U.S. Patent Application Publication No. US-2012-0086090-A1.

The suppression device 572 may comprise a ferromagnetic mold material that is the same as or similar to the ferromagnetic mold material 30 and that may be formed at the same or at a different time than the ferromagnetic mold material 30 and/or by the same or a different fabrication technique. In one embodiment, the molded ferromagnetic suppression device 572 is formed by an injection molding process at the same time that the ferromagnetic mold material 30 is formed. The mold material comprising the device 572 must be of sufficient resistivity to prevent unwanted electrical signals from being passed between the leads.

In another embodiment, the element 572 may be made of the same material and at the same time as the non-conductive mold material 20. The pressure of molding is generally lower for transfer molding compared to injection molding and therefore the lower pressure of the molding process during molding of the non-conductive mold material 20 at the same time as suppression device 572 may be desirable for reliability of the attachment of the passive component 576 to the lead frame 24.

The molded device 572 is sized and shaped to enclose the passive component(s) 576, as shown. The suppression device 572 extends from the lead 24a in a first direction (e.g., above) by a height "a" and extends from the lead 24a in a second direction (e.g., below) by a height "b". Here, the heights a and b are shown to be somewhat different, with the height a being greater than the height b to enclose the passive component 576; however, it will be appreciated that the heights a and b may be substantially the same as long as the height a is sufficient to enclose the passive component. The overall height of the suppression device 572 of a+b, additionally plus the thickness of the lead, may be (but is not required to be) less than the overall height of the non-conductive mold material 20 (given by heights c+d, additionally plus the thickness of the lead), so that the suppression device 572 does not extend beyond the main package body defined by mold material 20 alone or in combination with mold material 30. The passive element 576 is shown on the same side of the lead frame as the die 14, but in another embodiment the capacitor could be on the opposite side of the lead frame. In such an embodiment the distance a may be smaller than the distance b shown in FIG. 23 from the lead frame.

Referring also to the top view of sensor 570 in FIG. 23A, in the illustrative embodiment, leads 24a, 24b, and 24c have extended regions 28 to facilitate coupling one or more passive components 576, 578 between respective pairs of leads, as shown, such as by soldering or conductive adhesive or conductive epoxy. Alternatively, and as shown in the alternative top view of FIG. 23B, the extended regions 28 of the leads may be omitted and the passive component(s) may be coupled directly across respective pair(s) of leads, as shown. The arrangement of FIG. 23B can result in a smaller molded ferromagnetic suppression device 572 because the passive components 576 and 578 are not offset from each other as in the embodiment of FIG. 23A. More particularly, in the arrangement of FIG. 23B, the passive components 576 and 578 are positioned across respective pairs of leads 24a, 24b and 24b, 24c in parallel with one another, thereby enabling the width "W" of the molded element 572 to be smaller than the like dimension of the molded element 572 shown in FIG. 23A. It will be appreciated by those of ordinary skill in the art that while the suppression device 572 here encloses passive devices 576 and 578; alternatively, the device may comprise multiple molded devices, each of which encloses one or more respective passive component(s) and lead portion(s).

Figure 24:
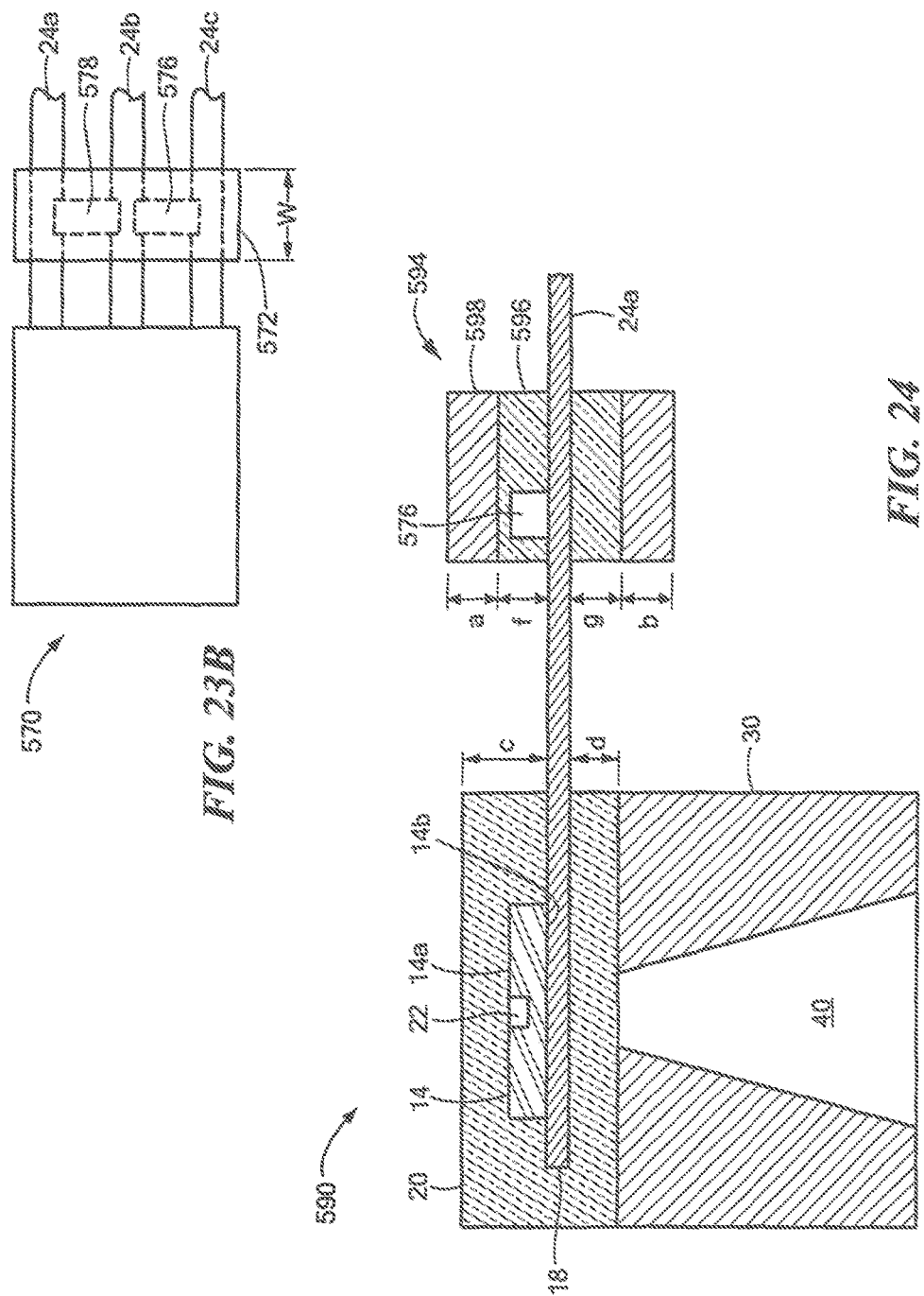
FIG. 24 is side a cross-sectional view of an alternative magnetic field sensor having a non-conductive mold material, a ferromagnetic mold material, and molded ferromagnetic suppression device enclosing a passive component and a portion of a lead.

Referring to FIG. 24, in which like elements to FIG. 1 are labeled with like reference characters, an alternative magnetic field sensor 590 of a form similar to the sensor 10 of FIG. 1 includes semiconductor die 14 having a first, active surface 14a in which a magnetic field sensing element or transducer 22 is formed and a second, opposing surface 14b attached to a die attach area on a first surface of a lead frame 18, a non-conductive mold material 20 enclosing the die and at least a portion of the lead frame, and a ferromagnetic mold material 30 secured to the non-conductive mold material. The lead frame 18 includes a plurality of leads (represented in FIG. 24 by illustrative lead 24a) and the sensor 590 contains an alternative molded ferromagnetic suppression device 594.

The suppression device 594 encloses one or more passive components, here represented by capacitor 576, as well as one or more mold elements, here a first mold element 596 and a second mold element 598. The first mold element 596 encloses at least one passive component 576 and a portion of the leads to which the passive component is coupled and the second mold element 598 encloses at least a portion of the first mold element.

The first mold element 596, like the mold element 558 of FIG. 22, may comprise a non-conductive material that may be the same as or similar to the non-conductive mold material 20 and thus, may comprise thermoset and thermoplastic mold compounds and other commercially available IC mold compounds. It will be appreciated that the first mold element 596 can contain a ferromagnetic material, such as in the form of ferromagnetic particles, as long as such material is sufficiently non-conductive. The second mold element 598 of the suppression device 594, like mold element 560 of FIG. 22, may be the same as or similar to the ferromagnetic mold material 30 as discussed above.

In another embodiment, element 598 may be formed during a third molding process to allow a soft ferromagnetic material to be used for 598 when element 30 is made of a hard ferromagnetic material and body 20 is made of a non-conductive material, which is either ferromagnetic or not ferromagnetic.

The first and second mold elements 596, 598 may be fabricated by the same or different techniques and at the same or a different time than the non-conductive and ferromagnetic mold materials 20, 30, respectively, and as each other. In one embodiment, the first mold element 596 is formed by transfer molding at the same time as the non-conductive mold material 20 (e.g., in step 216 of FIG. 8 or in step 244 of FIG. 8A) and the second mold element 598 is formed by injection molding at the same time as the ferromagnetic mold material 30 (e.g., in step 222 of FIG. 8 or in step 236 of FIG. 8A). Benefits of using the first, non-conductive mold element 596 may include eliminating any electrical performance degradation or changes that may result from the second, ferromagnetic mold element 598 contacting the lead and/or reducing stress on the lead due to the fabrication technique by which the ferromagnetic mold element 598 is formed (e.g., injection molding).

In the case where a third mold is used to form element 598, the third mold material may be of a soft ferromagnetic mold material and formed at a different time than the injection mold of element 30. This third mold step does not have to be third in sequence as it could occur after the molding of non-conductive mold material 20 but before the molding of ferromagnetic mold material 30. Although in many cases the third mold material would be a soft ferromagnetic material, in other embodiments this third mold material may be a hard ferromagnetic material as well.

While the second mold element 598 is shown to be spaced from and not in contact with the lead 24, it will be appreciated by those of ordinary skill in the art that in certain embodiments, it may be desirable to allow the second mold element to contact the lead. In fact, if the second mold element 598 is sufficiently non-conductive, so as not to undesirably alter the electrical performance of the lead, then the second molded element can enclose the first mold element 596 and thus contact the lead.

The suppression device 594 extends from the lead 24a in a first direction (e.g., above) by a height f+a (the height of the first and second mold elements, respectively) and extends from the lead 24 in a second direction (e.g., below) by a height g+b (the height of the first and second mold elements, respectively). Here, the heights a and b are shown to be approximately the same as each other and the heights f and g are shown to be approximately the same as each other; however, it will be appreciated that this need not be the case. The height a is selected to enclose the passive component 576. Also, in the illustrated embodiment, while the thickness of the first mold element 596 is shown to be approximately the same as the thickness of the second mold element, this need not be the case.

The overall height of the suppression device 594, a+b+f+g, additionally plus the thickness of the lead, may be (but is not required to be) less than the overall height of the main package body defined by the height mold material 20 in combination with the height of the mold material 30.

Figure 25:
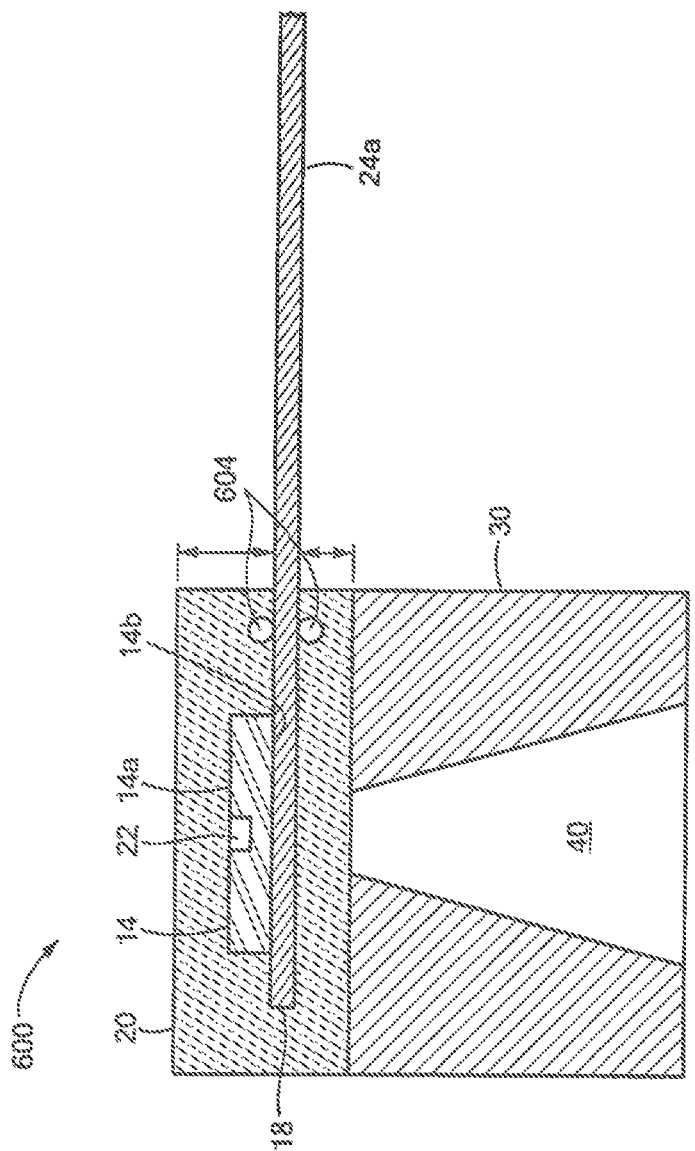
FIG. 25 is a side cross-sectional view of a magnetic field sensor having a non-conductive mold material, a ferromagnetic mold material, and molded ferromagnetic suppression device enclosing a ferrite bead and a portion of a lead.

Referring to FIG. 25, in which like elements to FIG. 1 are labeled with like reference characters, an alternative magnetic field sensor 600 of a form similar to the sensor 10 of FIG. 1 includes semiconductor die 14 having a first, active surface 14a in which a magnetic field sensing element or transducer 22 is formed and a second, opposing surface 14b attached to a die attach area on a first surface of a lead frame 18, a non-conductive mold material 20 enclosing the die and at least a portion of the lead frame, and a ferromagnetic mold material 30 secured to the non-conductive mold material. The lead frame 18 has a plurality of leads (represented in FIG. 25 by illustrative lead 24) and the sensor 600 contains an alternative suppression device 604.

Suppression device 604 is provided in the form of a ferromagnetic bead that is inserted over or around the lead 24 during manufacture, prior to fabrication of the non-conductive mold material 20 so that the bead is enclosed by the non-conductive mold material, as shown.

The bead 604 has a central aperture that is sized to fit over the lead 24. The bead may be deformable and have a central aperture dimension selected to result in a slight compression fit with respect to the lead. With this arrangement, during manufacture, the bead can be slipped onto the lead 24 and slid or pushed along the length of the lead to a location close to the die 14. The compression fit results in the lead remaining in place at the location close to the die in order to facilitate molding of the non-conductive mold material 20 over a portion of the lead frame, the die, and the bead.

The bead may be sphere or tubular shaped as examples and may be symmetrical with respect to its central aperture so as to have a substantially circular cross-section or alternatively, the bead may be offset with respect to its central aperture and may have an alternative cross-section, such as an oval or rectangular cross-section.

The overall diameter of the suppression device 604 is selected to provide desired EMC and EMI performance, as a function of the sensor type and application and the ferromagnetic material comprising the bead. Suitable materials for the ferromagnetic bead include but are not limited to soft ferrite materials.

Figure 26:
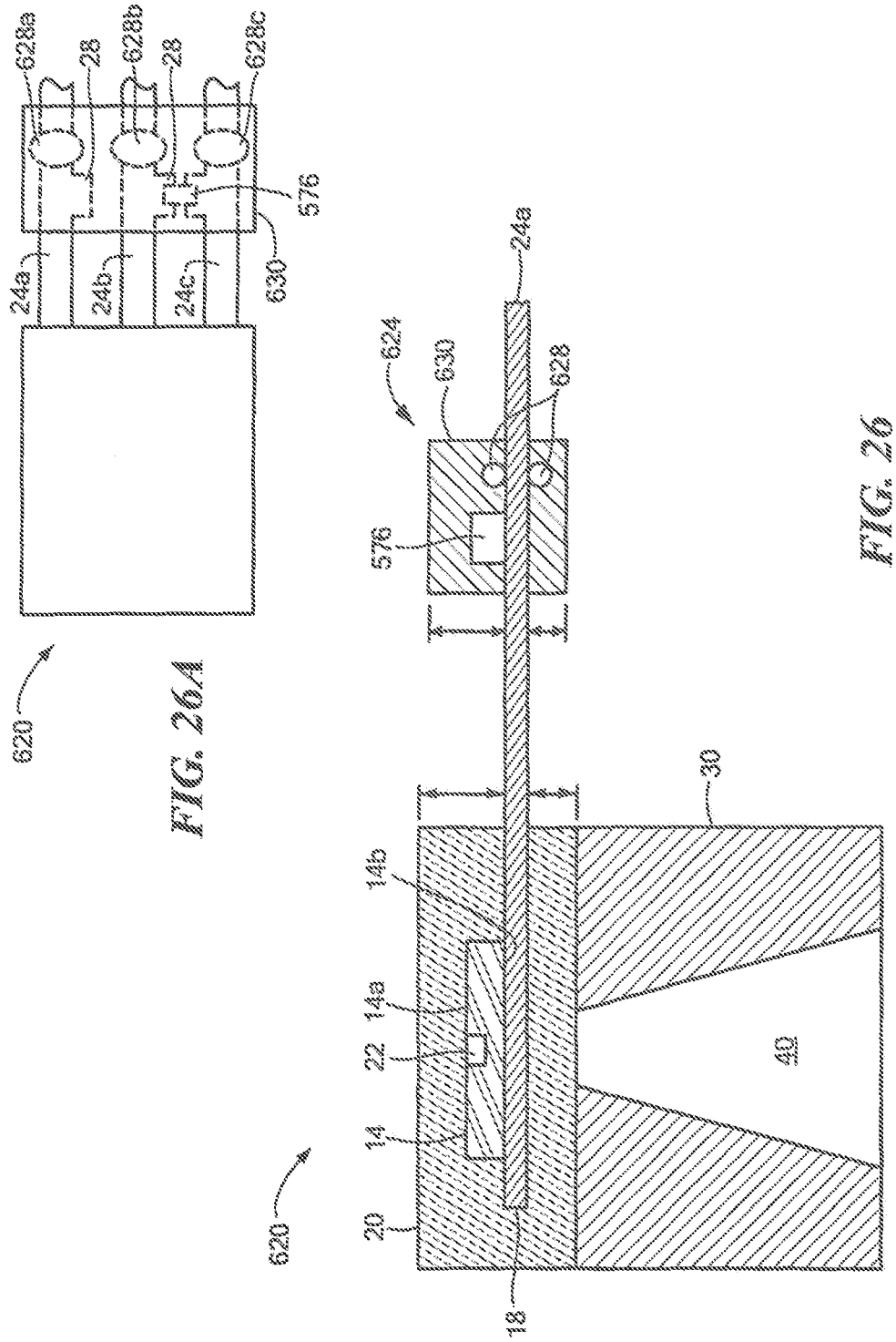
FIG. 26 is a side cross-sectional view of a magnetic field sensor having a non-conductive mold material, a ferromagnetic mold material, and molded ferromagnetic suppression device enclosing a passive component, a ferrite bead, and a portion of a lead.

Referring to FIG. 26, in which like elements to FIG. 1 are labeled with like reference characters, an alternative magnetic field sensor 620 of a form similar to the sensor 10 of FIG. 1 includes semiconductor die 14 having a first, active surface 14a in which a magnetic field sensing element or transducer 22 is formed and a second, opposing surface 14b attached to a die attach area on a first surface of a lead frame 18, a non-conductive mold material 20 enclosing the die and at least a portion of the lead frame, and a ferromagnetic mold material 30 secured to the non-conductive mold material. Referring also to the top view of the sensor 620 in FIG. 26A, lead frame has a plurality of leads 24a, 24b, and 24c and the sensor 620 contains an alternative suppression device 624.

Suppression device 624 encloses one or more passive components, such as capacitor 576, and comprises one or more ferromagnetic beads 628 and a mold element 630. The passive component 576 may be the same as or similar to the passive component 576 of FIG. 23. The ferromagnetic bead 628 may be the same as or similar to the bead 604 of FIG. 25.

The mold element 630 may be the same as or similar to the non-conductive mold material 20 for example. Here however, the mold element 630 is sized and shaped to enclose the passive component 576 and bead 628 as shown. Considerations affecting the height and width of the mold element 630 can be the same as or similar to considerations discussed above.

The mold element 630 may be fabricated by the same or a different technique and at the same or a different time than the non-conductive mold material 20. As an alternative, the mold element 630 may be the same as or similar to the ferromagnetic mold material 30, or may be of a third mold material, for example comprising a soft ferromagnetic material as described above.

Referring also to the top view of FIG. 26A, leads 24b and 24c across which the passive component 576 is coupled have extended regions 28 to facilitate securing the component 576 in place, such as by soldering or with a conductive adhesive or conductive epoxy. The extended regions 28 may also be added to leads, on one or both sides of the lead 24a for example, without passive components but with a ferromagnetic bead 628a to allow positioning of the ferromagnetic bead at a predetermined position on the lead or leads. The extended regions 28 on leads 24b and 24c that are used for attachment of the passive component 576 may also be used to assist in the placement of the bead 628b, 628c along the length of the respective lead. The sensor 620 is here shown to have three ferromagnetic beads 628a, 628b, and 628c, each associated with and secured around a respective lead 24a, 24b, and 24c, as shown. It will be appreciated by those of ordinary skill in the art however that more or fewer beads and passive components may be desirable to suit a particular sensor type/application. It will also be appreciated that one or more of the beads 628a-628c may be positioned at a different location along the respective lead, such as close to the die 14 (provided the extension 28 is not present or does not prevent positioning of the bead closer to the die) so as to be enclosed in the main sensor body 20 (similar to the arrangement in FIG. 25 for example). Furthermore, more than one bead can be secured to the same lead. In an embodiment an adhesive material may be used to secure the bead to a lead prior to the molding step of the mold element 630.

Figure 27:
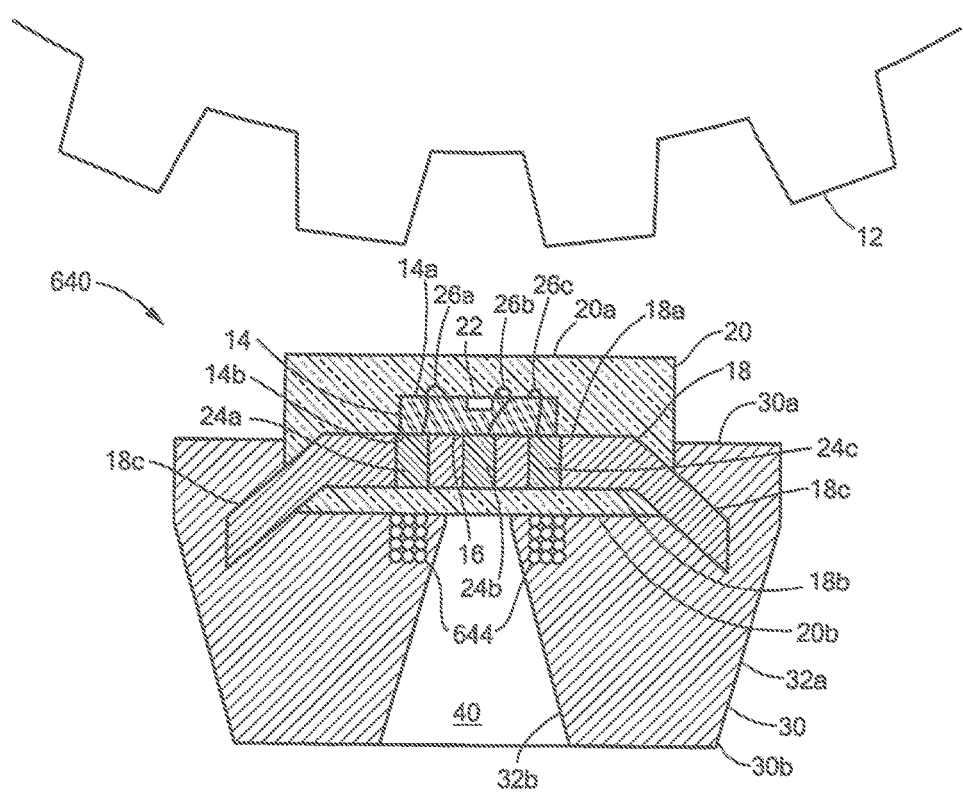
FIG. 27 is a cross-sectional view of a magnetic field sensor having a non-conductive mold material, a coil, and a ferromagnetic mold material.

Referring to FIG. 27, in which like elements to FIG. 1 are labeled with like reference characters, an alternative magnetic field sensor 640 of a form similar to the sensor 10 of FIG. 1 includes semiconductor die 14 having a first, active surface 14a in which a magnetic field sensing element or transducer 22 is formed and a second, opposing surface 14b attached to a die attach area 16 on a first surface 18a of a lead frame 18, a non-conductive mold material 20 enclosing the die and at least a portion of the lead frame, and a mold material 30 secured to the non-conductive mold material, here with a securing mechanism in the form of barbs 18c.

According to an aspect of the invention, the sensor 640 includes a conductive coil 644. Coils are used in magnetic field sensors for various reasons, for example to generate a magnetic field for diagnostic or self test functionality as described in a U.S. Patent Application No. 2010/00211347, for calibration as is described in a U.S. Pat. No. 8,030,918, and for resetting a GMR magnetic field sensing element as described in a U.S. Pat. No. 8,063,634, each of which is assigned to the Assignee of the subject application and incorporated herein by reference in its entirety. In many instances, such conductive coils are formed on the semiconductor die itself.

The illustrative coil 644 on the other hand is positioned relative to the magnetic field sensing element 22 to function as a back bias magnet, so as to provide a magnetic field which can be used to detect movement of a proximate target. To this end, the coil 644 is positioned adjacent to the second surface 20b of the non-conductive mold material 20 so that the transducer 22 is closer to the target 12 than the coil 644, as shown. Here again, it will be appreciated that it may be desirable in certain applications to rotate the sensor 640 by 180° so that the coil 644 is closer to the target than the transducer or to rotate the sensor by 90° so that the major face of the transducer is orthogonal to the target, thereby achieving a different type of magnetically sensitive sensor, as may be desirable when the transducer is a magnetoresistance element for example which has a different axis of sensing element sensitivity than a planar Hall element. It may also be desirable in an embodiment to rotate coil 644 such that its central axis is parallel to the surface of the die 14 for certain sensor configurations and sensing element combinations.

Various techniques and materials can be used to form the coil 644. For example, the coil can be formed from copper wire of various sizes and with various automated processes so as to provide an insulator between coil windings. The coil material selection, wire gauge selection, number of turns, and other design choices can be readily varied to suit a particular application so as to produce a magnetic field of a desired strength. The coil 644 may be formed so that each turn is in the shape of a circle, rectangle, or other shapes such as an oval, as desirable to suit a particular application and packaging arrangement.

The coil 644 may be secured to the second surface 20b of the non-conductive mold material 20 by various means. As one example, an adhesive, such as an epoxy, may be used to secure the coil in place. Once secured in place, the mold material 30 may be formed in the manner described above, such as by injection molding for example. More particularly, in accordance with the illustrative process of FIG. 8 for example, step 218 may be modified such that after the subassembly, comprising the die and lead frame, is removed from the mold cavity, the coil 644 is attached to the mold material surface 20b before the subassembly is moved to the second mold cavity for formation of the mold material 30. With this arrangement, the mold material 30 can flow into the center of the coil, as shown.

In operation, a bias current is applied to the coil 644 which causes a bias magnetic field to be generated. The transducer 22 is responsive to perturbations in the magnetic field caused by movement of the target 12. It will be appreciated by those of ordinary skill in the art that the mold material 30 can be provided in the form of a hard ferromagnetic material, a soft ferromagnetic material, or even a non-conductive material. For example, in embodiments in which the material 30 is a soft ferromagnetic material, the magnetic field generated by the coil 644 can be focused or otherwise concentrated as desired by the soft ferromagnetic mold material 30. Alternatively, in embodiments in which the material 30 is a hard ferromagnetic material, the magnetic field provided by the coil 644 can be used to modulate the magnetic field provided by the hard ferromagnetic material 30, in order to thereby reduce the peak current otherwise required to provide the same peak value of magnetic field strength when compared to the case of the coil alone (i.e., if the hard ferromagnetic mold material 30 were not present). In another embodiment, a separately formed element such as element 514 of FIG. 19 may be disposed in the central aperture 40.

Figure 29:
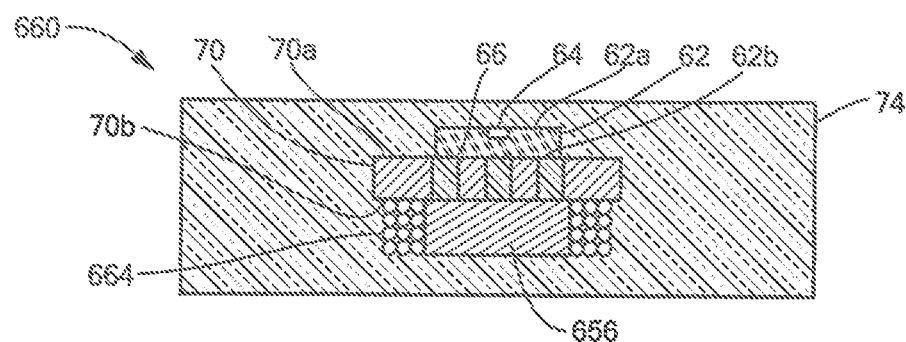
FIG. 29 is a cross-sectional view of another alternative magnetic field sensor having a non-conductive mold material and a coil.
Figure 1B:
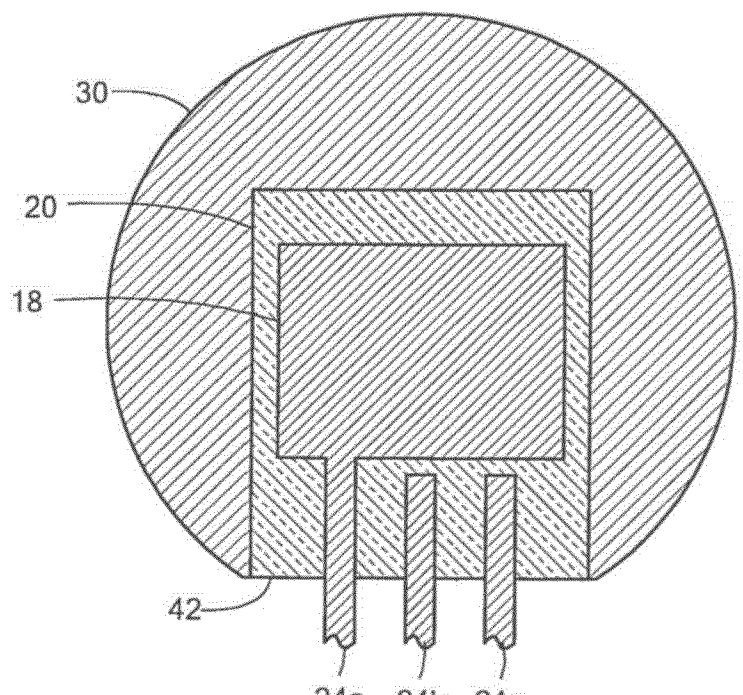
Figure 1C:
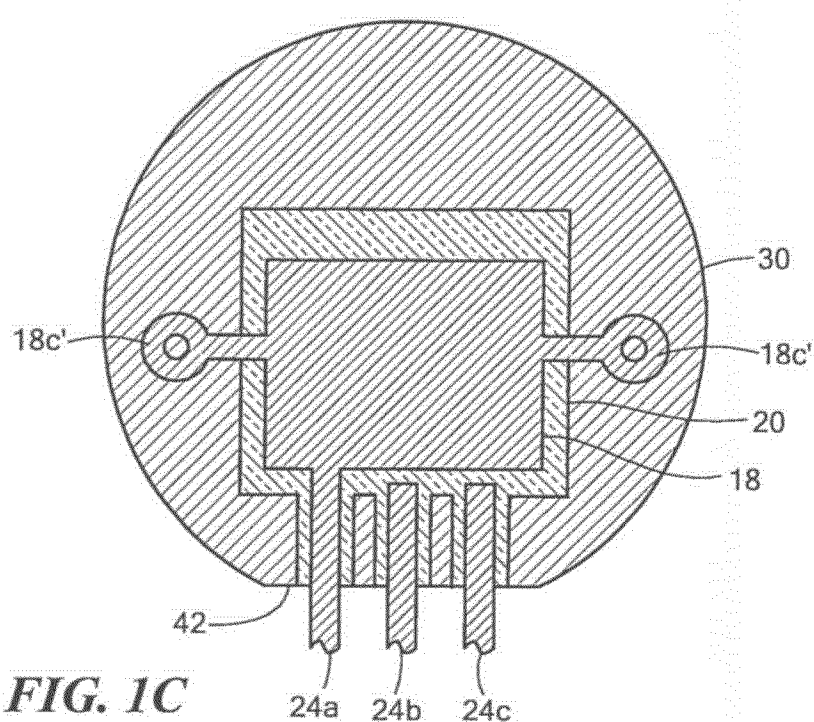
Figure 8A:
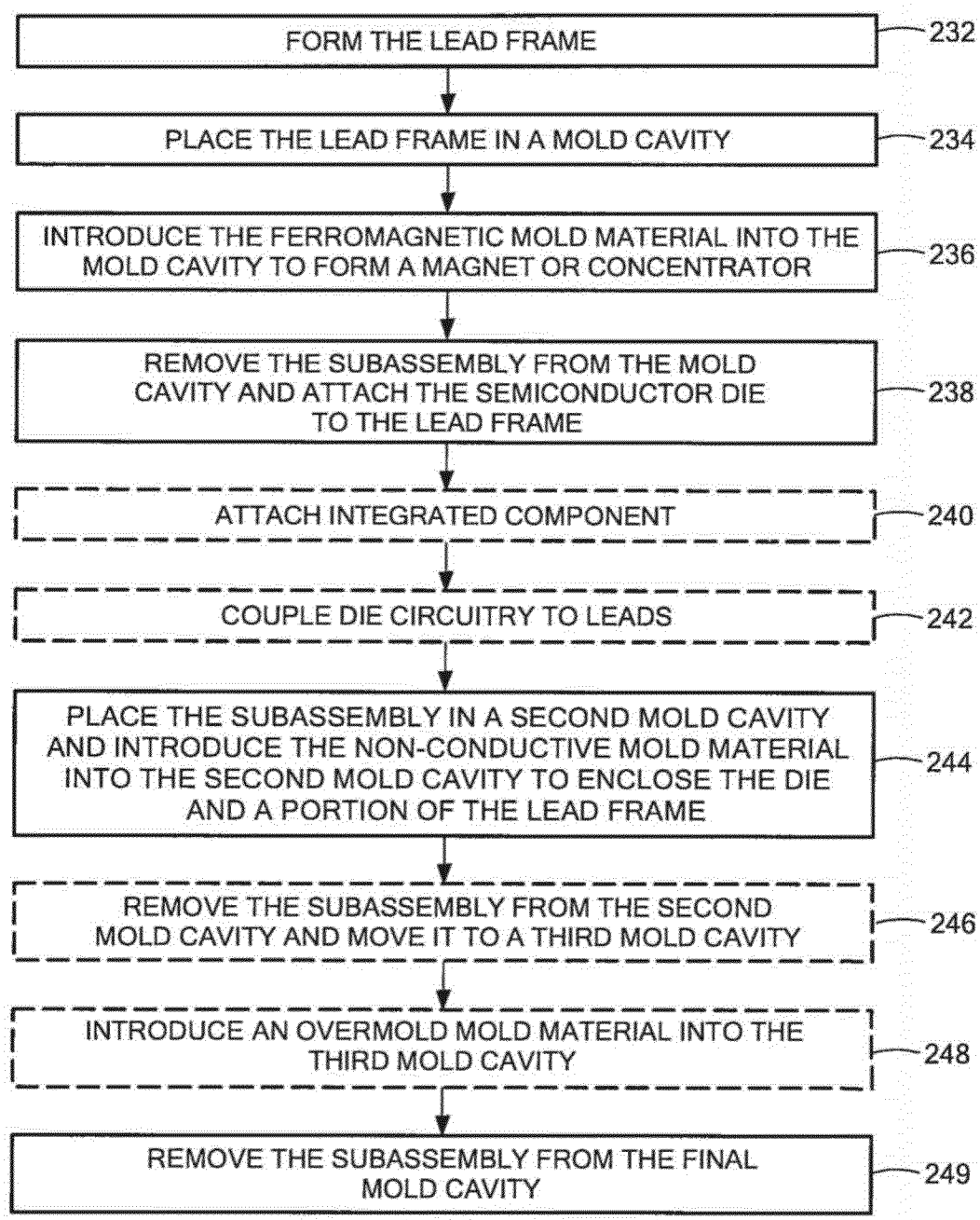

In some embodiments, since the back bias functionality is provided by the coil, the mold material 30 may be eliminated entirely (as is shown in FIG. 29) in which case the non-conductive mold material 20 with the coil 644 attached to its second surface 20b can be packaged to provide the resulting sensor IC. Such an arrangement can be provided in a package of the type described in a U.S. Pat. No. 6,265,865 or a U.S. Pat. No. 5,581,179, each of which is assigned to the Assignee of the subject application and incorporated herein by reference in its entirety.

Figure 28:
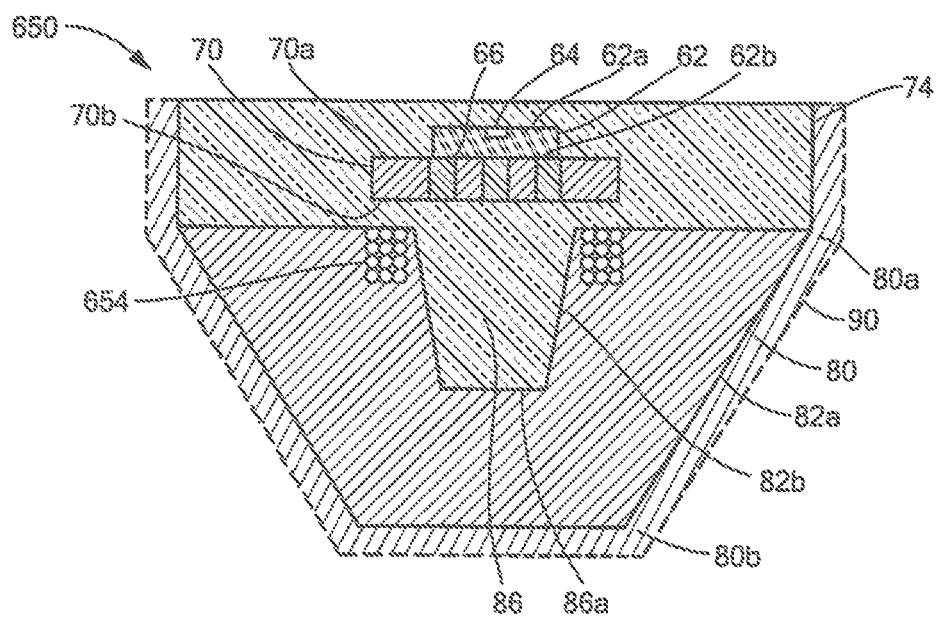
FIG. 28 is a cross-sectional view of an alternative magnetic field sensor having a non-conductive mold material, a coil, and a ferromagnetic mold material.

Referring also to FIG. 28, in which like elements to FIG. 3A are labeled with like reference characters, an alternative magnetic field sensor 650 of a form similar to the sensor 60 of FIG. 3A includes a semiconductor die 62 having a first active surface 62a in which a magnetic field sensing element 64 is disposed and a second, opposing surface 62b attached to a die attach area 66 on a first surface 70a of a lead frame 70, a non-conductive mold material 74 enclosing the die and at least a portion of the lead frame, and a mold material 80 secured to a portion of the non-conductive mold material.

The non-conductive mold material 74 has a protrusion 86 extending away from a second surface 70b of the lead frame 70 as shown. As explained above, the protrusion 86 prevents there being a void in the bottom surface of the sensor 650 (adjacent to the second end 80b of the ferromagnetic mold material), since the presence of a void may make overmolding more difficult. It will be appreciated by those of ordinary skill in the art that the protrusion may extend all or only part of the way to the second end 80b of the mold material.

The sensor 650 includes a coil 654 that may be the same as or similar to the coil 644 of FIG. 27. Here, the coil 654 is positioned concentrically with respect to the protrusion 86 of the non-conductive mold material 74, although it will be appreciated that concentric positioning is not required. It will be appreciated that the taper to the protrusion 86 may be eliminated or altered as suitable for a particular application. Here again, the coil 654 may be secured to the mold material 74 by an adhesive. Alternatively however, the coil 654 may be sized and shaped to provide an interference fit with respect to the protrusion 86 such that adhesive is not necessary and the coil 654 may be sufficiently held in place relative to the mold material 74 by the interference fit when the subassembly, including the mold material 74, lead frame 70 and die 62, are placed into the mold cavity for formation of the mold material 80 (e.g., in a modified step 218 of FIG. 8 in which the coil is placed over the protrusion 86 after the subassembly is removed from the first mold cavity and before it is placed into the second mold cavity).

While the sensor 650 is shown to have a protrusion 76 of the type shown in FIG. 3A, which protrusion extending only partially through the mold material 80 to terminate before the second end 80b of the mold material, it will be appreciated that a similar sensor including a coil that may be (although is not required to be) concentrically disposed with respect to a protrusion of the non-conductive mold material can be provided with a protrusion of the type shown in FIG. 3, which protrusion extends to the second end 80b of the mold material 80.

In operation, a bias current is applied to the coil 654 which causes a bias magnetic field to be generated. The transducer 64 is responsive to perturbations in the magnetic field caused by movement of a target. It will be appreciated by those of ordinary skill in the art that the mold material 80 can be provided in the form of a hard ferromagnetic material, a soft ferromagnetic material, or even a non-conductive material. For example, in embodiments in which the material 80 is a soft ferromagnetic material, the magnetic field generated by the coil 654 can be focused or otherwise concentrated as desired by the soft ferromagnetic mold material 80. Alternatively, in embodiments in which the material 80 is a hard ferromagnetic material, the magnetic field provided by the coil can be used to modulate the magnetic field provided by the hard ferromagnetic material 80, in order to thereby reduce the peak current otherwise required to provide the same magnetic field strength with just the coil (i.e., if the hard ferromagnetic mold material 80 were not present).

Here again, since the back bias functionality is provided by the coil, the mold material 80 may be eliminated entirely (as is shown in FIG. 29) in which case the non-conductive mold material 74 with the coil 654 attached to its surface can be packaged to provide the resulting sensor IC. Such an arrangement can be provided in a package of the type described in one of the above-referenced U.S. Patents.

In applications including the mold material 80, such mold material may be tapered from a first end 80a proximate to the lead frame 70 to a second end 80b distal from the lead frame (or for some portion thereof) similarly to the embodiment of FIG. 3A and the sensor 650 may, optionally, include a third mold material 90 in the form of an overmold in order to protect and electrically insulate the device.

Referring to FIG. 29, in which like elements to FIG. 3A are labeled with like reference characters, an alternative magnetic field sensor 660 of a form similar to the sensor 60 of FIG. 3A includes a semiconductor die 62 having a first active surface 62a in which a magnetic field sensing element 64 is disposed and a second, opposing surface 62b attached to a die attach area 66 on a first surface 70a of a lead frame 70 and a non-conductive mold material 74 enclosing the die and at least a portion of the lead frame.

The sensor 660 includes a coil 664 that may the same as or similar to the coil 644 of FIG. 27. The coil 644 is secured to, and more particularly, in the embodiment of FIG. 29 is enclosed by, the non-conductive mold material 74. The wire of the coil 664 may be wound around a mandrel or bobbin 656, as shown. In one illustrative embodiment, the mandrel 656 may be comprised of a soft ferromagnetic material or a plastic and remain part of the final device. In other embodiments, the mandrel 656 is used during coil winding but then not made a part of the final package, for example in the case of FIGS. 27 and 28. The mandrel 656 and coil 664 may be secured to the surface 70b of the lead frame 70 that is opposite the die 62 with an adhesive or other securing mechanism, such that the coil is secured to the lead frame when the subassembly is placed in a mold cavity in step 212 (FIG. 8) and the non-conductive mold material 74 is formed in step 216 (FIG. 8).

In operation, a bias current is applied to the coil 664 which causes a bias magnetic field to be generated and the transducer 64 is responsive to perturbations in the magnetic field caused by movement of a proximate target. While the ferromagnetic mold material (such as mold material 80 of FIG. 3A) is eliminated in the sensor 660 of FIG. 29, it will be appreciated by those of ordinary skill in the art that a ferromagnetic mold material may be provided as explained in connection with any foregoing embodiments in order to concentrate the magnetic field generated by the coil (in the case of a soft ferromagnetic mold material) or to provide a magnetic field for modulation by a coil-generated magnetic field (in the case of a hard ferromagnetic mold material).

Having described preferred embodiments of the invention it will now become apparent to those of ordinary skill in the art that other embodiments incorporating these concepts may be used.

For example, it will be appreciated by those of ordinary skill in the art that the package types, shapes, and dimensions, including but not limited to the thicknesses of the mold materials, can be readily varied to suit a particular application both in terms of the electrical and magnetic requirements as well as any packaging considerations.

It will also be appreciated that the various features shown and described herein in connection with the various embodiments can be selectively combined. As only a few of many examples, the barbs shown in FIG. 1, the channel provided in the bias magnet of FIG. 15, the passive components attached to leads of FIGS. 23-24, and the coil of FIGS. 27-29 may be implemented in other embodiments.

Accordingly, it is submitted that that the invention should not be limited to the described embodiments but rather should be limited only by the spirit and scope of the appended claims. All publications and references cited herein are expressly incorporated herein by reference in their entirety.

What is claimed is:

1. A magnetic field sensor comprising:
   a lead frame having a first surface, a second opposing surface, and a plurality of leads;
   a semiconductor die having a first surface in which a magnetic field sensing element is disposed and a second opposing surface attached to the first surface of the lead frame;
   a non-conductive mold material enclosing the die and at least a portion of the lead frame;
   a passive component coupled to the plurality of leads and spaced from the non-conductive mold material;
   an electromagnetic suppressor comprising a molded ferromagnetic material enclosing the passive component; and
   a ferromagnetic mold material secured to a portion of the non-conductive mold material, wherein the ferromagnetic mold material comprises a central aperture having a surface extending from the non-conductive mold material to an outer peripheral surface of the ferromagnetic mold material, wherein the surface of the central aperture comprises a bend at an intermediate location such that the surface of the central aperture has a first slope from the non-conductive mold material to the bend and a second slope different than the first slope from the bend to the outer peripheral surface of the central aperture.

2. The magnetic field sensor of claim 1 wherein at least one of the electromagnetic suppressor and the ferromagnetic mold material comprises a hard ferromagnetic material.

3. The magnetic field sensor of claim 2 wherein the hard ferromagnetic material is selected from the group consisting of a ferrite, a SmCo alloy, a NdFeB alloy, a thermoplastic polymer with hard magnetic particles, or a thermoset polymer with hard magnetic particles.

4. The magnetic field sensor of claim 1 wherein at least one of the electromagnetic suppressor and the ferromagnetic mold material comprises a soft ferromagnetic material.

5. The magnetic field sensor of claim 4 wherein the soft ferromagnetic material is selected from the group consisting of NiFe, Ni, a Ni alloy, steel or ferrite.

6. The magnetic field sensor of claim 1 wherein the electromagnetic suppressor comprises a first mold element enclosing the passive component and a second mold element enclosing at least a portion of the first mold element.

7. The magnetic field sensor of claim 6 wherein the non-conductive mold material enclosing the die and at least a portion of the lead frame comprises a first non-conductive mold material and wherein the first mold element comprises a second non-conductive mold material.

8. The magnetic field sensor of claim 7 wherein the second non-conductive mold material comprises a thermoset or a thermoplastic.

9. The magnetic field sensor of claim 7 wherein the first non-conductive mold material and the second non-conductive mold material comprise the same material.

10. The magnetic field sensor of claim 6 wherein the second mold element comprises a ferromagnetic material.

11. The magnetic field sensor of claim 10 wherein the second mold element comprises a hard ferromagnetic material.

12. The magnetic field sensor of claim 10 wherein the second mold element comprises a soft ferromagnetic material.

13. The magnetic field sensor of claim 1 wherein the passive component is a capacitor.

14. A magnetic field sensor, comprising:
a lead frame having a first surface, a second opposing surface, and a plurality of leads;
a semiconductor die having a first surface in which a magnetic field sensing element is disposed and a second opposing surface;
a non-conductive mold material enclosing the die and at least a portion of the lead frame;
a ferromagnetic mold material secured to a portion of the non-conductive mold material, wherein the ferromagnetic mold material comprises a central aperture having a surface extending from the non-conductive mold material to an outer peripheral surface of the ferromagnetic mold material, wherein the surface of the central aperture comprises a bend at an intermediate location such that the surface of the central aperture has a first slope from the non-conductive mold material to the bend and a second slope different than the first slope from the bend to the outer peripheral surface of the central aperture;
at least one capacitor coupled to at least two of the plurality of leads and spaced from the non-conductive mold material; and
an electromagnetic suppressor comprising a molded ferromagnetic material enclosing the at least one capacitor.

15. The magnetic field sensor of claim 14 wherein the electromagnetic suppressor comprises a hard ferromagnetic material.

16. The magnetic field sensor of claim 14 wherein the electromagnetic suppressor comprises a soft ferromagnetic material.

17. The magnetic field sensor of claim 14 wherein the electromagnetic suppressor comprises a first mold element enclosing the at least one capacitor and a second mold element enclosing at least a portion of the first mold element.

18. The magnetic field sensor of claim 17 wherein the non-conductive mold material enclosing the die and at least a portion of the lead frame comprises a first non-conductive mold material and wherein the first mold element comprises a second non-conductive mold material.

19. The magnetic field sensor of claim 17 wherein the ferromagnetic mold material secured to a portion of the non-conductive mold material comprises a first ferromagnetic mold material and wherein the second mold element comprises a second ferromagnetic mold material.

20. A magnetic field sensor, comprising:
a lead frame having a first surface, a second opposing surface, and a plurality of leads; a semiconductor die having a first surface in which a magnetic field sensing element is disposed and a second opposing surface;
a first non-conductive mold material enclosing the die and at least a portion of the lead frame;
a first ferromagnetic mold material secured to a portion of the non-conductive mold material wherein the first ferromagnetic mold material comprises a central aperture having a surface extending from the first non-conductive mold material to an outer peripheral surface of the first ferromagnetic mold material, wherein the surface of the central aperture comprises a bend at an intermediate location such that the surface of the central aperture has a first slope from the first non-conductive mold material to the bend and a second slope different than the first slope from the bend to the outer peripheral surface of the central aperture;
at least one capacitor coupled to at least two of the plurality of leads and spaced from the non-conductive mold material; and
a suppression device comprising:
a first mold element enclosing the at least one capacitor and comprising a second non-conductive mold material; and
a second mold element enclosing at least a portion of the first mold element and comprising a second ferromagnetic mold material.

21. The magnetic field sensor of claim 20 wherein the second non-conductive mold material comprises a thermoset or a thermoplastic.

22. The magnetic field sensor of claim 20 wherein the second ferromagnetic mold material comprises a hard ferromagnetic mold material.

23. The magnetic field sensor of claim 22 wherein the hard ferromagnetic mold material is selected from the group consisting of a ferrite, a SmCo alloy, a NdFeB alloy, a thermoplastic polymer with hard magnetic particles, or a thermoset polymer with hard magnetic particles.

24. The magnetic field sensor of claim 20 wherein the second ferromagnetic mold material comprises a soft ferromagnetic mold material.

25. The magnetic field sensor of claim 24 wherein the soft ferromagnetic mold material is selected from the group consisting of NiFe, Ni, a Ni alloy, steel or ferrite.

* * * * *

UNITED STATES PATENT AND TRADEMARK OFFICE
CERTIFICATE OF CORRECTION

| | | |
|---|---|---|
| PATENT NO. | : 10,230,006 B2 | Page 1 of 4 |
| APPLICATION NO. | : 15/618251 | |
| DATED | : March 12, 2019 | |
| INVENTOR(S) | : Ravi Vig et al. | |

It is certified that error appears in the above-identified patent and that said Letters Patent is hereby corrected as shown below:

In the Drawings

Please replace FIGS. 1B, 1C and 8A with FIGS. 1B, 1C and 8A as shown on the attached pages.

In the Specification

Column 4, Line 3, delete "may comprise comprises a" and replace with --may comprise--.

Column 6, Line 32, delete "21A plan view" and replace with --21A is a plan view--.

Column 6, Line 52, delete "Fig. 24 is side a" and replace with --Fig. 24 is a side--.

Column 6, Line 66, delete "is a plan view the" and replace with --is a plan view of the--.

Column 9, Line 45, delete "SUMIKON® EME" and replace with --SUMIKON®EME--.

Column 13, Line 8, delete "SUMIKON® EME" and replace with --SUMIKON®EME--.

Column 13, Line 9, delete "Hysol®"and replace with --Hysol®--.

Column 15, Line 57, delete "Kapton®" and replace with --Kapton®--.

Column 18, Line 35, delete "including is electrically" and replace with --is electrically--.

Column 19, Line 9, delete "As a result the" and replace with --As a result of the--.

Column 22, Line 2, delete "beyond 458" and replace with --beyond ferromagnetic mold material 458--.

Column 23, Line 19, delete "sensor 500" and replace with --sensor 510--.

Signed and Sealed this
Twenty-fourth Day of March, 2020

Andrei Iancu
*Director of the United States Patent and Trademark Office*

Column 24, Line 18, delete "in a less" and replace with --in less--.

Column 28, Line 14, delete "of main" and replace with --of the main--.

Column 30, Line 41, delete "lead 24" and replace with --lead 24*a*--.

Column 30, Line 52, delete "lead 24" and replace with --lead 24*a*--.

Column 34, Line 43, delete "protrusion extending" and replace with --protrusion extends--.

Column 36, Line 6, delete "that that the" and replace with --that the--.